(12) United States Patent
Fukushima

(10) Patent No.: US 11,050,348 B2
(45) Date of Patent: Jun. 29, 2021

(54) SEMICONDUCTOR DEVICE

(71) Applicant: Rohm Co., Ltd., Kyoto (JP)

(72) Inventor: Shun Fukushima, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 24 days.

(21) Appl. No.: 16/676,062

(22) Filed: Nov. 6, 2019

(65) Prior Publication Data

US 2020/0161973 A1    May 21, 2020

(30) Foreign Application Priority Data

Nov. 9, 2018  (JP) .............................. JP2018-211244
Jan. 30, 2019  (JP) .............................. JP2019-013985

(51) Int. Cl.
*H02M 3/158*    (2006.01)
*H03F 1/02*    (2006.01)

(52) U.S. Cl.
CPC .......... *H02M 3/158* (2013.01); *H03F 1/0205* (2013.01)

(58) Field of Classification Search
CPC ............ H02H 3/20; H02H 3/202; H02H 3/26; H02H 7/06; H02H 7/09; H02H 2/10; H02H 7/125; H02H 7/1252; H02H 9/04; H02H 9/041; H02H 9/042; H02P 9/00; H02P 9/006; G01R 19/165; G01R 31/343; E21B 41/0085

See application file for complete search history.

(56) References Cited

U.S. PATENT DOCUMENTS

| | | | | |
|---|---|---|---|---|
| 3,156,859 A | * | 11/1964 | Cox ........................ | H03F 3/387 363/124 |
| 3,786,338 A | * | 1/1974 | Gilbert .................... | H03M 1/42 323/359 |
| 6,194,888 B1 | * | 2/2001 | Matsumoto ........ | G01R 27/2605 323/364 |
| 7,009,373 B1 | * | 3/2006 | Garavan .................. | G05F 3/30 323/313 |
| 2012/0187934 A1 | | 7/2012 | Suzuki | |
| 2016/0248381 A1 | * | 8/2016 | Yang ...................... | H03F 3/193 |

FOREIGN PATENT DOCUMENTS

| | | |
|---|---|---|
| JP | 2012-075925 | 4/2012 |
| JP | 2012-157142 | 8/2012 |

* cited by examiner

*Primary Examiner* — Matthew V Nguyen
(74) *Attorney, Agent, or Firm* — Fish & Richardson P.C.

(57) ABSTRACT

A semiconductor device includes an amplifier that has an output terminal and that outputs via the output terminal a signal commensurate with an input signal fed to the amplifier, a signal conductor that is connected to the output terminal and that conducts a target voltage signal based on the output signal of the amplifier, a shield conductor that is laid along the signal conductor, and a shield drive circuit that controls the voltage on the shield conductor based on the target voltage signal.

15 Claims, 30 Drawing Sheets

REFERENCE CONFIGURATION

REFERENCE PRACTICAL EXAMPLE

SECTION B-B'

FIG.30
[CASE CS1]
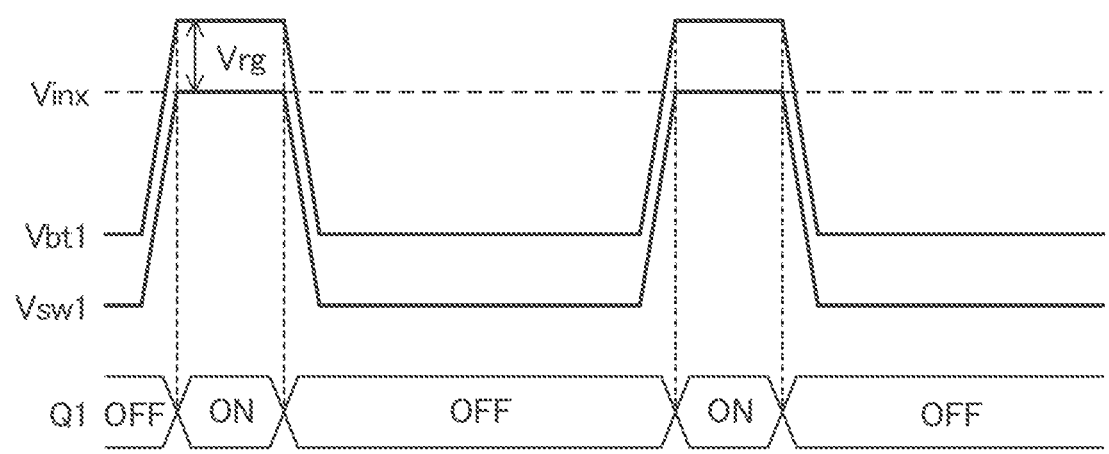
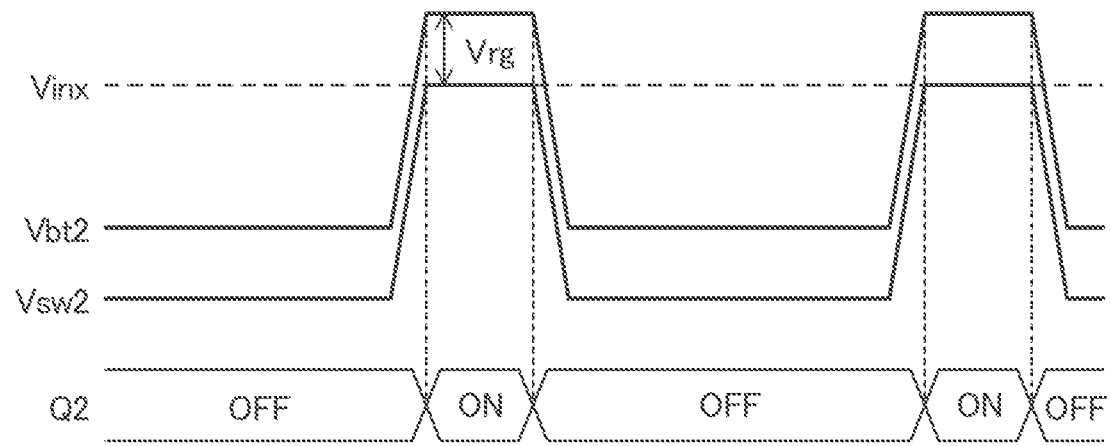

[CASE CSb]

FIG.41
| | 10TH EMBODIMENT | 8TH EMBODIMENT | 9TH EMBODIMENT |
|---|---|---|---|
| BOOT NODE | BT_X | BT1 | BTa |
| | BT_Y | BT2 | BTb |
| GATE VOLTAGE | HG_X | HG1 | HGa |
| | HG_Y | HG2 | HGb |
| 1ST HIGH-SIDE TRANSISTOR | | 5111H | 5211H |
| 2ND HIGH-SIDE TRANSISTOR | | 5121H | 5221H |
FIG.42
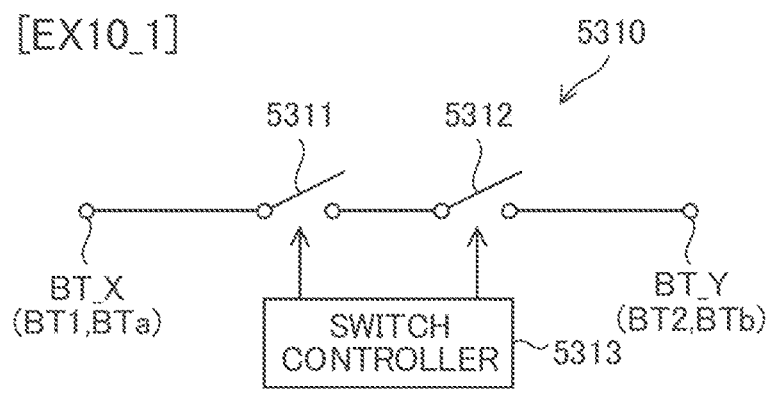
FIG.43
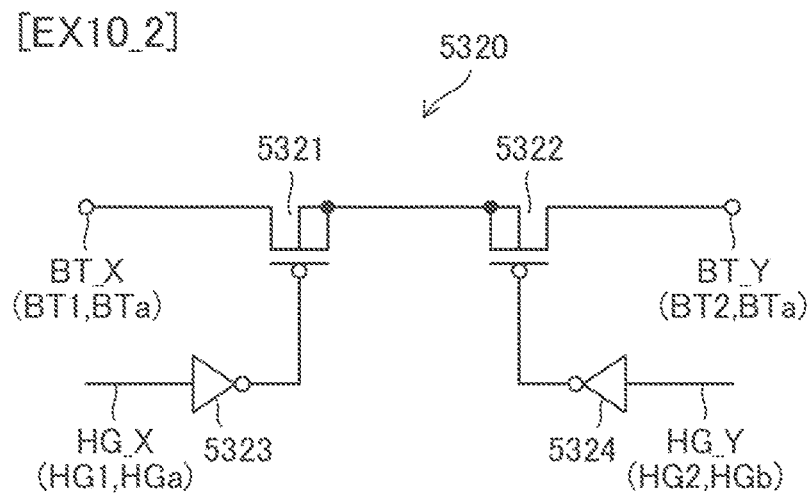

[EX10_3]

[EX10_4]

SEMICONDUCTOR DEVICE

This nonprovisional application claims priority under 35 U.S.C. § 119(a) on Patent Application No. 2019-013985 filed in Japan on Jan. 30, 2019 and on Patent Application No. 2018-211244 filed in Japan on Nov. 9, 2018, the entire contents of which are hereby incorporated by reference.

BACKGROUND OF THE INVENTION

1. Field of the Invention

The present invention relates to semiconductor devices.

2. Description of Related Art

Referring to FIG. 23, an amplifier 2020 such as a transconductance amplifier outputs a signal commensurate with an input signal via an output terminal 2021. The amplifier 2020 is inserted, for example, in an output feedback loop in a switching power supply. A signal line LL' is connected to the output terminal 2021, so that a voltage signal based on the output of the amplifier 2020 is transmitted across the signal line LL'. Here, the signal line LL' has a parasitic capacitance 2081. Due to the parasitic capacitance 2081, the voltage signal to be transmitted across the signal line LL' can become so blunt as not to be negligible.

A passive element can be connected to the signal line LL'. In the example in FIG. 24, as a passive element, a resistor 2031 is connected to the signal line LL', and in addition a capacitor 2032 is connected between the resistor 2031 and the ground. In FIG. 24, for the sake of convenience of illustration, the region where the resistor 2031 is formed is indicated as a rectangular region. Between the resistor 2031 and the ground, a parasitic capacitance is present. The parasitic capacitance between the resistor 2031 and the ground is present over the entire region where the resistor 2031 is formed. This parasitic capacitance can be considered in a form schematically separated into the parasitic capacitance 2082 appearing near the terminal at which the resistor 2031 is connected to the amplifier 2020, the parasitic capacitance 2084 appearing near the terminal at which the resistor 2031 is connected to the capacitor 2032, and the parasitic capacitance 2083 appearing around the middle of the resistor 2031. Due to these parasitic capacitances, the voltage signal to be transmitted across the signal line LL' can become so blunt as not to be negligible.

Patent Document 1: Japanese Patent Application published as No. 2012-075295

With the configuration in FIG. 23 or 24, increasing the current capacity of the amplifier 2020 may alleviate the blunting of the signal sufficiently. Inconveniently, however, increasing the current capacity of the error amplifier 2020 leads to an increased circuit current inside the error amplifier 2020 and thus to increased power consumption. It will be beneficial if it is possible to reduce power consumption while suppressing the blunting of the signal.

SUMMARY OF THE INVENTION

An object of the present invention is to provide a semiconductor device that can reduce power consumption while suppressing the blunting of a signal.

According to one aspect of the present invention, a semiconductor device, includes: an amplifier having an output terminal and configured to output from the output terminal a signal commensurate with the input signal fed to the amplifier; a signal line connected to the output terminal and configured to transmit a target voltage signal based on the output signal of the amplifier; a shield line laid beside the signal line, and a shield drive circuit configured to control the voltage on the shield line based on the target voltage signal. (A first configuration.)

Specifically, for example, in the semiconductor device according to the first configuration, the shield drive circuit can be configured to raise and drop the voltage on the shield line in response to a rise and a drop, respectively, in the voltage of the target voltage signal. (A second configuration.)

More specifically, for example, in the semiconductor device according to the second configuration, the shield drive circuit can include: a transistor having a gate that receives the target voltage signal; and a constant-current circuit connected in series with the transistor. The shield drive circuit can be configured to control the voltage on the shield line by transferring, between the connection node at which the transistor and the constant-current circuit are connected together and the shield line, electric charge commensurate with the target voltage signal. (A third configuration.)

Still more specifically, for example, in the semiconductor device according to the third configuration, there can be further provided a subsequent-stage circuit configured to operate according to the target voltage signal, and the subsequent-stage circuit can be fed with, as a signal commensurate with the target voltage signal, the signal at the connection node at which the transistor and the constant-current circuit are connected together. (A fourth configuration.)

Instead, for example, in the semiconductor device according to any of the first to third configurations, there can be further provided a subsequent-stage circuit configured to operate according to the target voltage signal, and one end of the signal line leading from the output terminal can be connected to the subsequent-stage circuit (A fifth configuration.)

For another example, in the semiconductor device according to any of the first to fifth configurations, the target voltage signal can be produced as a signal having a voltage relative to a predetermined reference potential, and the shield line can be arranged between a reference potential part having the reference potential and the signal line (A sixth configuration.)

Here, for example, in the semiconductor device according to the sixth configuration, there can be further provided a passive element connected to the signal line and configured to receive the target voltage signal. A shield region can be formed between the reference potential part and the passive element, and the shield region can be fed with a same voltage as the voltage on the shield line. (A seventh configuration.)

According to another aspect of the present invention, a semiconductor device includes: an amplifier having an output terminal and configured to output from the output terminal a signal commensurate with the input signal fed to the amplifier; a signal line connected to the output terminal and configured to transmit a target voltage signal based on the output signal of the amplifier; a passive element connected to the signal line and configured to receive the target voltage signal, and a shield drive circuit. The target voltage signal can be produced as a signal having a voltage relative to a predetermined reference potential. A shield region can be formed between a reference potential part having the reference potential and the passive element, and the shield drive circuit can be configured to control the voltage on the shield region based on the target voltage signal. (An eighth configuration.)

Specifically, for example, in the semiconductor device according to the eighth configuration, the shield drive circuit can be configured to raise and drop the voltage on the shield region in response to a rise and a drop, respectively, in the voltage of the target voltage signal. (A ninth configuration.)

More specifically, for example, in the semiconductor device according to the ninth configuration, the shield drive circuit can include: a transistor having a gate that receives the target voltage signal, and a constant-current circuit connected in series with the transistor. The shield drive circuit can be configured to control the voltage on the shield region by transferring, between the connection node at which the transistor and the constant-current circuit are connected together and the shield region, electric charge commensurate with the target voltage signal. (A tenth configuration.)

Still more specifically, for example, in the semiconductor device according to the tenth configuration, there can be further provided a subsequent-stage circuit configured to operate according to the target voltage signal, and the subsequent-stage circuit can be fed with, as a signal commensurate with the target voltage signal the signal at the connection node at which the transistor and the constant-current circuit are connected together. (An eleventh configuration.)

Instead, for example, in the semiconductor device according to any of the eighth to tenth configurations, there can be further provided a subsequent-stage circuit configured to operate according to the target voltage signal, and one end of the signal line leading from the output terminal can be connected to the subsequent-stage circuit. (A twelfth configuration.)

For another example, in the semiconductor device according to any of the eighth to twelfth configurations, the semiconductor device can include a semiconductor integrated circuit using a semiconductor substrate. The reference potential part can include the semiconductor substrate, with the shield region and the passive element formed on the semiconductor substrate, and the shield region can be provided between the semiconductor substrate and the passive element. (A thirteenth configuration.)

For another example, in the semiconductor device according to any of the first to thirteenth configurations, the amplifier can be a transconductance amplifier configured to convert a voltage signal as the input signal into a current signal, and the target voltage signal can be produced on the signal line as a result of a current attributable to the current signal either being supplied from the amplifier to the signal line via the output terminal or being retrieved from the signal line to the amplifier via the output terminal. (A fourteenth configuration.)

Instead, for example, in the semiconductor device according to any of the first to thirteenth configurations the semiconductor device can include: an output-stage circuit configured to perform switching on the input voltage; and a control circuit configured to control the output-stage circuit based on a feedback voltage commensurate with the output voltage produced by the switching. The semiconductor device can form a semiconductor integrated circuit for a switching power supply. The amplifier can be included in the control circuit and is a transconductance amplifier configured to receive the feedback voltage as the input signal to convert a voltage signal indicating the feedback voltage into a current signal. The target voltage signal can be produced on the signal line as a result of a current attributable to the current signal either being supplied from the amplifier via the output terminal to the signal line or being retrieved from the signal line via the output terminal to the amplifier. (A fifteenth configuration.)

According to the present invention, it is possible to provide a semiconductor device that can reduce power consumption while suppressing the blunting of a signal.

BRIEF DESCRIPTION OF THE DRAWINGS

FIG. 30 is a diagram showing a relationship among a plurality of voltages and the states of switches in a switch circuit with respect to two step-down converters in the eighth embodiment of the present invention (case CS1);

FIG. 41 is a diagram illustrating symbols and terms used in a tenth embodiment of the present invention;

FIG. 42 is a diagram showing a first configuration example of a switch circuit in the tenth embodiment of the present invention;

FIG. 43 is a diagram showing a second configuration example of a switch circuit in the tenth embodiment of the present invention;

DETAILED DESCRIPTION OF PREFERRED EMBODIMENTS

Hereinafter, examples embodying the present invention will be described with reference to the accompanying drawings. Among the diagrams referred to in the course, the same parts are identified by the same reference signs, and in principle no overlapping description of the same parts will be repeated. In the present description, for the sake of simple description, symbols and other designations referring to information, signals, physical quantities, elements, components, and the like are occasionally used with the names of the corresponding information, signals, physical quantities, elements, components, and the like omitted or abbreviated. For example, a switching power IC described later and identified by "1" (see FIG. 1) is sometimes mentioned as "switching power IC 1" and is other times abbreviated to "power IC1" or "IC 1", all these designations referring to the same entity.

First, some terms used to describe embodiments of the present invention will be defined. In embodiments of the present invention. "IC" is short for "integrated circuit". "Ground" denotes a conducting part having a reference potential of 0 V (zero volts), or denotes such a reference potential itself. In embodiments of the present invention, any voltage mentioned with no particular reference given represents a potential relative to a ground. "Level" denotes the level of a potential, and for a given signal or voltage, "high level" refers to a potential higher than "low level". With respect to any transistor configured as a FET (field-effect transistor). "on state" denotes a state where the drain-source channel of the FET is in a conducting state, and "off state"

denotes a state where the drain-source channel of the FET is in a non-conducting (cut-off) state. Any switch can be composed of one or more FETs (field-effect transistors), a given switch being in on state means that it conducts between its terminals, and a given switch being in off state means that it does not conduct between its terminals. Throughout the description, with respect to any transistor or switch, being in on or off state is often mentioned simply as being on or off.

First Embodiment

Figure 1:
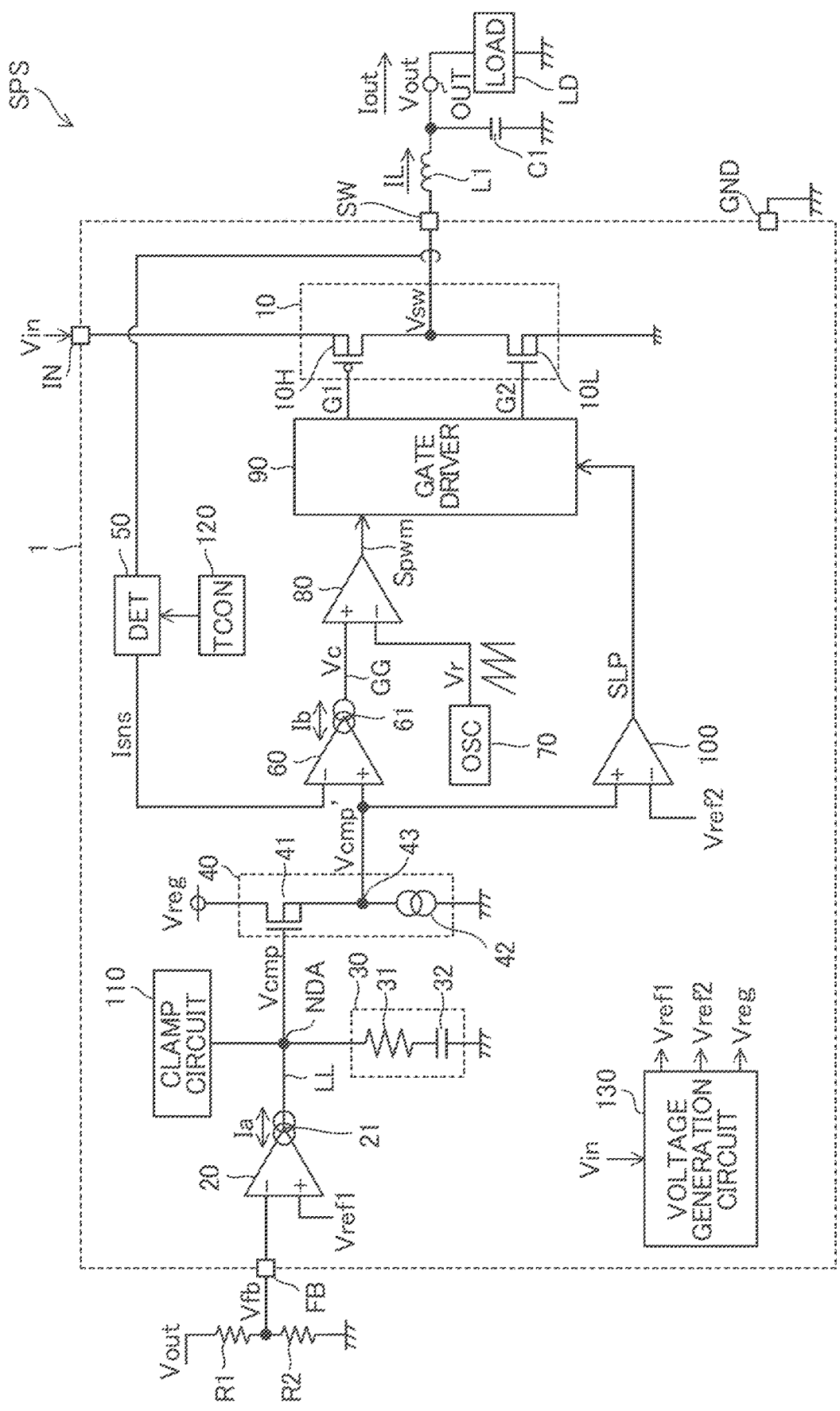
FIG. 1 is an overall configuration diagram of a switching power supply according to a first embodiment of the present invention.

A first embodiment of the present invention will be described FIG. 1 is an overall configuration diagram of a switching power supply SPS according to the first embodiment of the present invention. The switching power supply SPS in FIG. 1 includes a switching power IC 1, which is a semiconductor device including a semiconductor integrated circuit for a switching power supply, and a plurality of discrete components that are externally connected to the switching power IC 1. The discrete components include a capacitor C1, a coil L1, and voltage division resistors R1 and R2. The switching power supply SPS is configured as a step-down switching power supply that produces from a predetermined input voltage Vin a predetermined output voltage Vout. At the output terminal OUT of the switching power supply SPS, the output voltage Vout appears. The output voltage Vout is supplied to a load LD that is connected to the output terminal OUT. The input voltage Vin and the output voltage Vout are each a positive direct-current voltage, the output voltage Vout being lower than the input voltage Vin. The input voltage Vin is, for example, 12 V. Adjusting the resistance values of the voltage division resistors R1 and R2 permits the output voltage Vout to be stabilized at a desired positive voltage value (e.g., 3.3 V or 5 V) lower than 12 V. The current that passes through the load LD via the output terminal OUT is referred to as the output current Iout.

Figure 2:
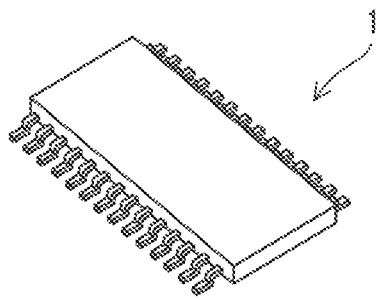
FIG. 2 is an exterior view of a switching power IC according to the first embodiment of the present invention.

The switching power IC 1 is an electronic component as shown in FIG. 2 fabricated by sealing a semiconductor integrated circuit inside a casing (package) formed of resin. The casing of the power IC 1 is provided with a plurality of external terminals that are exposed outside. The external terminals include the following which are shown in FIG. 1: an input terminal IN, a switching terminal SW, a feedback terminal FB, and a ground terminal GND. The external terminals can include any other terminals. The number of external terminals of the power IC 1 and the appearance of the power IC 1 shown in FIG. 2 are merely illustrative. While FIG. 2 shows an example where the power IC 1 has a casing (package) called TSSOP (thin shrink small outline package), the power IC 1 can have any type of casing. The power IC 1 can be provided with a heat sink pad on its bottom face.

First, the external configuration of the switching power IC 1 will be described. From outside the power IC 1, the input voltage Vin is fed to the input terminal IN. Between the switching terminal SW and the output terminal OUT, the coil L1 is connected in series. Specifically, one end of the coil L1 is connected to the switching terminal SW, and the other end of the coil L1 is connected to the output terminal OUT. The output terminal OUT is connected via the capacitor C1 to a ground. The output terminal OUT is connected also to one end of the voltage division resistor R1, and the other terminal of the voltage division resistor R1 is connected via the voltage division resistor R2 to the ground. The connection node between the voltage division resistors R1 and R2 is connected to the feedback terminal FB.

Next, the internal configuration of the switching power IC 1 will be described. The switching power IC 1 includes an output stage circuit 10, an error amplifier 20, a phase compensator 30, a shield drive circuit 40, a current detector 50, a differential amplifier 60, an oscillator 70, a PWM comparator 80, a gate driver 90, a light-load detection comparator 100, a clamp circuit 110, a timing controller 120, and a voltage generation circuit 130. Based on the input voltage Vin, the voltage generation circuit 130 generates a reference voltage Vref1, a reference voltage Vref2, and an internal supply voltage Vreg. The reference voltage Vref1, the reference voltage Vref2, and the internal supply voltage Vreg are direct-current voltages with mutually different positive voltage values. The various circuits within the power IC 1 (except the voltage generation circuit 130) can operate on the internal supply voltage Vreg.

The output stage circuit 10 includes a transistor 10H as a high-side transistor and a transistor 10L as a low-side transistor. The transistor 10H is configured as a P-channel MOSFET (metal-oxide-semiconductor field-effect transistor), and the transistor 10L is configured as an N-channel MOSFET. The transistors 10H and 10L are a pair of transistors connected in series between the input terminal IN and the ground terminal GND (in other words, the ground), and their being driven to perform switching causes the input voltage Vin to be subjected to switching, resulting in a switching voltage Vsw with a rectangular waveform appearing at the switching terminal SW. The transistor 10H is provided on the high side, and the transistor 10L is provided on the low side. Specifically, the source of the transistor 10H is connected to the input terminal IN, the drains of the transistors 10H and 10L are both connected to the switching terminal SW, and the source of the transistor 10L is connected to the ground. A modification is possible where the transistor 10H is configured as an N-channel MOSFET. In that case, the relationship between the source and the drain of the transistor 10H is reversed as compared with what is described above.

The transistor 10H functions an output transistor, and the transistor 10L functions as a synchronous rectification transistor. The inductor L1 and the capacitor C1 constitute a rectifying-smoothing circuit that rectifies and smooths the switching voltage Vsw with a rectangular waveform appearing at the switching terminal SW to produce the output voltage Vout. The voltage division resistors R1 and R2 constitute a voltage division circuit that divides the output voltage Vout. The connection node between the voltage division resistors R1 and R2 is connected to the feedback terminal FB, so that a divided voltage appearing at the connection node is fed, as a feedback voltage Vfb, to the feedback terminal FB.

The gates of the transistors 10H and 10L are fed with, as drive signals, gate signals G1 and G2 respectively so that, according to the gate signals G1 and G2, the transistors 10H and 10L are turned on and off. When the transistor 10H is fed with a low-level or high-level gate signal G1, it is in on or off state respectively. When the transistor 10L is fed with a high-level or low-level gate signal G2, it is in on or off state respectively. Basically, the transistors 10H and 10L are turned on and off alternately, though there are periods in which the transistors 10H and 10L are both off.

The error amplifier 20 is a current-output transconductance amplifier. The inverting terminal of the error amplifier 20 is fed with the voltage applied to the feedback terminal FB (i.e., the feedback voltage Vfb). The non-inverting terminal of the error amplifier 20 is fed with the predetermined reference voltage Vref1. The error amplifier 20 has an output terminal 21, and outputs via the output terminal 21 a current signal Ia, which is an error current signal commensurate with the difference between the feedback voltage Vfb and the reference voltage Vref1. The output terminal 21 is connected to a signal line LL, so that electric charge attributable to the current signal Ia is supplied to and retrieved from the signal line LL. Specifically, when the feedback voltage Vfb is lower than the reference voltage Vref1, the error amplifier 20 outputs a current attributable to the current signal Ia toward the signal line LL via the output terminal 21 so that the potential on the signal line LL rises; when the feedback voltage Vfb is higher than the reference voltage Vref1 the error amplifier 20 draws in a current attributable to the current signal Ia toward itself from the signal line LL via the output terminal 21 so that the potential on the signal line LL falls. As the absolute value of the difference between the feedback voltage Vb and the reference voltage Vref1 increases, the magnitude of the current attributable to the current signal Ia increases. In this way, the error amplifier 20 converts a voltage signal indicating the voltage between its non-inverting and inverting terminals (here, the voltage difference between the feedback voltage Vfb and the reference voltage Vref1) into the current signal Ia.

The phase compensator 30 is provided between the signal line LL and the ground. The phase compensator 30 receives the current signal Ia to produce a voltage signal Vcmp, which is an error voltage signal. The voltage signal Vcmp indicates the voltage (potential) on the signal line LL. The phase compensator 30 includes a series circuit composed of a resistor 31 and a capacitor 32. Specifically, one end of the resistor 31 is connected to the signal line LL to receive the voltage signal Vcmp, and the other end of the resistor 31 is connected via the capacitor 32 to the ground. Adequately setting the resistance value of the resistor 31 and the capacitance value of the capacitor 32 helps compensate the phase of the voltage signal Vcmp and thereby prevent oscillation of the output feedback loop. The error amplifier 20 operates on, as a positive-side supply voltage, the internal supply voltage Vreg and, as a negative-side supply voltage, the ground; thus, never does the voltage of the voltage signal Vcmp become negative, nor does it exceed the internal supply voltage Vreg.

The shield drive circuit 40 includes a transistor 41 configured as an N-channel MOSFET and a constant-current circuit 42 connected in series with the transistor 41. The gate of the transistor 41 is connected to the signal line LL. The node at which the gate of the transistor 41, one end of the resistor 31, and the output terminal 21 of the error amplifier 20 are connected together is referred to, in particular, as the node NDA. The drain of the transistor 41 is fed with the internal supply voltage Vreg, and between the source of the transistor 41 and the ground, the constant-current circuit 42 is provided. The node at which the source of the transistor 41 and the constant-current circuit 42 are connected together is referred to as the shield node 43. The constant-current circuit 42 so operates that a constant current (a current with a constant current value) passes from the shield node 43 toward the ground. At the shield node 43 appears a voltage signal Vcmp' commensurate with the voltage signal Vcmp. The voltage of the voltage signal Vcmp' is lower than the voltage of the voltage signal Vcmp by the gate-source voltage of the transistor 41. Accordingly, as the voltage of the signal Vcmp rises, the voltage of the signal Vcmp' rises, and as the voltage of the signal Vcmp falls, the voltage of the signal Vcmp' falls. The gate-source voltage of the transistor 41 can practically be regarded as constant. The significance of the shield drive circuit 40 will be described in detail later.

The current detector 50 samples, at a time point specified by the timing controller 120, the value of the coil current IL that passes through the coil L1 to output a current detection signal Isns commensurate with the sampled value. The timing controller 120 can specify, as the sampling time point, either a time point during the period in which the transistor 10H is on or a time point during the period in which the transistor 10L is on. The voltage value of the current detection signal Isns is the higher the greater the absolute value of the coil current IL sampled. In the circuit in FIG. 1, the current passing at the switching terminal SW is sensed and thereby the coil current IL is sensed. Instead, the current detector 50 can sense the current passing through the transistor 10H or 10L and thereby sense the coil current IL.

The non-inverting terminal of the differential amplifier 60 is connected to the shield node 43 to receive the voltage signal Vcmp'. The inverting terminal of the differential amplifier 60 is fed with the current detection signal Isns. The differential amplifier 60 has an output terminal 61, and outputs via the output terminal 61 a current signal Ib commensurate with the difference between the voltage signal Vcmp' and the current detection signal Isns. The differential amplifier 60, too, is configured as a current-output transconductance amplifier. The output terminal 61 is connected to a signal line GG, so that electric charge attributable to the current signal Ib is supplied to and retrieved from the signal line GG. Specifically, when the voltage of the voltage signal Vcmp' is higher than the voltage of the current detection signal Isns, the differential amplifier 60 outputs a current attributable to the current signal Ib toward the signal line GG via the output terminal 61 so that the potential on the signal line GG rises; when the voltage of the voltage signal Vcmp' is lower than the voltage of the current detection signal Isns, the differential amplifier 60 draws in a current attributable to the current signal Ib toward itself from the signal line GG via the output terminal 61 so that the potential on the signal line GG falls. As the absolute value of the difference between the voltage signal Vcmp' and the current detection signal Isns increases, the magnitude of the current attributable to the current signal Ib increases.

As the phase compensator 30 is connected to the signal line LL, so a phase compensator similar to the phase compensator 30 can be connected to the signal line GG.

The oscillator 70 generates a ramp signal Vr of which the signal value (voltage value) varies periodically at a predetermined switching cycle. The ramp signal Vr is a voltage signal with a triangular or sawtooth waveform.

The non-inverting terminal of the PWM comparator 80 is connected to the signal line GG to receive a voltage signal Vc applied to the signal line GG, and the inverting terminal of the PWM comparator 80 is fed with the ramp signal Vr. The PWM comparator 80 compares the voltage signal Vc with the ramp signal Vr to output a pulse-width modulation signal Spwm, which indicates the result of the comparison. The pulse-width modulation signal Spwm is at high level during the period in which the voltage signal Vc is higher than the ramp signal Vr. and is at low level during the period in which the voltage signal Vc is lower than the ramp signal Vr. The on-duty of the output stage circuit 10 (i.e., the proportion of the period in which the transistor 10H is in on state to one entire switching period) is the higher the higher the voltage signal Vc.

The gate driver 90 turns on and off the transistors 10H and 10L alternately according to the pulse-width modulation signal Spwm and thereby controls their switching. The error amplifier 20 produces the current signal Ia such that the feedback voltage Vfb remains equal to the reference voltage Vref1. Thus, through the switching control just mentioned, the output voltage Vout is stabilized at a desired target voltage Vtg that depends on the reference voltage Vref1 and the ratio of voltage division by the voltage division resistors R1 and R2. The input voltage Vin can have any value, and so can the target voltage Vtg for the output voltage Vout (where Vin>Vtg). For example, the input voltage Vin is 12 V or 24 V, and the target voltage Vtg is 3.3 V or 5 V.

More specifically, in the switching control mentioned above, during the period in which the pulse-width modulation signal Spwmn is at high level, a low-level gate signal G1 and a low-level gate signal G2 are fed to the gates of the transistors 10H and 10L respectively, and this keeps the transistor 10H on and the transistor 10L off; during the period in which the pulse-width modulation signal Spwm is at low level, a high-level gate signal G1 and a high-level gate signal G2 are fed to the gates of the transistors 10H and 10L respectively, and this keeps the transistor 10H off and the transistor 10L on. For reliable prevention of a through current, there may be inserted, between the period in which the transistor 10H is in on state and the period in which the transistor 10L is in on state, a dead time during which the transistors 10H and 10L are both off.

The switching control described above is performed only when the level of a sleep control signal SLP output from the light-load detection comparator 100 is at high level; when the sleep control signal SLP is at low level, the transistors 10H and 10L are both kept in off state.

Figure 3:
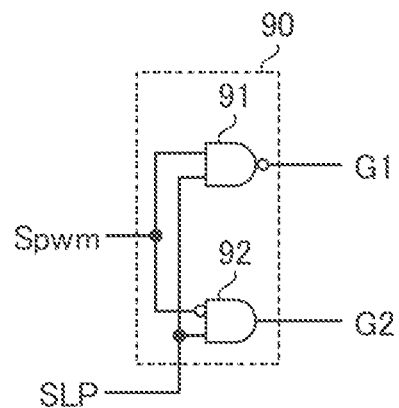
FIG. 3 is a diagram showing an example of the internal configuration of the gate driver in FIG. 1.

FIG. 3 shows an example of the internal configuration of the gate driver 90. The gate driver 90 in FIG. 3 includes a NAND circuit 91 as a high-side driver and an AND circuit 92 as a low-side driver. Based on the pulse-width modulation signal Spwm and the sleep control signal SLP, the gate driver 90 produces the gate signals G1 and G2. Specifically, the NAND circuit 91 outputs as the gate signal G1 a signal that indicates the negated logical product (NAND) of the pulse-width modulation signal Spwm with the sleep control signal SLP. The AND circuit 92 outputs as the gate signal G2 a signal that indicates the logical product of the inverted signal of the pulse-width modulation signal Spwm and the sleep control signal SLP. Thus, when the sleep control signal SLP is at high level, then according to the pulse-width modulation signal Spwm, the transistors 10H and 10L are turned on and off alternately; when the sleep control signal SLP is at low level, then regardless of the pulse-width modulation signal Spwm, the gate signal G1 remains at high level and the gate signal G2 remains at low, with the result that the transistors 10H and 10L both remain in off state.

Referring back to FIG. 1, the light-load detection comparator 100 compares the voltage of the voltage signal Vcmp' with the reference voltage Vref2 to output, when the voltage of the voltage signal Vcmp' is equal to or higher than the reference voltage Vref2, a high-level sleep control signal SLP and, when the voltage of the voltage signal Vcmp' is lower than the reference voltage Vref2, a low-level sleep control signal SLP. The voltage levels of the voltage signals Vcmp and Vcmp' depend on the magnitude of the output current Iout (i.e. the magnitude of the coil current IL), and when the coil current IL becomes so low that their voltage levels fall below the level of the reference voltage Vref2, the sleep control signal SLP turns to low level. This helps improve efficiency in a light-load condition. The non-inverting terminal of the comparator 100 can be fed with, instead of the voltage signal Vcmp', the voltage signal Vcmp, in which case the sleep control signal SLP is produced based on the result of the comparison of the voltage of the voltage signal Vcmp with the reference voltage Vref2.

The clamp circuit 110 is connected to the signal line LL. The clamp circuit 110 sets an upper and a lower limit on the voltage signal Vcmp, and thereby sets an upper and a lower limit on the coil current IL. Specifically, the clamp circuit 110 limits the voltage value of the voltage signal Vcmp to a value equal to or lower than a predetermined upper-limit value but equal to or higher than a predetermined lower-limit value and thereby sets an upper and a lower limit on the coil current IL. The clamp circuit 110 can be connected to, instead of the signal line LL, the shield node 43. In that case, an upper and a lower limit are set on the voltage signal Vcmp' and thereby an upper and a lower limit are set on the coil current IL.

As described above, in the switching power supply SPS, current-mode control is adopted, whereby output feedback control is performed based on both the output voltage Vout and the coil current IL. The current detection signal Isns, which is commensurate with the coil current IL, is fed back to the differential amplifier 60. Thus, by the action of the differential amplifier 60, as the voltage signal Vcmp rises and hence the voltage signal Vcmp' rises, the coil current IL increases; as the voltage signal Vcmp falls and hence the voltage signal Vcmp' falls, the coil current IL decreases. In this way, the magnitude of the coil current IL can be controlled according to the voltage signal Vcmp.

An additional description will now be given of the signal line LL and the signal transmitted across the signal line LL. As will be understood from the description thus far, the error amplifier 20 receives, as the input signal to it, a voltage signal that indicates the voltage between its non-inverting and inverting terminals (here, the voltage difference between the voltages Vfb and Vref1 and outputs via the output terminal 21 a current signal Ia commensurate with the input signal. The signal line LL is a conductor that is connected to the output terminal 21 of the error amplifier 210 and across which the voltage signal Vcmp (target voltage signal) based on the current signal Ia is transmitted. The signal line LL is provided outside the error amplifier 20. The voltage signal Vcmp is a signal that has a voltage relative to the ground (reference potential).

Figure 4:
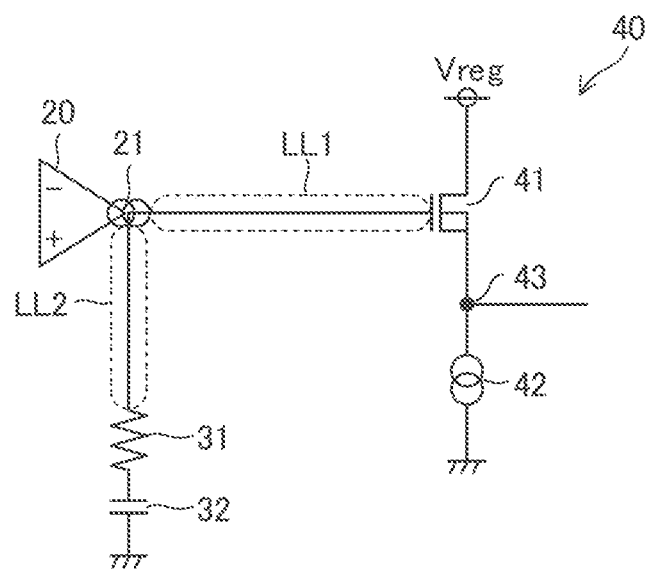
FIG. 4 is a diagram illustrating a signal line on the output side of an error amplifier in the first embodiment of the present invention

As shown in FIG. 4, the signal line LL can be understood to be composed of signal lines LL1 and LL2. The signal line LL1 is a conductor that connects together the output terminal 21 and the gate of the transistor 41, and the signal line LL2 is a conductor that connects together the output terminal 21 and the resistor 31. Although, in FIG. 4, the signal lines LL1 and LL2 are shown as if they are, starting at the output terminal 21, completely separate from each other (the same applies to FIG. 6, which will be referred to later), the signal lines LL1 and LL2 can partly overlap with each other near the output terminal 21. In reality, the clamp circuit 110 is also connected to the signal line LL; here, however, the signal line LL1 is to be understood as including the conductor between the output terminal 21 and the clamp circuit 110.

Figure 5:
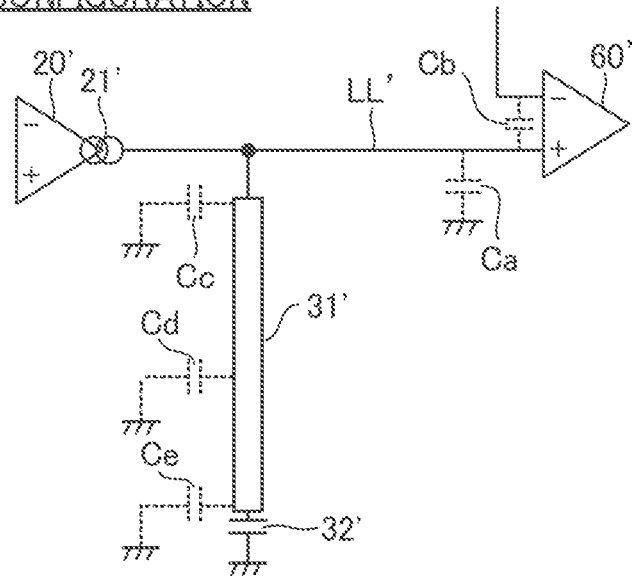
FIG. 5 is a diagram illustrating parasitic capacitances appearing in a reference configuration.

A reference configuration as shown in FIG. 5 will now be studied. The reference configuration in FIG. 5 includes an amplifier 20', a resistor 31', a capacitor 32', and an amplifier 60', and these circuit elements correspond to the amplifier 20, the resistor 31 the capacitor 32 and the amplifier 60, respectively, in the configuration in FIG. 1. On the other hand, the reference configuration in FIG. 5 does not include a shield drive circuit, and accordingly the output terminal 21' of the amplifier 20' is connected via a signal line LL' to the non-inverting terminal of the amplifier 60' in FIG. 5, for the sake of convenience of description, the region where the resistor 31' is formed is indicated as a rectangular region.

The parasitic capacitances Ca to Ce that appear in the reference configuration are shown in FIG. 5. The parasitic capacitance Ca appears between the conductor constituting the part of the signal line LL' connecting the output terminal 21' to the amplifier 60' and the ground. The parasitic capacitance Cb appears between the non-inverting terminal and the inverting terminal of the amplifier 60'. The parasitic capacitance between the resistor 31' and the ground is present over the entire region where the resistor 31' is formed, and this parasitic capacitance can be considered in a form schematically separated into the parasitic capacitance Cc appearing near the terminal at which the resistor 31' is connected to the amplifier 20', the parasitic capacitance Ce appearing near the terminal at which the resistor 31' is connected to the capacitor 32', and the parasitic capacitance Cd appearing around the middle of the resistor 31'.

In the reference configuration in FIG. 5, the voltage signal on the signal line LL' based on the output of the amplifier 20' becomes blunt by being affected by the parasitic capacitances Ca to Ce. Increasing the current capacity of the amplifier 20' may alleviate such blunting of the signal. Inconveniently, however, increasing the current capacity of the amplifier 20' leads to an increased circuit current inside the amplifier 20' and thus to increased power consumption. In contrast, a configuration according to this embodiment permits signal transmission with little blunting combined with low power consumption. To achieve that, a signal line shielding technology and a passive element shielding technology are applied to the power IC 1 in FIG. 1.

Figure 6:
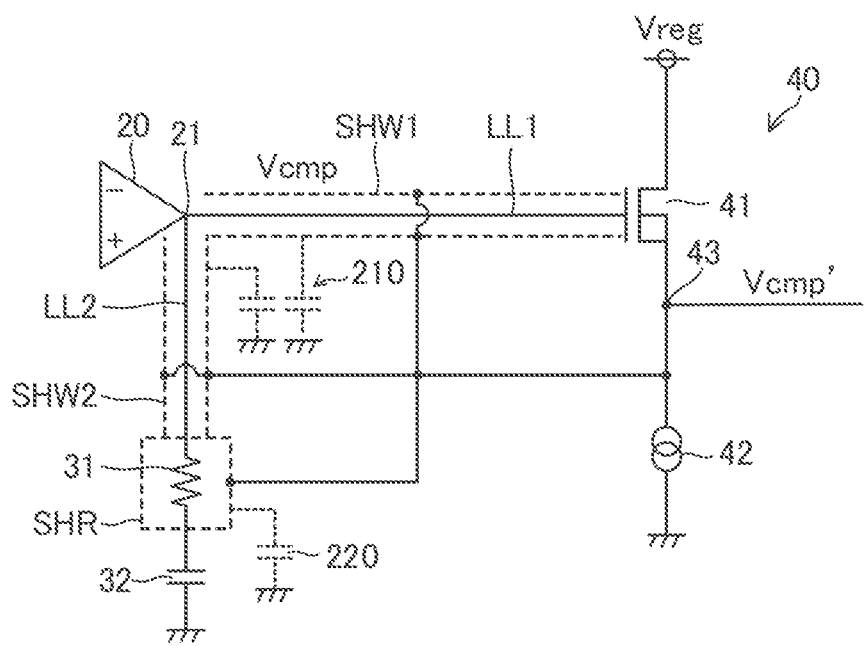
FIG. 6 is a conceptual diagram of a signal line shielding technology and a passive element shielding technology in the first embodiment of the present invention.

FIG. 6 is a conceptual diagram of the signal line shielding technology and the passive element shielding technology.

Signal Line Shielding Technology:

First, the signal line shielding technology will be described. With the signal line shielding technology, a shield line is laid beside the signal line LL, and the shield node 43 is connected to the shield line so that the voltage on the shield line equals the voltage at the shield node 43. With the signal line LL understood as being divided into the signal lines LL1 and LL2, the shield line roughly divides into a shield line SHW1, which is laid beside the signal line LL1, and a shield line SHW2, which is laid beside the signal line LL2. The shield lines SHW1 and SHW2 are both connected to the shield node 43 so that the voltage at the shield node 43 is applied to the shield lines SHW1 and SHW2. In the following description of this embodiment, whenever simply "the shield line" is mentioned, it is to be understood to refer to each of the shield lines SHW1 and SHW2.

The shield line is a conductive member arranged between a reference potential part having the ground potential within the power IC 1 and the signal line LL. The conductive member as the shield line can basically be a metal conductor, but this is not meant to exclude the shield line being formed of an electrically conductive material that is not classified into metals. Laying the shield line permits a shield to be formed between the signal line LL and the ground (reference potential part), and this helps suppress formation of a parasitic capacitance between the signal line LL and the ground (reference potential part). That is, providing the shield line prevents a direct parasitic capacitance from appearing between the signal line LL and the ground (reference potential part), or reduces the parasitic capacitance between the signal line LL and the ground as compared with a configuration with no shield line.

With the shield node 43 connected to the shield line, the voltage of the voltage signal Vcmp', which varies with the voltage signal Vcmp, is applied to the shield line. Thus, the shield drive circuit 40 operates such that, as the voltage of the voltage signal Vcmp, which is transmitted across the signal line LL, rises, the shield drive circuit 40 raises the voltage on the shield line and that, as the voltage of the voltage signal Vcmp, which is transmitted across the signal line LL, falls, the shield drive circuit 40 drops the voltage on the shield line.

More specifically, with reference to the state where the voltage signal Vcmp has a given voltage value, when the current signal Ia is output in such a direction that the voltage signal Vcmp rises, the voltage signal Vcmp' rises together, and the rise in the voltage signal Vcmp' is accompanied by supply of electric charge (positive electric charge) from the shield node 43 toward the shield line. Here, the electric charge is fed from the source of the transistor 41 via the shield node 43 to the shield line, and is used to charge the parasitic capacitance (parasitic capacitance 210 in FIG. 6) between the shield line and the ground.

In contrast, with reference to the state where the voltage signal Vcmp has a given voltage value, when the current signal Ia is output in such a direction that the voltage signal Vcmp falls, the voltage signal Vcmp' falls together, and the fall in the voltage signal Vcmp' is accompanied by retrieval of electric charge (positive electric charge) from the shield line toward the shield node 43. Here, the electric charge passes from the shield line via the shield node 43 to the constant-current circuit 42, and is used to discharge the parasitic capacitance (parasitic capacitance 210 in FIG. 6) between the shield line and the ground.

Thus, the shield drive circuit 40 transfers electric charge commensurate with the voltage signal Vcmp between the shield node 43 and the shield line and thereby controls the voltage on the shield line.

The signal line shielding technology eliminates the parasitic capacitance corresponding to the parasitic capacitance Ca in FIG. 5. Instead, the signal line shielding technology produces a parasitic capacitance between the shield line and the ground, but the charging and discharging of this parasitic capacitance is performed by the shield drive circuit 40. It produces another parasitic capacitance between the shield line and the signal line LL; however, as the voltage signal Vcmp varies, the shield drive circuit 40 makes the voltage signal Vcmp' vary, and thus the charging and discharging of the parasitic capacitance between the shield line and the signal line LL causes no or a sufficiently low burden on the error amplifier 20. Thus, even with an error amplifier 20 with low current capacity, it is possible to produce a less blunt voltage signal Vcmp. That is, it is possible to transmit a less blunt signal while achieving reduced power consumption. Moreover, the shield drive circuit 40 performs the charging and discharging of a parasitic capacitance corresponding to the parasitic capacitance Cb in FIG. 5, and this helps accordingly further lower the current capacity of the error amplifier 20 (achieving accordingly further reduced power consumption).

In a situation where the voltage signal Vcmp has fallen to around 0 V, the transistor 41 is off and no current passes through the transistor 41. It is here assumed, however, that no such situation occurs during normal operation of the power IC 1, and thus a situation like that is ignored.

Passive Element Shielding Technology:

Next, the passive element shielding technology will be described. With the passive element shielding technology, a shield region is provided between a passive element that is connected to the signal line LL to receive the voltage signal Vcmp and a reference potential part that has the ground potential within the power IC 1, and the voltage on the shield region is controlled according to the voltage signal Vcmp by the shield drive circuit 40. In FIG. 6, a broken line SHR conceptually indicates the shield region. In this embodiment, the passive element that is connected to the signal line LL to receive the voltage signal Vcmp is the resistor 31.

The shield region is a region formed on the semiconductor substrate that constitutes the power IC 1, and an example of its structure will be described later. Providing the shield region permits a shield to be formed between the passive element and the ground (reference potential part), and helps suppress formation of a parasitic capacitance between the passive element and the ground (reference potential part). That is, providing the shield region prevents a direct parasitic capacitance from appearing between the passive element and the ground (reference potential part), or reduces the parasitic capacitance between the passive element and the ground as compared with a configuration with no shield region.

With the shield node 43 connected to the shield region, the voltage of the voltage signal Vcmp', which varies with the voltage signal Vcmp, is applied to the shield region. Thus, the shield drive circuit 40 operates such that, as the voltage of the voltage signal Vcmp, which is transmitted across the signal line LL, rises, it raises the voltage on the shield region and that, as the voltage of the voltage signal Vcmp, which is transmitted across the signal line LL, falls, it drops the voltage on the shield region.

More specifically, with reference to the state where the voltage signal Vcmp has a given voltage value, when the current signal Ia is output in such a direction that the voltage signal Vcmp rises, the voltage signal Vcmp' rises together, and the rise in the voltage signal Vcmp' is accompanied by supply of electric charge (positive electric charge) from the shield node 43 toward the shield region. Here, the electric charge is fed from the source of the transistor 41 via the shield node 43 to the shield region, and is used to charge the parasitic capacitance (parasitic capacitance 220 in FIG. 6) between the shield region and the ground.

In contrast, with reference to the state where the voltage signal Vcmp has a given voltage value, when the current signal Ia is output in such a direction that the voltage signal Vcmp falls, the voltage signal Vcmp' falls together, and the fall in the voltage signal Vcmp' is accompanied by retrieval of electric charge (positive electric charge) from the shield region toward the shield node 43. Here, the electric charge passes from the shield region via the shield node 43 to the constant-current circuit 42, and is used to discharge the parasitic capacitance (parasitic capacitance 220 in FIG. 6) between the shield region and the ground.

Thus, the shield drive circuit 40 transfers electric charge commensurate with the voltage signal Vcmp between the shield node 43 and the shield region and thereby controls the voltage on the shield region.

The passive element shielding technology eliminates the parasitic capacitance corresponding to the parasitic capacitances Cc, Cd, and Ce in FIG. 5. Instead, the passive element shielding technology produces a parasitic capacitance between the shield region and the ground, but the charging and discharging of this parasitic capacitance is performed by the shield drive circuit 40. It produces another parasitic capacitance between the shield region and the passive element (here, the resistor 31); however, as the voltage signal Vcmp varies, the shield drive circuit 40 makes the voltage signal Vcmp' vary, and thus the charging and discharging of the parasitic capacitance between the shield region and the passive element causes no or a sufficiently low burden on the error amplifier 20. Thus, even with an error amplifier 20 with low current capacity, it is possible to produce a less blunt voltage signal Vcmp. That is, it is possible to transmit a less blunt signal while achieving reduced power consumption.

The first embodiment includes Practical Examples EX1_1 to EX1_5 presented below. Unless otherwise stated, or unless inconsistent, the description given above in connection with the first embodiment applies to Practical Examples EX1_1 to EX1_5 presented below, and for any description of any practical examples that contradicts what has been described above, that description of that practical example can prevail. Unless inconsistent, any description of any of Practical Examples EX1_1 to EX1_5 can apply to any other of those practical examples (i.e., any two or more of the plurality of practical examples can be combined together).

In the following description, for the sake of convenience of description, the resistor that is the target of the passive element shielding technology (i.e., in FIG. 1, the resistor 31) is occasionally referred to as the target resistor.

Reference Practical Example

Figure 7:
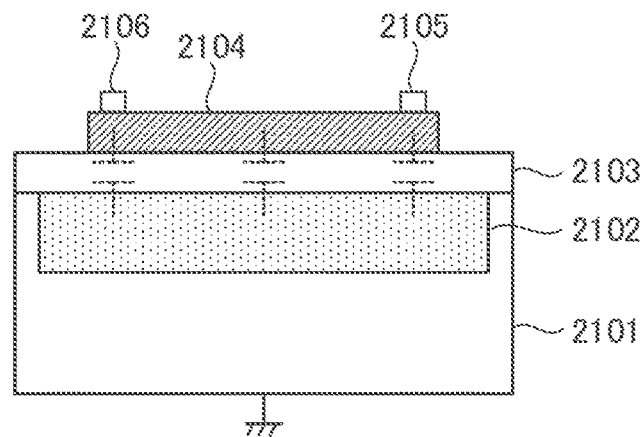
FIG. 7 is a vertical sectional view of a semiconductor device according to a reference configuration.

First, a reference practical example will be described as one for comparison with Practical Examples EX1 etc, which will be described later. FIG. 7 is a vertical sectional view of a semiconductor device according to the reference practical example. The semiconductor device in FIG. 7 has a P-type semiconductor substrate 2101. On the P-type semiconductor substrate 2101, a P-type well 2102 is formed, and over the P-type well 2102, with an oxide film 2103 interposed, a resistor 2104 of polysilicon is formed. The resistor 2104 is, at one and the other ends of it, provided with contact electrodes 2105 and 2106 respectively. The P-type semiconductor substrate 2101 has the ground potential. The vertical structure in FIG. 7 corresponds to the reference configuration in FIG. 5, the resistor 2104 corresponding to the resistor 31' in FIG. 5. In the vertical structure in FIG. 7, the P-type semiconductor substrate 2101 and the P-type well 2102 conduct to each other, and thus a considerably high parasitic capacitance is formed between the resistor 2104 and the P-type semiconductor substrate 2101.

Practical Example EX1_1

Figure 8A:
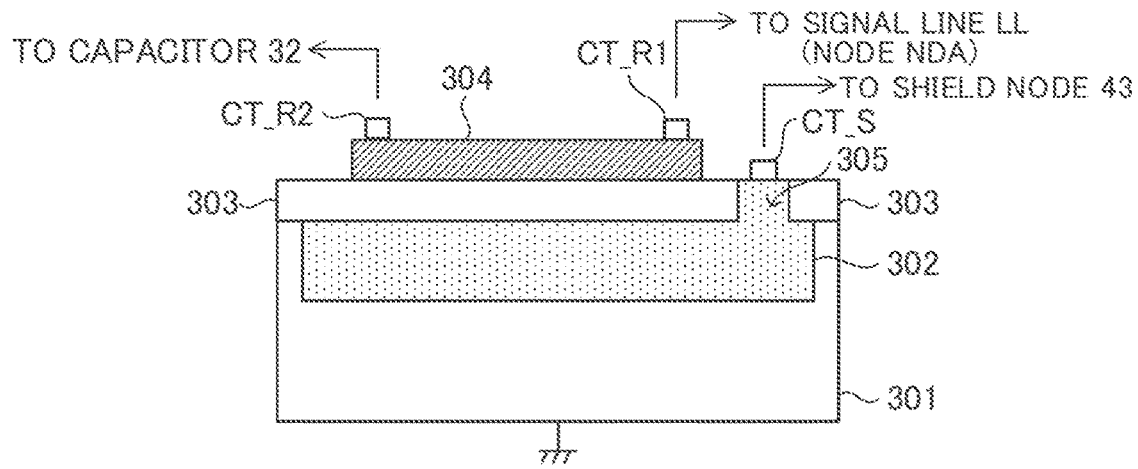
FIGS. 8A and 8B are vertical sectional views around a target resistor related to a passive element shielding technology in Practical Example EX1_1, which belongs to the first embodiment of the present invention.
Figure 8B:
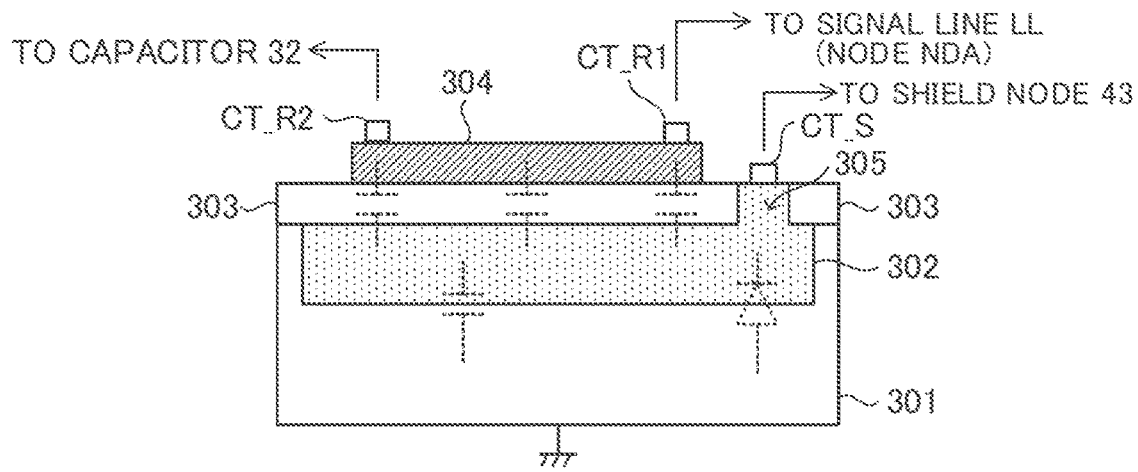

Practical Example EX1_1 will be described. FIG. 8A is a vertical sectional view of the principal parts, related to the passive element shielding technology, of a power IC 1 according to Practical Example EX1_1. FIG. 8B shows, in addition to what is shown in FIG. 8A, the parasitic capacitances and the parasitic diode formed in the vertical structure of Practical Example EX1_1. The power IC 1 according to Practical Example EX1_1 has a P-type semiconductor substrate 301, and on the P-type semiconductor substrate 301, a target resistor 304, which corresponds to the target resistor 31, is formed. Although various elements constituting the power IC 1 are formed on the P-type semiconductor substrate 301, all the elements except the target resistor 304 are omitted from illustration in FIGS. 8A and 8B (the same is true with FIG. 10, which will be referred to later). The symbols CT_S, CT_R1, and CT_R2 identify the contact electrodes provided on the power IC 1 according to Practical Example EX1_1.

Figure 9:
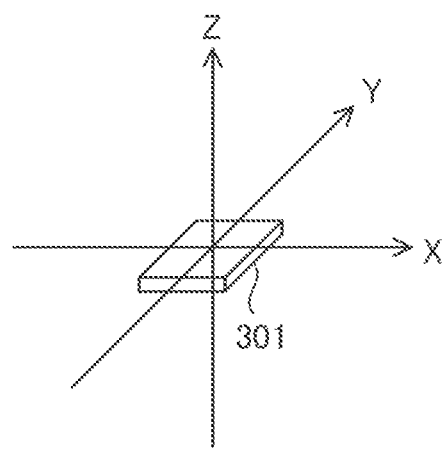
FIG. 9 is a diagram showing a relationship between X. Y, and Z axes and a semiconductor substrate.

For the sake of clear description, assume a three-dimensional rectangular coordinate system as shown in FIG. 9 defined by mutually perpendicular axes, called the X, Y, and Z axes respectively. The plane parallel to the X and Y axes is referred to as the XY plane. The P-type semiconductor substrate 301, and also any semiconductor substrate mentioned later, has two faces that are opposite from each other, of which one is called the principal face and the other is called the reverse face. In FIG. 9, as an example of a semiconductor substrate, the P-type semiconductor substrate 301 is shown. The principal and reverse faces are parallel to the XY plane. On the principal face, the elements constituting the power IC 1 are formed. In the vertical structure of a semiconductor integrated circuit, the direction from the reverse to the principal face is understood to point upward, and the direction from the principal to the reverse face is understood to point downward.

Referring to FIG. 8A, on the principal-face side of the P-type semiconductor substrate 301 (in other words, on the top side of the P-type semiconductor substrate 301), an N-type well 302 as an N-type semiconductor region is formed. Over the N-type well 302, with an oxide film 303 interposed, the target resistor 304 is formed. Thus, with the oxide film 303 provided between the N-type well 302 and the target resistor 304, the N-type well 302 and the target resistor 304 are separated from each other. The oxide film 303 can be one formed by LOCOS (local oxidation of silicon), which is a selective oxide film. The resistor 304 is, for example, a polysilicon resistor.

On the XY plane, the size of the N-type well 302 is larger than the size of the target resistor 304, so that the N-type well 302 is interposed between the target resistor 304 and the P-type semiconductor substrate 301 over the entire region of the target resistor 304.

In Practical Example EX1_1, the contact electrode CT_S is connected to the N-type well 302 via a contact hole 305 that penetrates the oxide film 303. The contact hole 305 is filled by the same N-type semiconductor as the N-type semiconductor that forms the N-type well 302. The contact hole 305 can be understood as part of the N-type well 302. Referring also to FIG. 1, the contact electrode CT_S is connected to the shield node 43 via a metal conductor (FIGS. 8A and 8B, the metal conductor is not shown). Thus, the voltage at the shield node 43 is applied to the N-type well 302.

In Practical Example EX1_1, the contact electrode CT_R1 is connected to one end of the target resistor 304, and the contact electrode CT_R2 is connected to the other end of the target resistor 304. Referring also to FIG. 1, the contact electrode CT_R1 is connected to the signal line LL, which is configured as a metal conductor (in other words, it is connected via the metal conductor to the node NDA), and the contact electrode CT_R2 is connected via a metal conductor to one end of the capacitor 32 (in FIGS. 8A and 8B, the metal conductors and the capacitor 32 are not shown).

The P-type semiconductor substrate 301 has the ground potential, and corresponds to the reference potential part mentioned previously. Specifically, for example, the reverse face of the P-type semiconductor substrate 301 is connected to the ground terminal GND, and thereby the P-type semiconductor substrate 301 is given the ground potential. The N-type well 302 corresponds to the shield region mentioned previously. Thus, in the vertical structure according to Practical Example EX1_1, a shield region (302) is provided between a passive element (304) that is connected to the signal line LL to receive the voltage signal Vcmp and a reference potential part (301), that has the ground potential.

Thus, on the P-type semiconductor substrate 301 in FIG. 8A, various elements (such as transistors) constituting the power IC 1 and wells (regions doped with an impurity) are formed by a process of semiconductor integration. Of the P-type semiconductor substrate 301, the substrate part having the ground potential can be understood as the reference potential part. In that case, it can be understood that the N-type well 302 (shield region) is provided between the substrate part of the P-type semiconductor substrate 301 and the target resistor 304 formed on the P-type semiconductor substrate 301. This applies also to any other semiconductor substrate described later.

As shown in FIG. 8B, in the vertical structure according to Practical Example EX1_1, a parasitic diode is formed between the N-type well 302 and the P-type semiconductor substrate 301. Even so, the voltage on the N-type well 302, which is connected to the shield node 43, never becomes negative, and thus no current passes through the parasitic diode. This ensures insulation between the P-type semiconductor substrate 301 and the N-type well 302.

Whereas a parasitic capacitance is formed between the target resistor 304 and the N-type well 302 and another parasitic capacitance is formed between the N-type well 302 and the P-type semiconductor substrate 301, no direct parasitic capacitance is formed between the target resistor 304 and the P-type semiconductor substrate 301. The charging and discharging of the parasitic capacitance between the target resistor 304 and the N-type well 302 and the parasitic capacitance between the N-type well 302 and the P-type semiconductor substrate 301 are performed by the shield drive circuit 40 (see FIG. 1), and thus the error amplifier 20 itself can have low current capacity.

Figure 10:
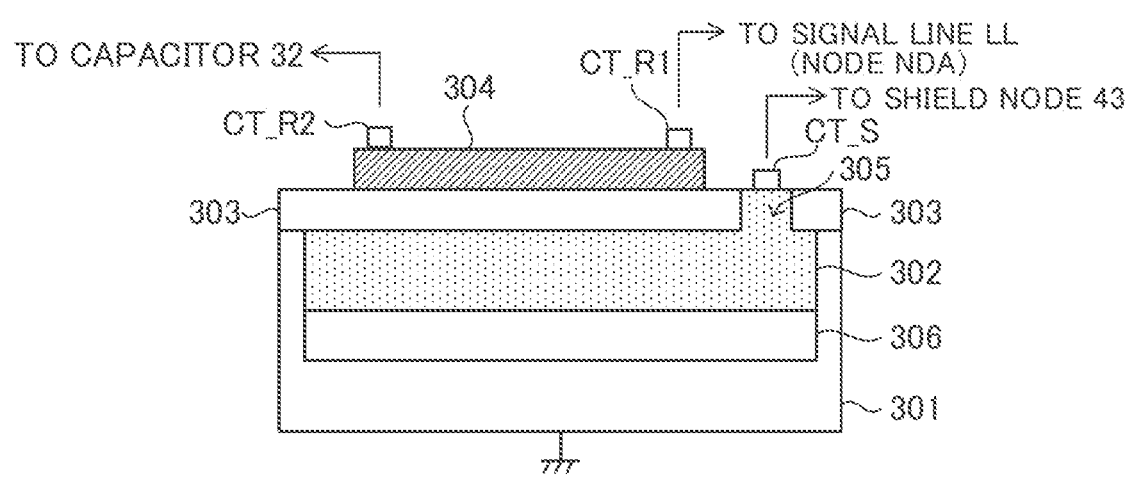
FIG. 10 is a diagram showing a modified structure of the vertical structure in FIG. 8A.

In the power IC 1 according to Practical Example EX1_1, as shown in FIG. 10, an N-type semiconductor region 306 can be formed between the N-type well 302 and the P-type semiconductor substrate 301. The dopant density in the N-type semiconductor region 306 is higher or lower than the dopant density in the N-type well 302. In the structure in FIG. 10, the N-type well 302 and the N-type semiconductor region 306 form a shield region. Also the structure in FIG. 10 provides workings and effects similar to those that the structure in FIG. 8A provides (the workings and effects of the passive element shielding technology).

Practical Example EX1_2

Figure 11A:
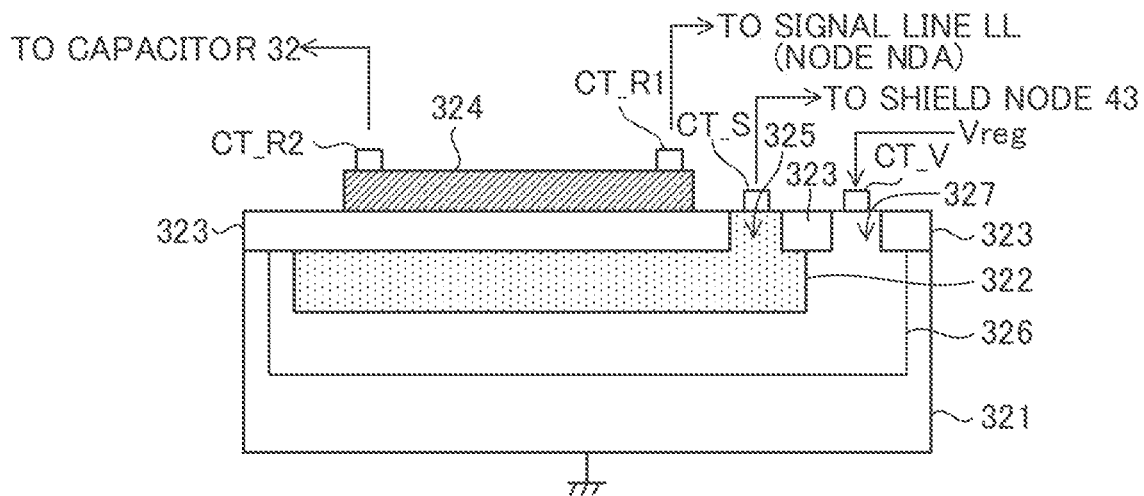
FIGS. 11A and 11B are vertical sectional views around a target resistor related to a passive element shielding technology in Practical Example EX1_2, which belongs to the first embodiment of the present invention.
Figure 11B:
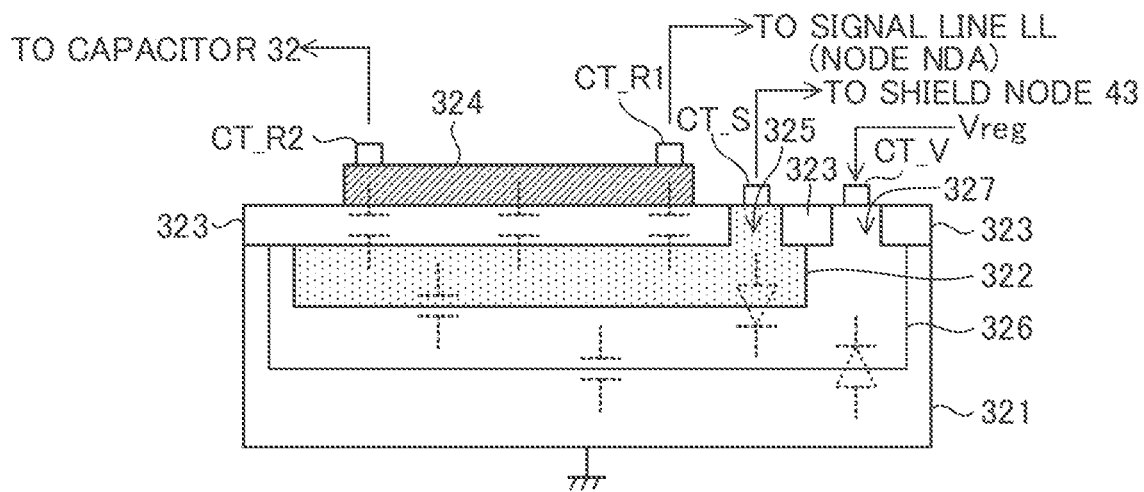

Practical Example EX1_2 will be described. FIG. 11A is a vertical sectional view of the principal parts, related to the passive element shielding technology, of a power IC 1 according to Practical Example EX1_2. FIG. 11B shows, in addition to what is shown in FIG. 11A, the parasitic capacitances and the parasitic diodes formed in the vertical structure of Practical Example EX1_2. The power IC 1 according to Practical Example EX1_2 has a P-type semiconductor substrate 321, and on the P-type semiconductor substrate 321, a target resistor 324, which corresponds to the resistor 31, is formed. Although various elements constituting the power IC 1 are formed on the P-type semiconductor substrate 321, all the elements except the target resistor 324 are omitted from illustration in FIGS. 11A and 11B. The symbols CT_V, CT_S, CT_R1, and CT_R2 identify the contact electrodes provided on the power IC 1 according to Practical Example EX1_2.

Referring to FIG. 11A, on the principal-face side of the P-type semiconductor substrate 321 (in other words, on the top side of the P-type semiconductor substrate 321), an N-type well 326 as an N-type semiconductor region is formed, and inside the N-type well 326, a P-type well 322 as a P-type semiconductor region is formed. Over the P-type well 322, with an oxide film 323 interposed, the target resistor 324 is formed. Thus, with the oxide film 323 provided between the P-type well 322 and the target resistor 324, the P-type well 322 and the target resistor 324 are separated from each other. The oxide film 323 can be one formed by LOCOS (local oxidation of silicon), which is a selective oxide film. The target resistor 324 is, for example, a polysilicon resistor.

On the XY plane, the size of the P-type well 322 is larger than the size of the target resistor 324, so that the P-type well 322 is interposed between the target resistor 324 and the P-type semiconductor substrate 321 over the entire region of the target resistor 324. On the XY plane, the size of the N-type well 326 is larger than the size of the P-type well 322, so that the N-type well 326 is interposed between the P-type well 322 and the P-type semiconductor substrate 321 over the entire region of the P-type well 322. The P-type well 322 is surrounded by the N-type well 326, and the P-type well 322 and the P-type semiconductor substrate 321 do not conduct to each other.

In the Practical Example EX1_2, the contact electrode CT_S is connected to the P-type well 322 via a contact hole 325 that penetrates the oxide film 323. The contact hole 325 is filled by the same P-type semiconductor as the P-type semiconductor that forms the P-type well 322. The contact hole 325 may be understood as part of the P-type well 322. Referring also to FIG. 1, the contact electrode CT_S is connected to the shield node 43 via a metal conductor (in FIGS. 11A and 11B, the metal conductor is not shown). Thus, the voltage at the shield node 43 is applied to the P-type well 322.

In Practical Example EX1_2, the contact electrode CT_R1 is connected to one end of the target resistor 324, and the contact electrode CT_R2 is connected to the other end of the target resistor 324. Referring also to FIG. 1, the contact electrode CT_R1 is connected to the signal line LL, which is configured as a metal conductor (in other words, it is connected via the metal conductor to the node NDA), and the contact electrode CT_R2 is connected via a metal conductor to one end of the capacitor 32 (in FIGS. 11A and 11B, the metal conductors and the capacitor 32 are not shown).

In Practical Example EX1_2, the contact electrode CT_V is connected to the N-type well 326 via a contact hole 327 that penetrates the oxide film 323. The contact hole 327 is filled by the same N-type semiconductor as the N-type semiconductor that forms the N-type well 326. The contact hole 327 can be understood as part of the N-type well 326. The contact electrode CT_V is fed with the internal supply voltage Vreg via a metal conductor (in FIGS. 11A and 11B, the metal conductor is not shown). Thus, the internal supply voltage Vreg is applied to the N-type well 326.

The P-type semiconductor substrate 321 has the ground potential, and corresponds to the reference potential part mentioned previously. Specifically, for example, the reverse face of the P-type semiconductor substrate 321 is connected to the ground terminal GND, and thereby the P-type semiconductor substrate 321 is given the ground potential. The P-type well 322 corresponds to the shield region mentioned previously. Thus, in the vertical structure according to Practical Example EX1_2, a shield region (322) is provided between a passive element (324) that is connected to the signal line LL to receive the voltage signal Vcmp and a reference potential part (321) that has the ground potential.

As shown in FIG. 11B, in the vertical structure according to Practical Example EX1_2, a parasitic diode is formed between the P-type well 322 and the N-type well 326. Even so, a higher voltage is applied to the N-type well 326 than to the P-type well 322, and this ensures insulation between the wells 322 and 326. Likewise, a parasitic diode is formed between the N-type well 326 and the P-type semiconductor substrate 321. Even so, a higher voltage is applied to the N-type well 326 than to the P-type semiconductor substrate 321, and this ensures insulation between the N-type well 326 and the P-type semiconductor substrate 321.

Whereas a parasitic capacitance is formed between the target resistor 324 and the P-type well 322 and another parasitic capacitance is formed between the P-type well 322 and the N-type well 326, no direct parasitic capacitance is formed between the target resistor 324 and the P-type semiconductor substrate 321. The charging and discharging of the parasitic capacitance between the target resistor 324 and the P-type well 322 and the parasitic capacitance between the P-type well 322 and the N-type well 326 are performed by the shield drive circuit 40 (see FIG. 1), and thus the error amplifier 20 itself can have low current capacity. A direct-current voltage (Vreg) is applied to the parasitic capacitance between the N-type well 326 and the P-type semiconductor substrate 321, and this parasitic capacitance does not affect signal transmission.

Practical Example EX1_3

Figure 12:
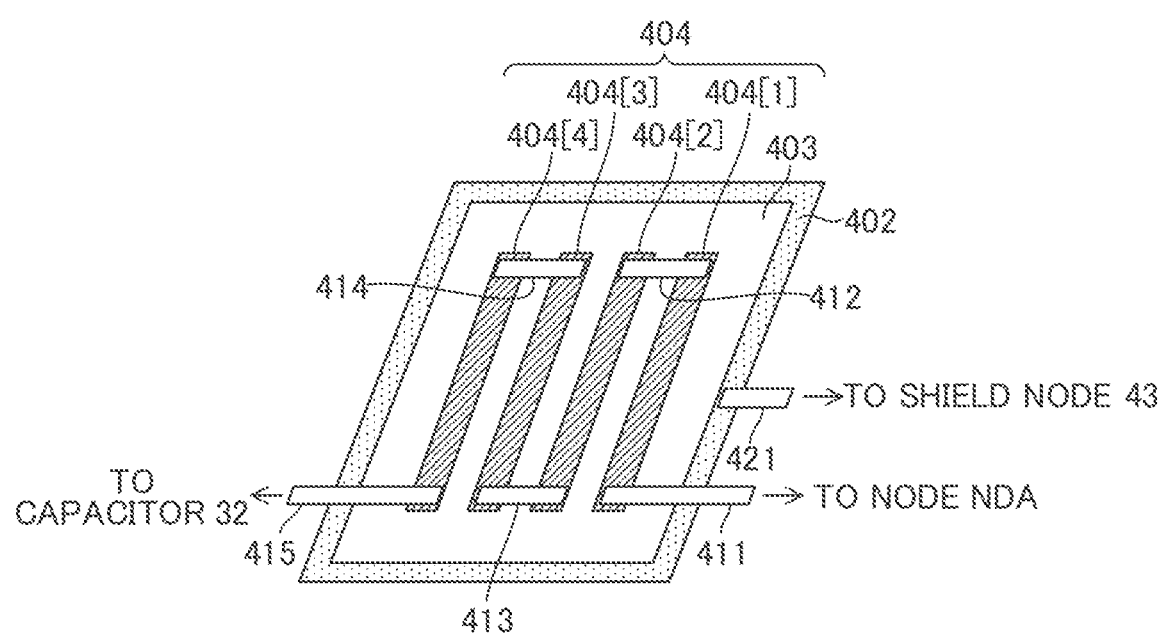
FIG. 12 is a conceptual diagram around a target resistor related to a passive element shielding technology in Practical Example EX1_3, which belongs to the first embodiment of the present invention.

Practical Example EX1_3 will be described. FIG. 12 is a conceptual diagram of the principal portion, related to the passive element shielding technology, of the power IC 1 according to Practical Example EX1_3, showing, along with metal conductors, the positional relationship among a target resistor 404, an oxide film 403, and an N-type well 402 that constitute the principal portion. The target resistor 404, the oxide film 403, and the N-type well 402 correspond to the target resistor 304, the oxide film 303, and the N-type well 302, respectively, in Practical Example EX1_1 (see FIG. 8A etc.). The target resistor 404 is composed of a plurality of resistive elements connected in series. While there is no restriction on the number of resistive elements that constitute the target resistor 404, it is here assumed that, as shown in FIG. 12, four resistive elements 404[1] to 404[4] are connected in series to form the target resistor 404.

Each resistive element has a rectangular shape parallel to the XY plane. The plurality of resistive elements can all have the same shape. The resistive elements 404[1] to 404[4] are arrayed, with the direction of their longer sides parallel to a first direction (e.g., the Y-axis direction), along a second direction (e.g., the X-axis direction) perpendicular to the first direction. Here, from the node NDA toward the capacitor 32, the resistive elements 404[1], 404[2], 404[3], and 404[4] are arranged in this order, and they are connected in series in this order.

More specifically, a metal conductor 411 is connected to one end of the resistive element 404[1]. A contact electrode (not shown in FIG. 12) for achieving conduction between one end of the resistive element 404[1] and the metal conductor 411 corresponds to the contact electrode CT_R1 mentioned previously (see FIG. 8A etc.), and this contact electrode (CT_R1) is connected to the node NDA via the metal conductor 411, which forms part of the signal line LL. The other end of the resistive element 404[1] and one end of the resistive element 404[2] are connected together by a metal conductor 412, the other end of the resistive element 404[2] and one end of the resistive element 404[3] are connected together by a metal conductor 413, the other end of the resistive element 404[3] and one end of the resistive element 404[4] are connected together by a metal conductor 414, and the other end of the resistive element 404[4] is connected to a metal conductor 415. A contact electrode (not shown in FIG. 12) for achieving conduction between the other end of the resistive element 404[4] and the metal conductor 415 corresponds to the contact electrode CT_R2 mentioned previously (see FIG. 8A etc.), and this contact electrode (CT_R2) is connected via the metal conductor 415 to one end of the capacitor 32 (of the two ends of the capacitor 32, that end which is not connected to the ground). The metal conductors 411 to 415 can be metal conductors that extend in the second direction mentioned above. Any metal conductor, including the metal conductors 411 to 415 and a metal conductor 421, of which the latter will be described later, is formed of aluminum or tungsten.

Under the target resistor 404, the oxide film 403 is formed, and further under the oxide film 403, the N-type well 402 is provided.

A metal conductor 421 is connected to the N-type well 402 at a predetermined position on it. A contact electrode (not shown in FIG. 12) provided at the predetermined position for achieving conduction between the N-type well 402 and the metal conductor 421 is the contact electrode CT_S mentioned previously (see FIG. 8A etc.). This contact electrode (CT_S) is connected via the metal conductor 421 to the shield node 43. The just-mentioned predetermined position is located outside the smallest rectangular that encloses the resistive elements 404[1] to 404[4] on the XY plane.

A description will now be given of the positional relationship and the size relationship among the target resistor 404, the oxide film 403, and the N-type well 402 in terms of shapes on the XY plane. When the smallest rectangular that encloses the resistive elements 404[1] to 404[4] on the XY plane is projected onto the oxide film 403, the resulting rectangular is smaller than the outline of the oxide film 403, and in addition the entire rectangular lies inside the outline of the oxide film 403. While in FIG. 12 the outline shape of the oxide film 403 on the XY plane is rectangular, this is not meant to exclude the outline shape being other than rectangular and including a curve (the same applies to the resistive elements 404[1] to 404[4] and the N-type well 402). Likewise, when the smallest rectangular that encloses the resistive elements 404[1] to 404[4] on the XY plane is projected onto the N-type well 402, the resulting rectangular is smaller than the outline of the N-type well 402, and in addition the entire rectangular lies inside the outline of the N-type well 402. Thus, the N-type well 402 is interposed between the target resistor 404 and the P-type semiconductor substrate (corresponding to the P-type semiconductor substrate 301 in FIG. 8A etc.; not shown in FIG. 12) over the entire region of the target resistor 404. This effectively suppresses formation of a parasitic capacitance between the target resistor 404 and the P-type semiconductor substrate.

It can additionally be that, when the outline of the oxide film 403 on the XY plane is projected onto the N-type well 402, the outline of the oxide film 403 is smaller than the outline of the N-type well 402 and lies inside the outline of the N-type well 402 (this structure is shown in FIG. 12). This, however, is not meant to limit the size relationship between the oxide film 403 and the N-type well 402 on the XY plane; the size relationship between the oxide film 403 and the N-type well 402 on the XY plane can be reversed as compared with what is described above.

What has been described above in connection with Practical Example EX1_3 is applicable to the structure of Practical Example EX1_2 (FIGS. 11A and 11B). In that case, the N-type well 402 mentioned above is to be read as the P-type well 402 and the target resistor 404, the oxide film 403, and the P-type well 402 are to be understood to correspond to the target resistor 324, the oxide film 323, and the P-type well 322, respectively, in Practical Example EX1_2.

Practical Example EX1_4

Figure 13:
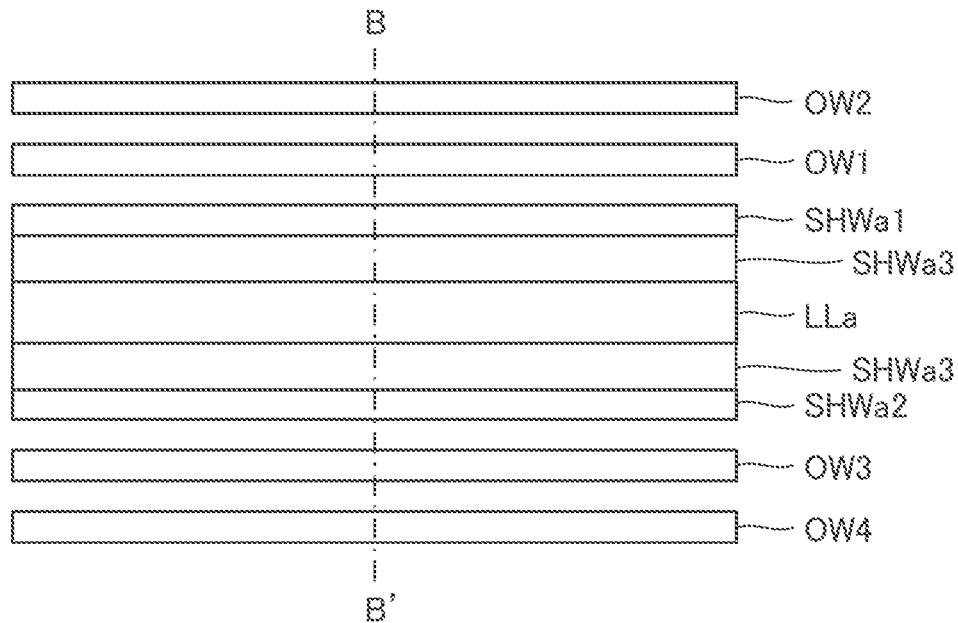
FIG. 13 is a planar layout diagram related to a signal line shielding technology in Practical Example EX1_4, which belongs to the first embodiment of the present invention.
Figure 14:
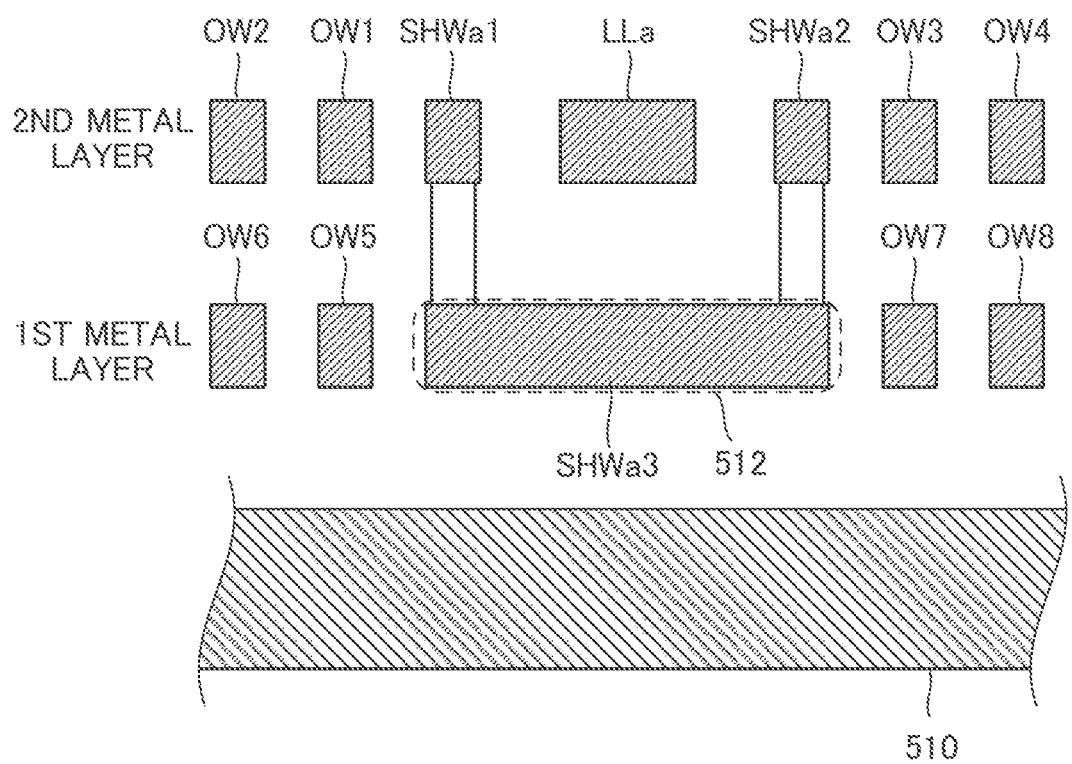
FIG. 14 is a sectional diagram related to a signal line shielding technology in Practical Example EX1_4, which belongs to the first embodiment of the present invention.

Practical Example EX1_4 will be described. Practical Example EX1_4 deals with a conductor layout related to the signal line shielding technology. FIG. 13 is a schematic plan view around a signal line LLa as the target of shielding in the power IC 1. The signal line LLa corresponds to the signal line LL1 or LL2 in FIG. 6. FIG. 14 is a sectional view around the signal line LLa across line B-B' in FIG. 13. It is assumed that the direction in which the signal line LLa extends is perpendicular to the sectional plane across line B-B'. The power IC 1 has a semiconductor part 510 and a plurality of metal layers, with those metal layers arranged over the semiconductor part 510. The metal layers include a first metal layer located over the semiconductor part 510 and a second metal layer located further over the first metal layer. At desired spots on each metal layer, metal conductors formed of aluminum or tungsten are provided.

The semiconductor part 510 is a part that includes a semiconductor substrate as well as a shield region and a target register formed on the semiconductor substrate. For example, in terms of the structure in FIG. 10, the semiconductor part 510 includes the P-type semiconductor substrate 301 and what is formed over it, namely the N-type semiconductor region 306, the N-type well 302, the oxide film 303, and the target resistor 304. In terms of the structure in FIG. 11, the semiconductor part 510 includes the P-type semiconductor substrate 321 and what is formed over it, namely the N-type well 326, the P-type well 322, the oxide film 323, and the target resistor 324. The semiconductor part 510 further includes various elements that constitute the power IC 1 and that are formed on the P-type semiconductor substrate 301 (e.g., the error amplifier 20, the shield drive circuit 40, the differential amplifier 60, etc.).

The semiconductor part 510 is, at desired spots on it, connected via contact electrodes (not shown in FIG. 14) to the corresponding metal conductors provided in the first metal layer. The metal conductors provided in the first metal layer are, at desired spots on them, connected across vias (via holes) to metal conductors provided in the second metal layer.

The metal conductors provided in the second metal layer include a signal line LLa and shield lines SHWa1 and SHWa2. In the second metal layer, the shield lines SHWa1 and SHWa2 are provided adjacent to the signal line LLa. That is, in the second metal layer, the signal line LLa is arranged between the shield lines SHWa1 and SHWa2. In the second metal layer are arranged, separate from the signal line LLa and the shield lines SHWa1 and SHWa2, a number of metal conductors including metal conductors OW1 to OW4. The second metal layer can be configured such that no metal conductor, that is, none of the metal conductors OW1 to OW4 and any other metal conductors, lies between the signal line LLa and the shield line SHWa1 and that no metal conductor, that is, none of the metal conductors OW1 to OW4 and any other metal conductors, lies between the signal line LLa and the shield line SHWa2.

The metal conductors provided in the first metal layer include a shield line SHWa3. The shield line SHWa3 is provided between the signal line LLa and the semiconductor part 510. That is, the shield line SHWa3 is so formed as to be located on the line segment that connects with the shortest distance between the signal line LLa and the semiconductor part 510. The shield line SHWa3 is connected across vias to the shield lines SHWa1 and SHWa2. The shield line SHWa3 can have, on the sectional plane across line B-B', a length equal to or greater than the distance between the shield lines SHWa1 and SHWa2 the shield line SHWa3 can thus lie, not only between the signal line LLa and the semiconductor part 510, but also between the shield line SHWa1 and the semiconductor part 510 and between the shield line SHWa2 and the semiconductor part 510. Specifically, for example, the shield line SHWa3 can be provided within a region 512 that lies inside the area of the first metal layer and that extends from the position right under the shield line SHWa1 through right under the signal line LLa to right under the shield line SHWa2. The shield line SHWa3 can be provided within a region that encompasses the region 512 and that is larger than the region 512.

In the first metal layer are arranged, separate from the shield line SHWa3, a number of metal conductors including metal conductors OW5 to OW8. It is here assumed that, as seen in a top view of the semiconductor part 510, the metal conductors OW1 to OW4 overlap the metal conductors OW5 to OW8; accordingly, the metal conductors OW5 to OW8 are not seen in FIG. 13.

The shield lines SHWa1, SHWa2, and SHWa3 are connected to the shield node 43. Thus, if the signal line LLa corresponds to the signal line LL1 in FIG. 6, then the shield lines SHWa1, SHWa2, and SHWa3 constitute the shield line SHW1; if the signal line LLa corresponds to the signal line LL2 in FIG. 6, then the shield lines SHWa1, SHWa2, and SHWa3 constitute the shield line SHW2.

The shield lines SHWa1, SHWa2, and SHWa3 are laid beside the signal line LLa as described above, so that a shield is formed between the signal line LLa and the reference potential part having the ground potential. This helps suppress formation of a parasitic capacitance between the signal line LLa and the reference potential part. The reference potential part is included in the semiconductor part 510, and corresponds to, for example, the P-type semiconductor substrate 301 or 321 mentioned previously. The signal line LLa has substantially no direct parasitic capacitance with respect to the P-type semiconductor substrate 301 or 321 or to the nearby metal conductors (OW1 to OW8); the signal line LLa has a parasitic capacitance only with respect to the shield lines SHWa1, SHWa2, and SHWa3.

Generally, at such spots as are right under the signal line LLa and are inside the semiconductor part 510, no elements such as transistors are formed, and only the P-type semiconductor substrate 301 or 321 lies. This does not mean to exclude elements such as transistors being formed at such spots.

Although the signal line LLa has been described as corresponding to the signal line LL1 or LL2 in FIG. 6, what has been described above in connection with Practical Example EX1_4 can be applied to each of the signal lines LL1 and LL2 This does not mean to exclude what has been described above in connection with Practical Example EX1_4 being applied to only one of the signal lines LL1 and LL2.

Practical Example EX1_5

Practical Example EX1_5 will be described. The first embodiment basically assumes the use of both the signal line shielding technology and the passive element shielding technology. It is also possible to use only either the signal line shielding technology or the passive element shielding technology.

Second Embodiment

A second embodiment of the present invention will be described. The second embodiment, and also the third to seventh embodiments described later, is an embodiment based on the first embodiment, and for any feature of which no specific description is given in connection with the second to seventh embodiments, unless inconsistent, the relevant description of the first embodiment applies to the second to seventh embodiments. In interpreting the description of the second embodiment, for any feature of it that contradicts any of the first embodiment, the description of that feature of the second embodiment can prevail (the same is true with the third to seventh embodiments described later). Unless inconsistent, any two or more of the first to seventh embodiments can be combined together.

Figure 15:
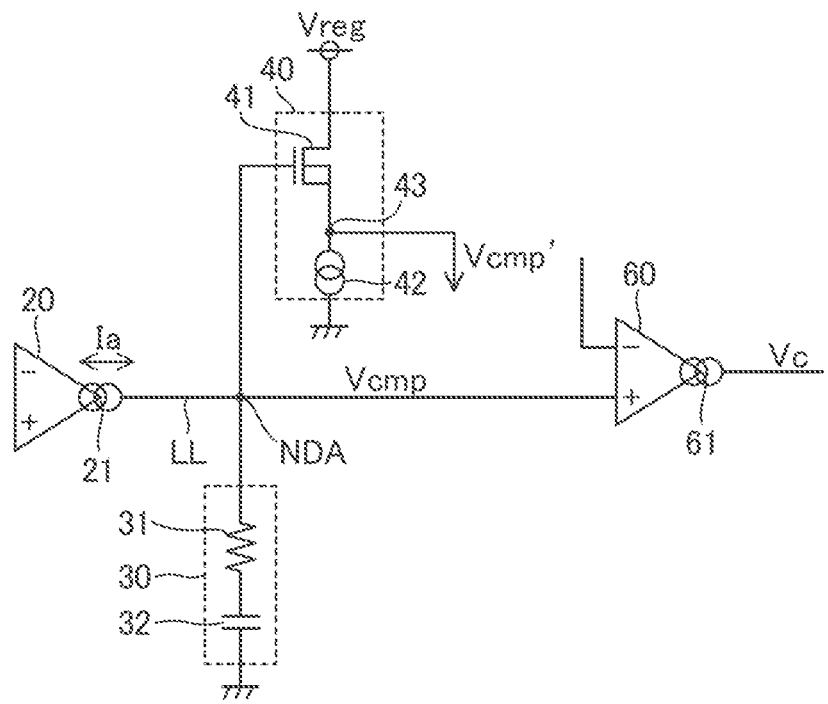
FIG. 15 is a part circuit diagram of a switching power IC according to a second embodiment of the present invention.

In the power IC 1, the arrangement position of the shield drive circuit 40 and the interconnection of the shield drive circuit 40 with other circuits can be modified as described below. FIG. 15 is a part circuit diagram of a power IC 1 to which the modification is applied, and is a part circuit diagram of a power IC 1 according to the second embodiment. The power IC 1 according to the second embodiment will be described below with focus placed on the differences between the first and second embodiments.

In the second embodiment, the interconnection among the error amplifier 20, the signal line LL, and the phase compensator 30 are the same as m the first embodiment. Thus, the output terminal 21 of the error amplifier 20 is connected to the signal line LL so that electric charge according to the current signal Ia is supplied to and retrieved from the signal line LL, and by the function of the error amplifier 20 and the phase compensator 30, the voltage signal Vcmp appears on the signal line LL.

Also the configuration and operation of the phase compensator 30 and the shield drive circuit 40 according to the second embodiment are the same as in the first embodiment, and so is the relationship between the voltage signals Vcmp and Vcmp' in the second embodiment. Specifically, also in the second embodiment, the gate of the transistor 41, one end of the resistor 31, and the output terminal 21 of the error amplifier 20 are connected together at the node NDA so that the gate of the transistor 41 is fed with the voltage signal Vcmp; the drain of the transistor 41 is fed with the internal supply voltage Vreg; the source of the transistor 41 and the constant-current circuit 42 are connected together at the shield node 43; and the constant-current circuit 42 operates such that a constant current (a current with a constant current value) passes from the shield node 43 toward the ground. As a result, the voltage signal Vcmp', which is commensurate with the voltage signal Vcmp, appears at the shield node 43. However, in the second embodiment, the signal line LL is connected directly to the non-inverting terminal of the differential amplifier 60, and thus the non-inverting terminal of the differential amplifier 60 is fed with, instead of the voltage signal Vcmp', the voltage signal Vcmp. Accordingly, in the second embodiment, though not specifically illustrated, also the non-inverting terminal of the light-load detection comparator 100 is directly connected to the signal line LL, and thus the non-inverting terminal of the light-load detection comparator 100 is fed with, instead of voltage signal Vcmp', the voltage signal Vcmp.

Figure 16:
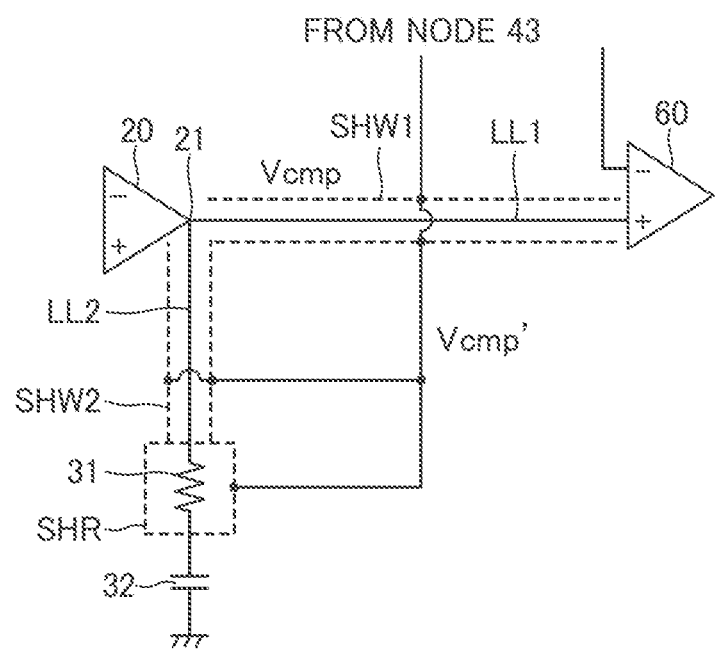
FIG. 16 is a conceptual diagram of a signal line shielding technology and a passive element shielding technology in the second embodiment of the present invention.

Also to the structure of the second embodiment, just as to the first embodiment, a signal line shielding technology and a passive element shielding technology can be applied. FIG. 16 is a conceptual diagram of the signal line shielding technology and the passive element shielding technology according to the second embodiment. As mentioned previously, the signal line LL can be understood to be composed of signal lines LL1 and LL2. In the second embodiment, the signal line LL1 is understood as a conductor that connects between the output terminal 21 and the non-inverting terminal of the differential amplifier 60. As for the signal line LL2, it is a conductor that connects between the output terminal 21 and the resistor 31 as in the first embodiment. Although, in FIG. 16, the signal lines LL1 and LL2 are shown as if they are, starting at the output terminal 21, completely separate from each other, the signal lines LL1 and LL2 can partly overlap with each other near the output terminal 21. In the second embodiment, in reality, a clamp circuit 110 and a light-load detection comparator 100 are also connected to the signal line LL; here, however, the signal line LL1 is to be understood as including a conductor between the output terminal 21 and the clamp circuit 110 and a conductor between the output terminal 21 and the light-load detection comparator 100.

The relationship among the signal line LL, the shield line, and the shield node 43 is as described in connection with the first embodiment. Specifically, the shield line is laid beside the signal line LL, and the shield node 43 is connected to the shield line so that the voltage on the shield line equals the voltage at the shield node 43. With the signal line LL understood as being divided into the signal lines LL1 and LL2, the shield line roughly divides into a shield line SHW1, which is laid beside the signal line LL1, and a shield line SHW2, which is laid beside the signal line LL2. The shield lines SHW1 and SHW2 are both connected to the shield node 43 so that the voltage at the shield node 43 is applied to the shield lines SHW1 and SHW2. As mentioned in connection with the first embodiment, a shield line is a conductive member arranged between a reference potential part having the ground potential and the signal line LL. The shield drive circuit 40 operates such that, as the voltage of the voltage signal Vcmp, which is transmitted across the signal line LL, rises, the shield drive circuit 40 raises the voltage on the shield line and that, as the voltage of the voltage signal Vcmp, which is transmitted across the signal line LL, falls, the shield drive circuit 40 drops the voltage on the shield line.

What constitutes the passive element shielding technology and how it is implemented are quite the same between the first and second embodiments. Specifically, a shield region is provided between a passive element (here, the resistor 31) that is connected to the signal line LL to receive the voltage signal Vcmp and a reference potential part having the ground potential. In FIG. 16, a broken line SHR conceptually indicates the shield region. The shield drive circuit 40 operates such that, as the voltage of the voltage signal Vcmp, which is transmitted across the signal line LL, rises, the shield drive circuit 40 raises the voltage on the shield region and that, as the voltage of the voltage signal Vcmp, which is transmitted across the signal line LL, falls, the shield drive circuit 40 drops the voltage on the shield region.

The configuration of the second embodiment provides workings and effects similar to those that the first embodiment provides. A difference is that, in the configuration of the second embodiment, the charging and discharging of the parasitic capacitance (corresponding to the parasitic capacitance Cb in FIG. 5) between the input terminals of the differential amplifier 60 and the charging and discharging of the parasitic capacitance (not specifically illustrated) appearing in the initial-stage circuit within the differential amplifier 60 need to be dealt with by the error amplifier 20, and thus either the error amplifier 20 needs to have accordingly higher current capacity or the voltage signal Vcmp is accordingly more likely to be blunt. This makes the configuration of the first embodiment preferable to that of the second embodiment.

The circuit configuration in FIG. 1 according to the first embodiment and the circuit configuration in FIG. 15 according to the second embodiment compare as follows: The power IC 1 includes a subsequent-stage circuit that is supposed to operate according to the voltage signal Vcmp, and that subsequent-stage circuit includes at least a differential amplifier 60. In the configuration in FIG. 1, between the error amplifier 20 and the subsequent-stage circuit, a shield drive circuit 40 is inserted and, instead of the voltage signal Vcmp itself, the voltage signal Vcmp' is fed, as a signal commensurate with the voltage signal Vcmp, to the subsequent-stage circuit (specifically, the non-inverting terminal of the differential amplifier 60). In contrast, in the configuration in FIG. 15, one end of a signal line LL extending from the output terminal 21 of the error amplifier 20 is connected to the subsequent-stage circuit (specifically, the non-inverting terminal of the differential amplifier 60) so that the voltage signal Vcmp itself is fed to the subsequent-stage circuit (specifically, the non-inverting terminal of the differential amplifier 60).

Third Embodiment

Figure 17:
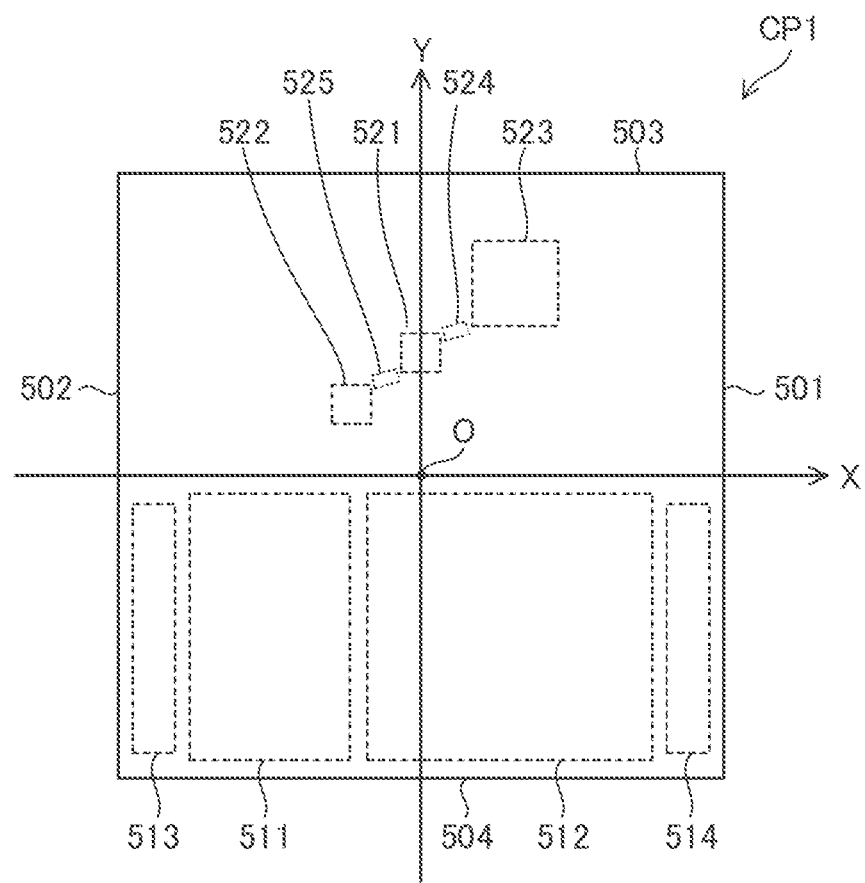
FIG. 17 is a diagram illustrating a layout of elements on a switching power IC in a third embodiment of the present invention.

A third embodiment of the present invention will be described. FIG. 17 shows an example of a layout in the power IC 1. The layout of the third embodiment is applicable to either of the first and second embodiments described previously, and is applicable, unless inconsistent, to any of the embodiments described later. FIG. 17 is a schematic plan view of a semiconductor chip CP1 having the elements constituting the power IC 1 integrated on a semiconductor substrate. The semiconductor integrated circuit in the power IC 1 is mounted on the semiconductor chip CP1. For the sake of concrete description, it is assumed that the semiconductor chip CP1 has a rectangular (which can be square) outline shape, and that the X and Y axes intersect perpendicularly at the center of the semiconductor chip CP1, with the center of the semiconductor chip CP1 taken as the origin O. This, however, is not meant to limit the outline shape of the semiconductor chip CP1 to rectangular.

On the XY plane, the semiconductor chip CP1 has the following structure. Being rectangular, the outline shape of the semiconductor chip CP1 has sides 501 and 502 that are opposite from each other and sides 503 and 504 that are opposite from each other. The sides 501 and 502 are parallel to the Y axis, with the side 501 located on the positive side along the X axis and the side 502 located on the negative side along the X axis. The sides 503 and 504 are parallel to the X axis, with the side 503 located on the positive side along the Y axis and the side 504 located on the negative side along the Y axis.

On the semiconductor chip CP1, in the negative zone along the Y axis, regions 511 to 514 are provided. The region 511 is a high-side transistor region where the high-side transistor 10H is formed. The region 512 is a low-side transistor region where the low-side transistor 10L is formed. The region 513 is a high-side driver region where a high-side driver (corresponding to the NAND circuit 91 in FIG. 3) is formed. The region 514 is a low-side driver region where a low-side driver (corresponding to the AND circuit 92 in FIG. 3) is formed. From the side 502 to the side 501, the regions 513, 511, 512, and 514 are arranged in this order. Although on the semiconductor chip CP1 in FIG. 17 the region 512 is larger than the region 511, the region 511 can be larger than the region 512, or the regions 511 and 512 have equal sizes. The regions 511 and 512 can be formed to stretch from the negative to the positive zone along the Y axis (the same applies to the regions 513 and 514).

On the semiconductor chip CP1, in the positive zone along the Y axis, regions 521 to 525 are provided. In the region 521, the error amplifier 20 and the shield drive circuit 40 are formed. In the region 521, the clamp circuit 110 can additionally be formed. In the region 522, the differential amplifier 60 is formed. In the region 523, the phase compensator 30 is formed. In the region 524, the signal line LL2 for connecting between the error amplifier 20 and the target resistor 31 is provided. The conductor provided in the region 525 differs between the first and second embodiments. Specifically, in the structure of the first embodiment (see FIG. 1), provided in the region 525 is the conductor that connects between the shield node 43 and the non-inverting terminal of the differential amplifier 60 in the structure of the second embodiment (see FIGS. 15 and 16), provided in the region 525 is the conductor that connects between the output terminal 21 of the error amplifier 20 and the non-inverting terminal of the differential amplifier 60.

Along the X axis, from the side 502 to the side 501, and along the Y axis, from the side 504 to the side 503, the regions 522, 525, 521, 524, and 523 are arranged in this order.

The positional relationship among the regions 521 to 523 on the XY plane is not limited to that specifically described above. Specifically, on the XY plane, the region 521 can be provided between the regions 522 and 523 as described above, but instead the region 522 can be provided between regions 521 and 523, or the region 523 can be provided between the regions 521 and 522. In any case, the regions 521 to 523 can be arranged on a single straight line parallel to the XY plane.

Fourth Embodiment

Figure 18A:
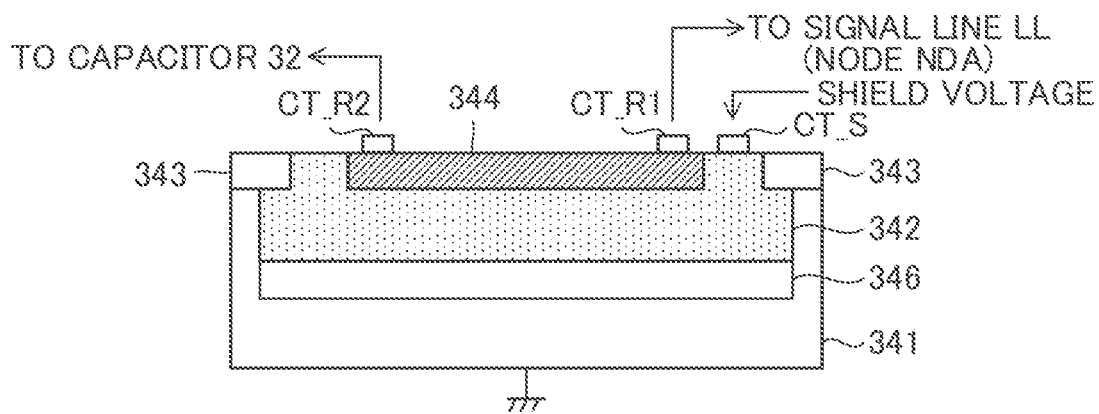
FIGS. 18A and 18B are vertical sectional views around a target resistor related to a passive element shielding technology in a fourth embodiment of the present invention.
Figure 18B:
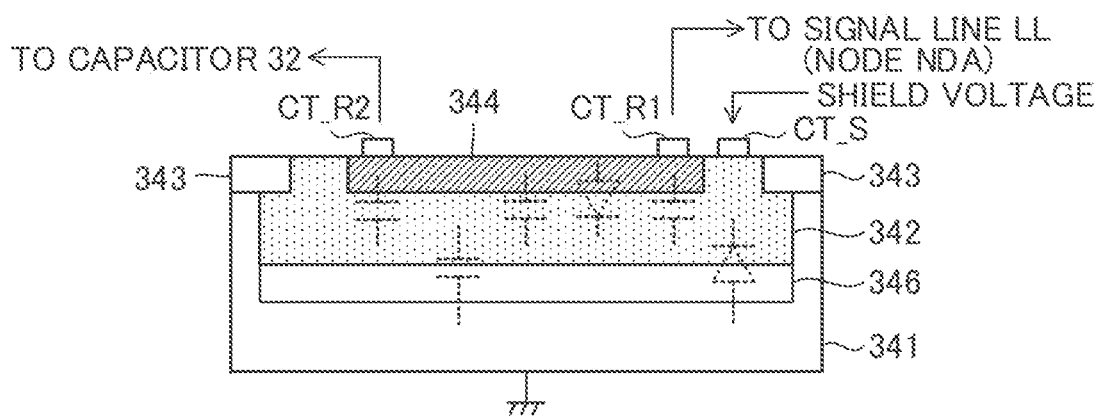

A fourth embodiment of the present invention will be described. The fourth embodiment deals with a modified example related to the vertical structure of the target resistor. FIG. 18A is a vertical sectional view of the principal parts, related to the passive element shielding technology, of a power IC 1 according to the fourth embodiment. FIG. 18B shows, in addition to what is shown in FIG. 18A, the parasitic capacitances and the parasitic diodes formed in the vertical structure according to the fourth embodiment. The power IC 1 according to the fourth embodiment has a P-type semiconductor substrate 341, and on the semiconductor substrate 341, a target resistor 344, which corresponds to the target resistor 31, is formed. Although various elements constituting the switching power IC 1 are formed on the semiconductor substrate 341, all the elements except the target resistor 344 are omitted from illustration in FIGS. 18A and 18B. The symbols CT_S, CT_R1, and CT_R2 identify the contact electrodes provided on the power IC 1 according to the fourth embodiment.

Referring to FIG. 18A, on the principal-face side of the P-type semiconductor substrate 341 (in other words, on the top side of the P-type semiconductor substrate 341), an N-type well 342 as an N-type semiconductor region is formed. It should be noted that, here, an N-type semiconductor region 346 is formed between the N-type well 342 and the P-type semiconductor substrate 341. The dopant density in the N-type semiconductor region 346 is higher or lower than the dopant density in the N-type well 342. The N-type semiconductor region 346 can be omitted.

After the N-type well 342 is formed, a predetermined dopant is deposited, from above, into part of the region where the N-type well 342 is formed, and thereby a top partial region of the N-type well 342 is formed into a P-type semiconductor region. This P-type semiconductor region acts as the target resistor 344. The target resistor 344 can be formed using a semiconductor of the same type as used to form a base region of a common bipolar transistor. Except at its top side, the target resistor 344 is surrounded by the N-type well 342 from all directions. In a top part of the N-type well 342, an oxide film 343 is provided in such a position as to surround the N-type well 342, and thereby the N-type well 342 is separated from other elements. The oxide film 343 can be an oxide film formed by LOCOS, which is a selective oxide film.

In the fourth embodiment, the contact electrode CT_S is provided at a position that is located outside the target resistor 344, which is a P-type semiconductor region, and at which the N-type well 342 is exposed in a top part of the N-type well 342; thereby the contact electrode CT_S is connected to the N-type well 342. To the contact electrode CT_S, a shield voltage is applied via a metal conductor, and thus the shield voltage is applied to the N-type well 342 (the shield voltage will be described later).

In the fourth embodiment, the contact electrode CT_R1 is connected to one end of the target resistor 344, and the contact electrode CT_R2 is connected to the other end of the target resistor 344. Referring also to FIG. 1 or 15, the contact electrode CT_R1 is connected to the signal line LL, which is configured as a metal conductor (in other words, it is connected via the metal conductor to the node NDA), and the contact electrode CT_R2 is connected via a metal conductor to one end of the capacitor 32 (in FIGS. 18A and 18B, the metal conductors and the capacitor 32 are not shown).

The P-type semiconductor substrate 341 has the ground potential, and corresponds to the reference potential part mentioned previously. Specifically, for example, the reverse face of the P-type semiconductor substrate 341 is connected to the ground terminal GND, and thereby the P-type semiconductor substrate 341 is given the ground potential. The N-type well 342 corresponds to the shield region mentioned previously. Thus, in the vertical structure according to the fourth embodiment, a shield region (342) is provided between a passive element (344) that is connected to the signal line LL to receive the voltage signal Vcmp and a reference potential part (341) that has the ground potential.

As shown in FIG. 18B, in the vertical structure according to the fourth embodiment, a parasitic diode is formed between the target resistor 344, which is a P-type semiconductor region, and the N-type well 342. To prevent a current from passing through the parasitic diode between the target resistor 344 and the N-type well 342, in the fourth embodiment, the shield voltage is made a voltage equal to or higher than the voltage at the node NDA. The shield voltage in the fourth embodiment, while being a voltage equal to or higher than the voltage at the node NDA, behaves in a similar manner as the voltage at the shield node 43 in the first or second embodiment.

Thus, in the fourth embodiment, the shield drive circuit 40 is modified to have the following functions: In the fourth embodiment, the shield drive circuit 40 has the function of producing a shield voltage that is commensurate with the voltage signal Vcmp and that in addition is equal to or higher than the voltage at the node NDA (i.e., the voltage of the voltage signal Vcmp), and meanwhile the shield drive circuit 40 operates such that, as the voltage of the voltage signal Vcmp, which is transmitted across the signal line LL, rises, the shield drive circuit 40 raises the shield voltage and that, as the voltage of the voltage signal Vcmp, which is transmitted across the signal line LL, falls, the shield drive circuit 40 drops the shield voltage. In a case where the first and fourth embodiments are combined together, the configuration in FIG. 1 can be so modified that the shield drive circuit 40 additionally has the function of producing a shield voltage. The so produced shield voltage can be fed to the shield region formed as the N-type well 342 and further to the shield line. A parasitic diode is formed between, at the one end, the N-type well 342 and the N-type semiconductor region 346 and, at the other end, the semiconductor substrate 341. Even so, the shield voltage never falls below the ground potential, and thus no current passes through the parasitic diode.

Whereas a parasitic capacitance is formed between the target resistor 344 and the N-type well 342 and another parasitic capacitance is formed between, at one end, the N-type well 342 and the N-type semiconductor region 346 and, at the other end, the semiconductor substrate 341, no direct parasitic capacitance is formed between the target resistor 344 and the P-type semiconductor substrate 341. The charging and discharging of the parasitic capacitance between the target resistor 344 and the N-type well 342 and the parasitic capacitance between, at one end, the N-type well 342 and the N-type semiconductor region 346 and, at the other end, the semiconductor substrate 341 are performed by the shield drive circuit 40, and thus the error amplifier 20 itself can have low current capacity.

In a case where the structure according to the fourth embodiment is applied to Practical Example EX1_4 (FIGS. 13 and 14), the semiconductor part 510 in FIG. 14 is understood to include the semiconductor substrate 341 and what is formed over it, namely the N-type semiconductor region 346, the N-type well 342, the oxide film 343, and the target resistor 344.

In a case where, as mentioned in connection with the first embodiment, the target resistor is formed of polysilicon, the target resistor exhibits a negative temperature coefficient. In contrast, in a case where the target resistor is formed as in the fourth embodiment, the target resistor exhibits a positive temperature coefficient. It is possible to adopt whichever of the methods for forming the target resistor suits the desired temperature characteristics and the like.

Fifth Embodiment

Figure 19:
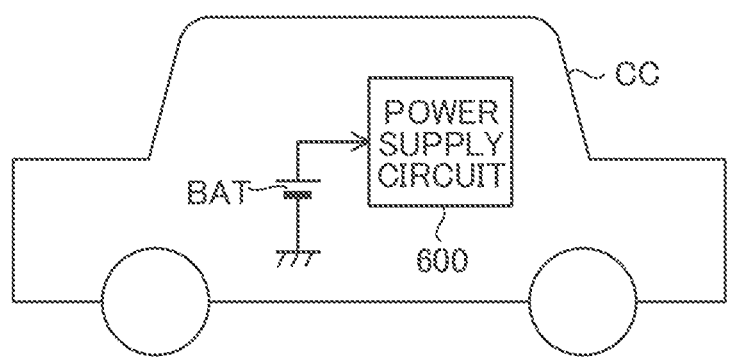
FIG. 19 is a diagram showing a vehicle according to a fifth embodiment of the present invention.

A fifth embodiment of the present invention will be described. A switching power supply SPS including any of the switching power ICs 1 presented in the embodiments described above can be incorporated in any device and can be used as a power supply for any load. FIG. 19 shows an example of a configuration for a case where a power supply 600 is incorporated in a vehicle CC such as an automobile. The vehicle CC includes a battery BAT that can output a predetermined direct-current voltage. The output power from the battery BAT is used to start the engine (not shown) of the vehicle CC and to drive various electric components (such as headlights) mounted on the vehicle CC.

As the power supply 600, a switching power supply SPS including any of the switching power ICs 1 presented in the embodiments described above can be used. The input voltage (corresponding to the input voltage Vin in FIG. 1) to the power supply 600 can be the output voltage itself from the battery BAT, or can be any other direct-current voltage produced based on the output voltage of the battery BAT. The output voltage (corresponding to the output voltage Vout in FIG. 1) from the power supply 600 can be supplied to various load mounted on the vehicle CC (e.g., an air conditioner, a navigation system, a display device, another power supply circuit, etc.).

Sixth Embodiment

A sixth embodiment of the present invention will be described. Configuration examples where the present invention is applied to a voltage-input current-output amplifier (i.e., a transconductance amplifier) are described above. The present invention can be applied also to a voltage-input voltage-output amplifier.

Figure 20:
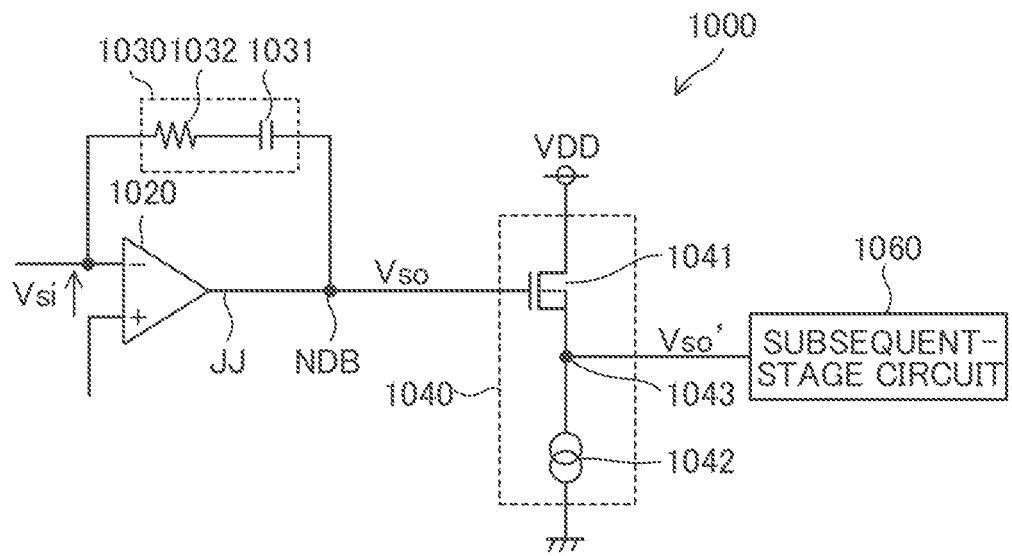
FIG. 20 is a part circuit diagram of a semiconductor device according to a sixth embodiment of the present invention.

FIG. 20 shows, as an example of a device where the present invention is applied to a voltage-input voltage-output amplifier, a semiconductor device 1000. FIG. 20 is a part circuit diagram of the circuits included in the semiconductor device 1000. The semiconductor device 1000 can include a circuit that constitutes a switching power supply or the like. The semiconductor device 1000 includes an amplifier 1020 that receives a voltage signal Vsi as an input signal and that outputs as an output signal a voltage signal Vso commensurate with the voltage signal Vsi, a feedback circuit 1030 that feeds the voltage on the output side of the amplifier 1020 back to the input side, a shield drive circuit 1040, and a subsequent-stage circuit 1060. The feedback circuit 1030 includes a capacitor 1031 and a resistor 1032. The shield drive circuit 1040 includes a transistor 1041 configured as a N-channel MOSFET and a constant-current circuit 1042 connected in series with the transistor 1041.

The amplifier 1020 is an operational amplifier having a non-inverting terminal, an inverting terminal, and an output terminal, with the voltage signal Vsi applied to the inverting terminal relative to the voltage at the non-inverting terminal. The output terminal of the amplifier 1020 is connected to a signal line JJ so as to be connected across the signal line JJ to one end of the capacitor 1031, and the other end of the capacitor 1031 is connected via the resistor 1032 to the inverting terminal of the amplifier 1020. Thus, on the signal line JJ appears a voltage signal Vso that is based on the output signal of the amplifier 1020 and that is commensurate with the voltage signal Vsi. The voltage signal Vso is a signal having a potential relative to the ground. The amplifier 1020 operates on, as a positive-side supply voltage, a supply voltage VDD and, as a negative-side shield voltage, the ground. Thus, the voltage signal Vso has a voltage value in the range equal to or higher than 0 V but equal to or lower than the supply voltage VDD.

On the other hand, the output terminal of the amplifier 1020 is connected also across the signal line JJ to the gate of the transistor 1041. The node at which the gate of the transistor 1041, one end of the capacitor 1031, and the output terminal of the amplifier 1020 are connected together is referred to, in particular, as the node NDB. The drain of the transistor 1041 is fed with the supply voltage VDD, which is a positive direct-current voltage, and between the source of the transistor 1041 and the ground, the constant-current circuit 1042 is provided. The node at which the source of the transistor 1041 and the constant-current circuit 1042 are connected together is referred to as the shield node 1043. The constant-current circuit 1042 operates such that a constant current (a current with a constant current value) passes from the shield node 1043 toward the ground. At the shield node 1043 appears a voltage signal Vso' commensurate with the voltage signal Vso. The voltage of the voltage signal Vso' is lower than the voltage of the voltage signal Vso by the gate-source voltage of the transistor 1041. Thus, as the voltage of the voltage signal Vso rises, the voltage of the voltage signal Vso' rises; as the voltage of the voltage signal Vso falls, the voltage of the voltage signal Vso' falls. The gate-source voltage of the transistor 1041 can practically be regarded as constant.

The subsequent-stage circuit 1060 is any circuit that is supposed to operate on the voltage signal Vso. Since the voltage signal Vso' is a voltage signal that varies as the voltage signal Vso varies, the subsequent-stage circuit 1060 can operate in a desired manner on the voltage signal Vso'.

The signal line JJ functions as a conductor across which to transmit the voltage signal Vso. The signal line shielding technology mentioned previously can be applied to the signal line JJ. The capacitor 1031 functions as a passive element that is connected to the signal line JJ to receive the voltage signal Vso. The passive element shielding technology mentioned previously can be applied to the capacitor 1031. The signal line shielding technology and the passive element shielding technology provide the effects mentioned previously.

Figure 21:
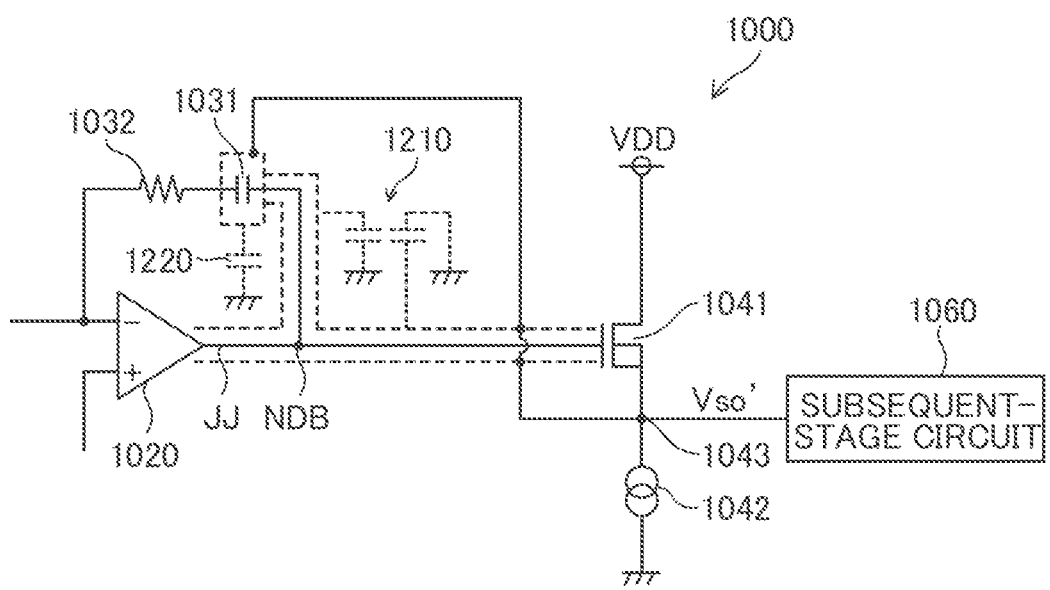
FIG. 21 is a conceptual diagram of a signal line shielding technology and a passive element shielding technology in the sixth embodiment of the present invention.

FIG. 21 is a conceptual diagram of the signal line shielding technology and the passive element shielding technology according to the sixth embodiment.

With the signal line shielding technology, a shield line is laid beside the signal line JJ, and the shield node 1043 is connected to the shield line so that the voltage on the shield line equals the voltage at the shield node 1043. The shield line is a conductive member arranged between a reference potential part having the ground potential and the signal line JJ. The conductive member as the shield line can basically be a metal conductor, but this is not meant to exclude the shield line being formed of an electrically conductive material that is not classified into metals. Laying the shield line helps suppress formation of a parasitic capacitance between the signal line JJ and the ground (reference potential part). That is, providing the shield line prevents a direct parasitic capacitance from appearing between the signal line JJ and the ground (reference potential part), or reduces the parasitic capacitance between the signal line JJ and the ground as compared with a configuration with no shield line.

With the shield node 1043 connected to the shield line, the voltage of the voltage signal Vso', which varies with the voltage signal Vso, is applied to the shield line. Thus, the shield drive circuit 1040 operates such that, as the voltage of the voltage signal Vso, which is transmitted across the signal line JJ, rises, the shield drive circuit 1040 raises the voltage on the shield line and that, as the voltage of the voltage signal Vso, which is transmitted across the signal line JJ, falls, the shield drive circuit 1040 drops the voltage on the shield line.

More specifically, with reference to the state where the voltage signal Vso has a given voltage value, when the amplifier 1020 makes the voltage signal Vso change in the increasing direction, the voltage signal Vso' rises together, and the rise in the voltage signal Vso' is accompanied by supply of electric charge (positive electric charge) from the shield node 1043 toward the shield line. Here, the electric charge is fed from the source of the transistor 1041 via the shield node 1043 to the shield line, and is used to charge the parasitic capacitance (parasitic capacitance 1210 in FIG. 21) between the shield line and the ground.

In contrast, with reference to the state where the voltage signal Vso has a given voltage value, when the amplifier 1020 makes the voltage signal Vso change in the falling direction, the voltage signal Vso' falls together, and the fall in the voltage signal Vso' is accompanied by retrieval of electric charge (positive electric charge) from the shield line toward the shield node 1043. Here, the electric charge passes from the shield line via the shield node 1043 to the constant-current circuit 1042, and is used to discharge the parasitic capacitance (parasitic capacitance 1210 in FIG. 21) between the shield line and the ground.

In a situation where the voltage signal Vso has fallen to around 0 V, the transistor 1041 is off and no current passes through the transistor 1041. It is here assumed, however, that no such situation occurs during normal operation of the semiconductor device 1000, and thus a situation like that is ignored.

With the passive element shielding technology, a shield region is provided between a passive element that is connected to the signal line JJ to receive the voltage signal Vso and a reference potential part having the ground potential, and the voltage on the shield region is controlled according to the voltage signal Vso by the shield drive circuit 1040. In the sixth embodiment, the passive element that is connected to the signal line JJ to receive the voltage signal Vso is the capacitor 1031.

The shield region is a region formed on the semiconductor substrate that constitutes the semiconductor device 1000. Providing the shield region helps suppress formation of a parasitic capacitance between the passive element and the ground (reference potential part). That is, providing the shield region prevents a direct parasitic capacitance from appearing between the passive element and the ground (reference potential part), or reduces the parasitic capacitance between the passive element and the ground as compared with a configuration with no shield region.

With the shield node 1043 connected to the shield region, the voltage of the voltage signal Vso', which varies with the voltage signal Vso, is applied to the shield region. Thus, the shield drive circuit 1040 operates such that, as the voltage of the voltage signal Vso, which is transmitted across the signal line JJ, rises, it raises the voltage on the shield region and that, as the voltage of the voltage signal Vso, which is transmitted across the signal line JJ, falls, it drops the voltage on the shield region.

More specifically, with reference to the state where the voltage signal Vso has a given voltage value, when the amplifier 1020 makes the voltage signal Vso change in the rising direction, the voltage signal Vso' rises together, and the rise in the voltage signal Vso' is accompanied by supply of electric charge (positive electric charge) from the shield node 1043 toward the shield region. Here, the electric charge is fed from the source of the transistor 1041 via the shield node 1043 to the shield region, and is used to charge the parasitic capacitance (parasitic capacitance 1220 in FIG. 21) between the shield region and the ground.

In contrast, with reference to the state where the voltage signal Vso has a given voltage value, when the amplifier 1020 makes the voltage signal Vso change in the falling direction, the voltage signal Vso' falls together, and the fall in the voltage signal Vso' is accompanied by retrieval of electric charge (positive electric charge) from the shield region toward the shield node 1043. Here, the electric charge passes from the shield region via the shield node 1043 to the constant-current circuit 1042, and is used to discharge the parasitic capacitance (parasitic capacitance 1220 in FIG. 21) between the shield region and the ground.

Figure 22A:
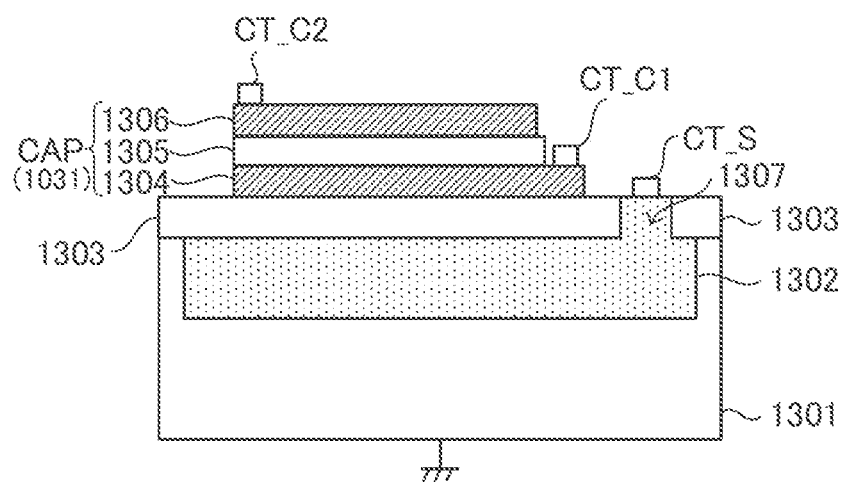
FIGS. 22A and 22B are vertical sectional views around a target resistor related to a passive element shielding technology in the sixth embodiment of the present invention.
Figure 22B:
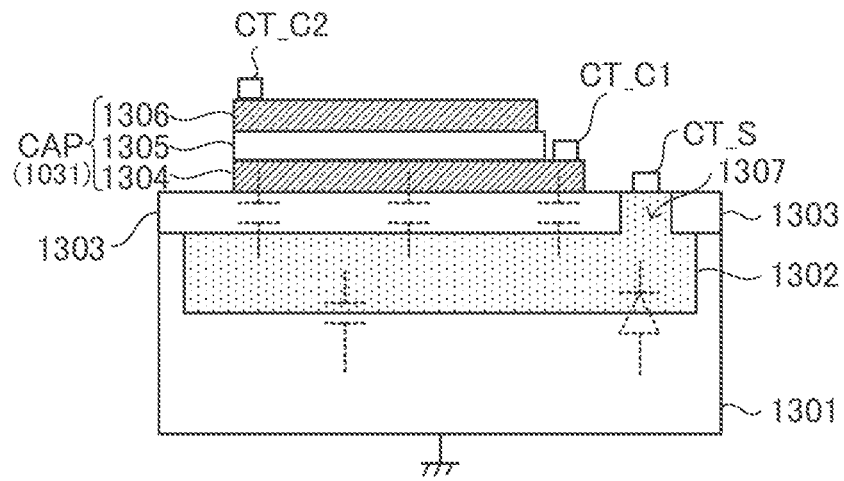
Figure 23:
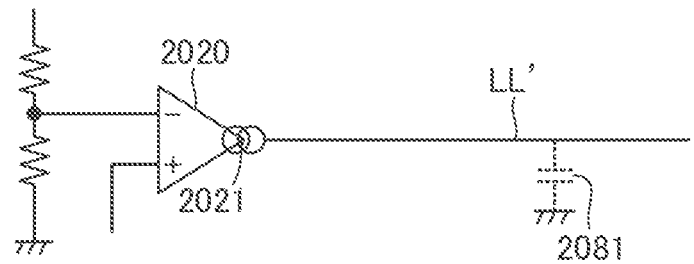
FIG. 23 is a part circuit diagram of a device including an amplifier according to related art.
Figure 24:
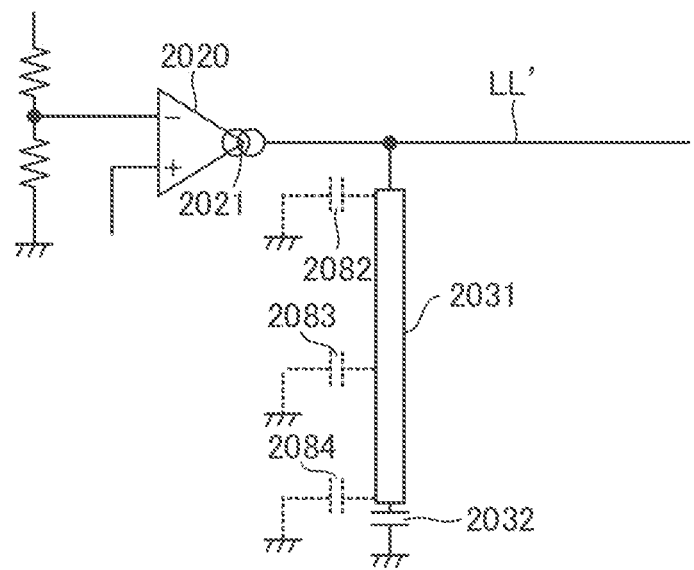
FIG. 24 is a part circuit diagram of a device including an amplifier according to related art.

FIG. 22A is a vertical sectional view of the principal parts, related to the passive element shielding technology, of the semiconductor device 1000 according to the sixth embodiment. FIG. 22B shows, in addition to what is shown in FIG. 22A, the parasitic capacitances and the parasitic diode formed in the vertical structure of the sixth embodiment. The semiconductor device 1000 according to the sixth embodiment has a P-type semiconductor substrate 1301, and on the P-type semiconductor substrate 1301, a capacitor CAP, which corresponds to the capacitor 1031, is formed. Although various elements constituting the semiconductor device 1000 are formed on the P-type semiconductor substrate 1301, all the elements except the capacitor CAP are omitted from illustration in FIGS. 22A and 22B. The symbols CT_S, CT_C1, and CT_C2 identify the contact electrodes provided on the semiconductor device 1000 according to the sixth embodiment.

Referring to FIG. 22A, on the principal-face side of the P-type semiconductor substrate 1301 (in other words, on the top side of the P-type semiconductor substrate 1301), an N-type well 1302 as an N-type semiconductor region is formed. An N-type semiconductor region with a dopant density higher or lower than that of the N-type well 1302 can be formed between the N-type well 1302 and the P-type semiconductor substrate 1301. Over the N-type well 1302, with an oxide film 1303 interposed, a conductive member 1304 is formed. Over the conductive member 1304, with an oxide film 1305 interposed, a conductive member 1306 is formed. The conductive members 1304 and 1306 are formed of polysilicon, a low-resistance semiconductor, or a metal. The oxide films 1303 and 1305 can be oxide films formed by LOCOS. The conductive member 1304, the oxide film 1305, and the conductive member 1306 constitute the capacitor CAP. The capacitor CAP and the N-type well 1302 are separated from each other by the oxide film 1303.

On the XY plane, which is parallel to the principal and reverse faces of the P-type semiconductor substrate 1301, the size of the N-type well 1302 is larger than the size of the capacitor CAP (i.e., the size of each of the conductive member 1304, the oxide film 1305, and the conductive member 1306), so that the N-type well 1302 is interposed between the capacitor CAP and the P-type semiconductor substrate 1301 over the entire region of the capacitor CAP.

In the sixth embodiment, the contact electrode CT_S is connected to the N-type well 1302 via a contact hole 1307 that penetrates the oxide film 1303. The contact hole 1307 is filled by the same N-type semiconductor as the N-type semiconductor that forms the N-type well 1302. The contact hole 1307 can be understood as part of the N-type well 1302. Referring also to FIG. 20, in the sixth embodiment, the contact electrode CT_S is connected to the shield node 1043 via a metal conductor (FIGS. 22A and 22B, the metal conductor is not shown). Thus, the voltage at the shield node 1043 is applied to the N-type well 1302.

In the sixth embodiment, the contact electrode CT_C1 is connected to the conductive member 1304, which corresponds to one end of the capacitor CAP, and the contact electrode CT_C2 is connected to the conductive member 1306, which corresponds to the other end of the capacitor CAP. Referring also to FIG. 20, the contact electrode CT_C1 is connected to the signal line JJ, which is configured as a metal conductor (in other words, it is connected via the metal conductor to the node NDB), and the contact electrode CT_C2 is connected via a metal conductor to one end of the resistor 1032 (in FIGS. 22A and 22B, the metal conductors and the resistor 1032 are not shown).

The P-type semiconductor substrate 1301 has the ground potential, and corresponds to the reference potential part mentioned previously. Specifically, for example, the reverse face of the P-type semiconductor substrate 1301 is connected to the ground terminal GND, and thereby the P-type semiconductor substrate 1301 is given the ground potential. The N-type well 1302 corresponds to the shield region mentioned previously. Thus, in the vertical structure according to the sixth embodiment, a shield region (1302) is provided between a passive element (CAP, 1031) that is connected to the signal line JJ to receive the voltage signal Vso and a reference potential part (1301) that has the ground potential.

As shown in FIG. 22B, a parasitic diode is formed between the N-type well 1302 and the P-type semiconductor substrate 1301. Even so, the voltage at the shield node 1043 (see FIG. 21) is applied via the contact electrode CT_S to the N-type well 1302, and thus the voltage on the shield node 1043 never falls below the ground potential. Thus, no current passes through the parasitic diode.

Whereas a parasitic capacitance is formed between the conductive member 1304 and the N-type well 1302 and another parasitic capacitance is formed between the N-type well 1302 and the P-type semiconductor substrate 1301, no direct parasitic capacitance appears between the conductive member 1304 and the P-type semiconductor substrate 1301. The charging and discharging of the parasitic capacitance between the conductive member 1304 and the N-type well 1302 and the parasitic capacitance between the N-type well 1302 and the P-type semiconductor substrate 1301 are performed by the shield drive circuit 1040.

If the amplifier 1020 has an ordinary current capacity, the shield drive circuit 1040 and the N-type well 1302 (shield region) can be omitted; the amplifier 1020 on its own can deal with the charging and discharging of the parasitic capacitance between the capacitor CAP and the P-type semiconductor substrate 1301. However, in a case where the current capacity of the amplifier 1020 has to be minimized, it is beneficial to provide the shield drive circuit 1040 and the N-type well 1302 (shield region) as described above.

In the sixth embodiment, the positional relationship between the capacitor 1031 and the resistor 1032 can be reversed. In that case, in FIG. 20, the output terminal of the amplifier 1020 is connected across the signal line JJ to one end of the resistor 1032, and the other end of the resistor 1032 is connected via the capacitor 1031 to the inverting terminal of the amplifier 1020. In this case, the passive element shielding technology can be applied to the resistor 1032.

Seventh Embodiment

A seventh embodiment of the present invention will be described. The seventh embodiment deals with some modifications and the like applicable to the first to sixth embodiments.

The description above deals with examples where a power IC 1 is used to build a switching power supply SPS. Instead, a plurality of discrete components can be used to build a circuit equivalent to the circuit inside the power IC 1. Some (e.g., the transistors 10H and 10L) of the elements described above as being included in the power IC 1 can be provided outside the power IC 1 to be externally connected to the power IC 1. Conversely, some of the elements described above as being provided outside the power IC 1 can be provided inside the power IC 1.

The power IC 1 constitutes a semiconductor integrated circuit for a switching power supply SPS, the semiconductor integrated circuit including: an output stage circuit 10 that performs switching on an input voltage Vin; and a control circuit that controls the output stage circuit 10 based on a feedback voltage Vfb commensurate with an output voltage Vout produced by the switching (in other words, the power IC 1 includes such a semiconductor integrated circuit). In the power IC 1, the control circuit includes an error amplifier 20, a phase compensator 30, a shield drive circuit 40, a current detector 50, a differential amplifier 60, an oscillator 70, a PWM comparator 80, a gate driver 90, a light-load detection comparator 100, a clamp circuit 110, and a timing controller 120.

While the above description deals with, with reference to FIG. 1 etc., examples of configurations where the present invention is applied to a synchronous-rectification step-down switching power supply, this is not meant to limit the application of the present invention; instead, the present invention can be applied to non-synchronous-rectification switching power supplies (specifically, it is possible to adopt configurations where a diode is used in place of the transistor 10L), or to step-up and step-up/down switching power supplies.

With respect to any signal or voltage, the relationship of its high and low, levels can be reversed within the spirit of what is disclosed herein.

Within the spirit of what is disclosed herein, any modification is possible where the types of some of the FETs are interchanged between the N-channel and P-channel types. A modification is also possible where the types of the semiconductors presented in the description of the vertical structure given above are interchanged between the N- and P-types.

Within the spirit of what is disclosed herein, transistors of any type can be used as the transistors described above. For example, any transistor mentioned above as a MOSFET can be replaced with a junction FET, an IGBT (insulated-gate bipolar transistor), or a bipolar transistor. Any transistor has a first electrode, a second electrode, and a control electrode. In an FET, one of the first and second electrodes corresponds to the drain, the other of them corresponds to the source, and the control electrode corresponds to the gate. In an IGBT, one of the first and second electrodes corresponds to the collector, the other of them corresponds to the emitter, and the control electrode corresponds to the gate. In a bipolar transistor that does not belong to the IGBT, one of the first and second electrodes corresponds to the collector, the other of them corresponds to the emitter, and the control electrode corresponds to the base.

A reference potential part having the ground potential is not limited to a semiconductor substrate; any part other than the semiconductor substrate can be a reference potential part so long as it has the ground potential.

Overview of the Invention, Part 1

To follow is an overview of the present invention as implemented in the different embodiments described thus far.

A semiconductor device $W_A$ (see FIGS. 1, 4, and 6 etc.) according to one aspect of the present invention is a semiconductor device including: an amplifier (e.g., 20) having an output terminal (e.g., 21) and configured to output from the output terminal a signal (e.g., Ia) commensurate with an input signal fed to the amplifier; a signal line (e.g., LL) connected to the output terminal and configured to transmit a target voltage signal (e.g., Vcmp) based on the output signal of the amplifier; a shield line (e.g., SHW1, SHW2) laid beside the signal line; and a shield drive circuit (e.g., 40) configured to control a voltage (e.g., Vcmp') on the shield line based on the target voltage signal.

For example, in the semiconductor device $W_A$, the shield drive circuit can be configured to raise and drop the voltage on the shield line in response to a rise and a drop, respectively, in the target voltage signal.

More specifically, for example, in the semiconductor device $W_A$, the shield drive circuit can include: a transistor (e.g., 41) having a gate that receives the target voltage signal; and a constant-current circuit (e.g., 42) connected in series with the transistor. The shield drive circuit can be configured to control the voltage on the shield line by transferring, between the connection node (e.g., 43) at which the transistor and the constant-current circuit are connected together and the shield line, electric charge commensurate with the target voltage signal.

A semiconductor device $W_B$ (see FIGS. 1, 4, and 6 etc.) according to another aspect of the present invention is a semiconductor device, comprising: an amplifier (e.g., 20) having an output terminal (e.g., 21) and configured to output from the output terminal a signal (e.g., Ia) commensurate with an input signal fed to the amplifier a signal line (e.g., LL) connected to the output terminal and configured to transmit a target voltage signal (e.g., Vcmp) based on an output signal of the amplifier; a passive element (e.g., the target resistor 31) connected to the signal line and configured to receive the target voltage signal, and a shield drive circuit (e.g., 40). The target voltage signal can be produced as a signal having a voltage relative to a predetermined reference potential (round). A shield region (e.g., in FIG. 8A, the N-type well 302) can be formed between the reference potential part (e.g., in FIG. 8A, the P-type semiconductor substrate 301) having the reference potential and the passive element (e.g., in FIG. 8A, the target resistor 304), and the shield drive circuit is configured to control the voltage on the shield region based on the target voltage signal.

For example, in the semiconductor device $W_B$, the shield drive circuit can be configured to raise and drop the voltage on the shield region in response to a rise and a drop, respectively, in the voltage of the target voltage signal.

More specifically, for example, in the semiconductor device $W_B$, the shield drive circuit includes: a transistor having a gate that receives the target voltage signal; and a constant-current circuit connected in series with the transistor. The shield drive circuit can be configured to control the voltage on the shield region by transferring, between the connection node at which the transistor and the constant-current circuit are connected together and the shield line, electric charge commensurate with the target voltage signal.

For another example, in the semiconductor device $W_A$ or $W_B$, there can be further provided a subsequent-stage circuit (e.g., 60) configured to operate according to the target voltage signal (e.g., Vcmp), and the subsequent-stage circuit is fed with, as a signal commensurate with the target voltage signal, a signal (e.g., Vcmp') at the connection node (e.g., 43) at which the transistor and the constant-current circuit are connected together (see FIG. 1). For another example, in the semiconductor device $W_A$ or $W_B$, there can be further provided a subsequent-stage circuit (e.g., 60) configured to operate according to the target voltage signal (Vcmp), and one end of the signal line leading from the output terminal (e.g., 21) can be connected to the subsequent-stage circuit.

Eighth Embodiment

Figure 25:
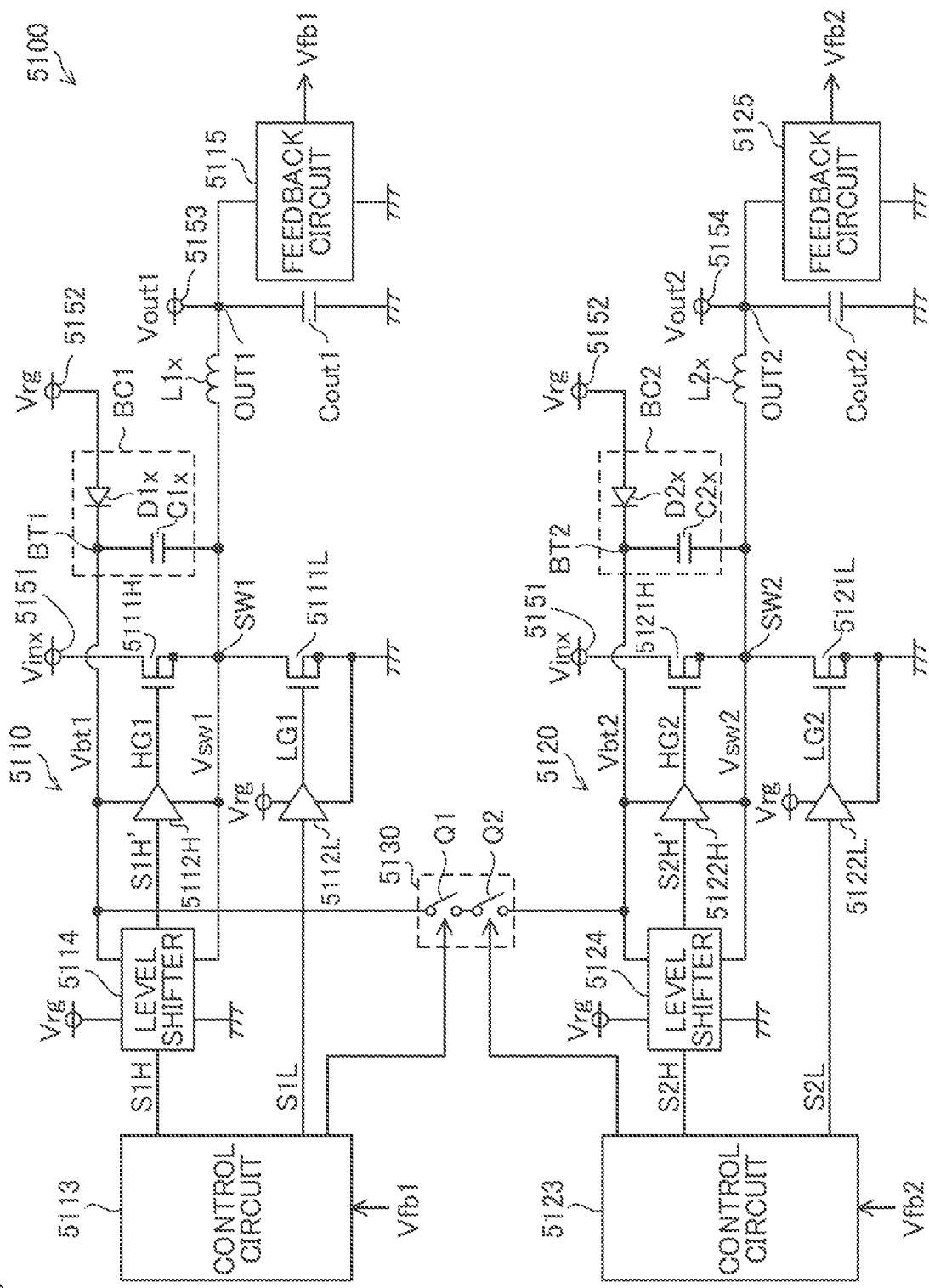
FIG. 25 is a configuration diagram of a power supply circuit according to an eighth embodiment of the present invention.

An eighth embodiment of the present invention will be described. FIG. 25 is an overall configuration diagram of a power supply circuit 5100 according to the eighth embodiment of the present invention. The power supply circuit 5100 includes step-down converters 5110 and 5120 and a switch circuit 5130. The step-down converter 5110 is a step-down DC-DC converter (direct-current to direct-current converter) that produces from a predetermined input voltage Vinx an output voltage Vout1, and the step-down converter 5120 is a step-down DC-DC converter (direct-current to direct-current converter) that produces from a predetermined input voltage Vinx an output voltage Vout2. A common input voltage Vinx is supplied to the step-down converters 5110 and 5120. The input voltage Vinx and the output voltages Vout1 and Vout2 are each a positive direct-current voltage.

Step-Down Converter 5110:

First, the step-down converter 5110 will be described. The step-down converter 5110 includes a high-side transistor 5111H, a low-side transistor 5111L, a high-side driver 5112H, a low-side driver 5112L, a control circuit 5113, a level shifter 5114, a feedback circuit 5115, a bootstrap diode D1$x$, a bootstrap capacitor C1$x$, an inductor L1$x$, and an output capacitor Cout1. The transistors 5111H and 5111L are configured as N-channel MOSFETs (metal-oxide-semiconductor field effect transistors).

The drain of the transistor 5111H is connected to a terminal 5151 (input voltage application terminal) to which the input voltage Vinx is applied. The source of the transistor 5111H and the drain of the transistor 5111L are connected together at a switching node SW1. The source of the transistor 5111L is connected to a ground. Thus, the input voltage Vinx is applied to the series circuit composed of the transistors 5111H and 5111L.

One end of the capacitor C1$x$ is connected to the switching node SW1, and the other end of the capacitor C1$x$ is connected to a boot node BT1. The anode of the diode D1$x$ is connected to a terminal 5152 to which a predetermined positive direct-current voltage Vrg is applied, and the cathode of the diode D1$x$ is connected to the boot node BT1. One end of the inductor L1$x$ is connected to the switching node SW1, and the other end of the inductor L1$x$ is connected to an output node OUT1. The capacitor Cout1 is provided between the output node OUT1 and the ground. An output voltage Vout1 appears at the output node OUT1. The output node OUT1 is connected to a terminal 5153 (output voltage application terminal) at which the output voltage Vout1 is supposed to appear (the two terminals can be understood to be the same). The output node OUT1 is connected also to the feedback circuit 5115. The feedback circuit 5115 feeds the control circuit 5113 with a feedback signal Vfb1 commensurate with the output voltage Vout1. For example, the feedback circuit 5115 has a plurality of voltage division resistors, and yields as the feedback signal Vfb1 a signal that results from the output voltage Vout1 being divided by the plurality of voltage division resistors.

Based on the feedback signal Vfb1, the control circuit 5113 produces and outputs a high-side control signal S1H for the high-side driver 5112H and a low-side control signal S1L for the low-side driver 5112L. The control signals S1H and S1L, are each a digital signal that takes either high or low level. With both control signals S1H and S1L, their high level corresponds to the potential level of the direct-current voltage Vrg, and their low level corresponds to the potential level of the ground. To the level shifter 5114 are connected the terminal to which the direct-current voltage Vrg is applied and the ground as well as the nodes BT1 and SW1. Based on the direct-current voltage Vrg fed to it and the voltage between the nodes BT1 and SW1, the level shifter 5114 shifts the level of the control signal S1H to produce a shifted high-side control signal S1H'. The high-side control signal S1H' too is, like the high-side control signal S1H, a digital signal that takes either high or low level. However, the high level of the high-side control signal S1H' corresponds to the potential level at the boot node BT1, and the low level of the high-side control signal S1H' corresponds to the potential level at the switching node SW1. When the control signal S1H is at high or low level, the control signal S1H' too is at high or low level respectively. In the following description, the voltage appearing at the boot node BT1 is occasionally referred to as the boot voltage Vbt1, and the voltage appearing at the switching node SW1 is occasionally referred to as the switching voltage Vsw1.

The gate driver 5112H is connected to the gate of the transistor 5111H, and drives the gate of the transistor 5111H. Specifically, the gate driver 5112H operates on, as a high potential-side supply voltage, the boot voltage Vbt1 and, as a low potential-side supply voltage, the switching voltage Vsw1. The gate driver 5112H feeds the gate of the transistor 5111H with a gate voltage HG1 commensurate with the high-side control signal SH' and thereby controls the state of the transistor 5111H. When the control signal S1H' is at high or low level, the gate driver 5112H keeps the gate voltage HG1 at high or low level respectively. The high level of the gate voltage HG1 corresponds to the level of the boot voltage Vbt1, and the low level of the gate voltage HG1 corresponds to the level of the switching voltage Vsw1. The transistor 5111H is on when the gate voltage HG1 is at high level, and is off when the gate voltage HG1 is at low level. However, if the potential difference between the nodes SW1 and BT1 is less than the gate threshold voltage of the transistor 511H, even when the gate voltage HG1 is at high level, the transistor 5111H does not turn on. Even when the just-mentioned potential difference is equal to or greater than the gate threshold voltage of the transistor 5111H, if the potential difference is comparatively small, the transistor 5111H has an accordingly high on-resistance.

The gate driver 5112L is connected to the gate of the transistor 5111L, and drives the gate of the transistor 5111L. Specifically, the gate driver 5112L, operates on, as a high potential-side supply voltage, the direct-current voltage Vrg and, as a low potential-side supply voltage, the ground. The gate driver 5112L, feeds the gate of the transistor 5111L with a gate voltage LG1 commensurate with the low-side control signal S1L and thereby controls the state of the transistor 5111L. When the low-side control signal S1L is at high or low level, the gate driver 5112L keeps the gate voltage LG1 at high or low level respectively. The high level of the gate voltage LG1 corresponds to the level of the direct-current voltage Vrg, and the low level of the gate voltage LG1 corresponds to the level of the ground. The transistor 5111L is on when the gate voltage LG1 is at high level, and is off when the gate voltage LG1 is at low level.

In the step-down converter 5110, a target voltage Vtg1 is set for the output voltage Vout1. The target voltage Vtg1 has a predetermined positive direct-current voltage value (e.g., 5 V). The control circuit 5113, by producing and outputting the control signals S1H and S1L based on the feedback signal Vfb1, turns on and off the transistors 5111H and 5111L so as to keep the output voltage Vout1 equal to the target voltage Vtg1 (i.e. so as to reduce the difference between the output voltage Vout1 and the target voltage Vtg1).

When the input voltage Vinx is higher than the target voltage Vtg1, the control circuit 5113 performs step-down switching control SC1 in which it turns on and off the transistors 5111H and 5111L alternately. In the step-down switching control SC1 by the control circuit 5113, a high-output state, that is, a state where the transistor 5111H is on and the transistor 5111L is off, and a low-output state, that is, a state where the transistor 5111H is off and the transistor 5111L is on, occur alternately. Meanwhile, based on the feedback signal Vfb1, the ratio of the length of the period of the high-output state to the length of the period of the low-output state is adjusted. This adjustment is performed so as to keep the output voltage Vout1 equal to the target voltage Vtg1 (i.e., so as to reduce the difference between the output voltage Vout1 and the target voltage Vtg1). The control circuit 5113 can perform this adjustment by pulse width modulation or pulse frequency modulation based on the feedback signal Vfb1. It is here assumed that the output duty of the step-down converter 5110 is adjusted by pulse width modulation. In the step-down converter 5110, the output duty denotes the proportion of the period of the high-output state to the sum of the period of the high-output state and the period of the low-output state (the same applies to any other step-down or step-up converter).

The step-down switching control SC1 proceeds, as is well known, as follows. In the high-output state, a current passes from the input voltage application terminal 5151 (the terminal 5151 to which the input voltage Vinx is applied) through the transistor 511H to the inductor L1$x$, so that energy is stored in the inductor L1$x$. In the subsequent low-output state, a current based on the energy stored in the inductor L1$x$ passes through the transistor 5111L to the inductor L1$x$. In the step-down converter 5110, through repetition of the high-output and low-output states, a switching voltage with a rectangular waveform of which the potential level changes between the potential level of the input voltage Vinx and the potential level of the ground appears at the switching node SW1. This switching voltage is smoothed by the inductor L1$x$ and the capacitor Cout1 to yield a direct-current output voltage Vout1. In the step-down switching control SC1, to prevent a through current between the transistors 5111H and 5111L, a dead-time period during which the transistors 5111H and 5111L are both off can be inserted as necessary between the period of high-output state and the period of low-output state (the same applies to any other step-down or step-up switching control).

Figure 26A:
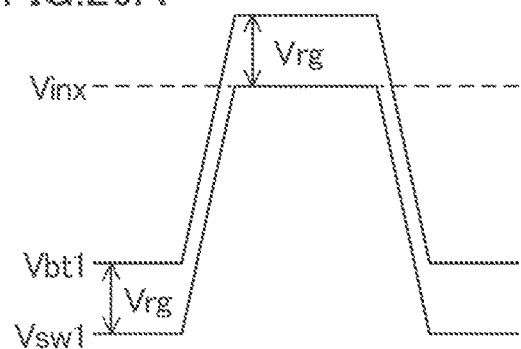
FIGS. 26A and 26B are diagrams showing an ideal relationship among an input voltage, a boot voltage, and a switching voltage in the eighth embodiment of the present invention.

In the step-down converter 5110, the capacitor C1$x$ and the diode D1$x$ constitute a bootstrap circuit BC1, and the bootstrap circuit BC1 makes it possible to drive the gate of the transistor 5111H. Specifically, when the step-down converter 5110 performs the step-down switching control SC1, in the low-output state, in which the transistor 5111L is on (i.e., when the voltage at the switching node SW1 is substantially 0 V), the boot node BT1 is kept on the high-potential side so that the capacitor C1$x$ is charged by the direct-current voltage Vrg through the diode D1$x$; subsequently, in the high-output state, while the voltage across the capacitor C1$x$ is kept equal to the direct-current voltage Vrg, the voltage at the switching node SW1 rises substantially up to the input voltage Vinx, and this makes the boot voltage Vbt1 substantially equal to the voltage (Vrg+Vinx) (here, for the sake of convenience of description, the forward voltage across the diode D1$x$ is ignored). That is, as shown in FIG. 26A, the voltage (Vbt1−Vsw1) between the nodes BT1 and SW1 is always substantially equal to the direct-current voltage Vrg, and this enables the driver 5112H to turn on and off the transistor 5111H.

Figure 27A:
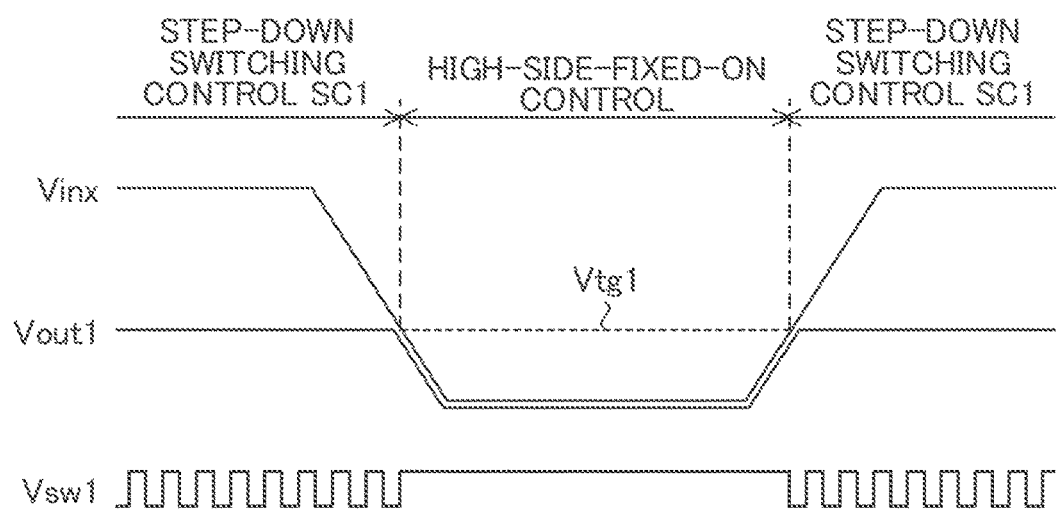
FIGS. 27A and 27B are diagrams illustrating step-down switching control and high-side-fixed-on control in the eighth embodiment of the present invention.

In the step-down converter 5110, basically the input voltage Vinx is higher than the target voltage Vtg1; if the input voltage Vinx is equal to or lower than the target voltage Vtg1, the control circuit 5113 performs high-side-fixed-on control. In the high-side-fixed-on control by the control circuit 5113, the control signals S1H and S1L are fixed at high and low levels respectively so that the transistors 5111H and 5111L are kept on and off respectively. For example, as shown in FIG. 27A, starting in a state where the input voltage Vinx is higher than the target voltage Vtg1 and the control circuit 5113 is performing the step-down switching control SC1, as the input voltage Vinx falls toward the target voltage Vtg1, the output duty of the step-down converter 5110 rises toward 100% (how it rises is omitted from illustration in FIG. 27A), and when the input voltage Vinx becomes equal to or lower than the target voltage Vtg, a state is entered where the output duty is fixed at 100%. The control here that keeps the output duty fixed at 100% corresponds to the high-side-fixed-on control. When thereafter the input voltage Vinx rises until it becomes higher than the target voltage Vtg1, the step-down switching control SC1 is restarted. For the sake of simple illustration, in FIG. 27A, how the output duty is modulated and how the amplitude of the switching voltage Vsw1 varies are omitted from illustration (the same is true with FIGS. 27B and 32, which will be referred to later).

Step-Down Converter 5120:

Next, the step-down converter 5120 will be described. Although the elements constituting the step-down converter 5120 and their interconnection and functions are similar to those m the step-down converter 5110, the step-down converter 5120 will be described in detail below. The step-down converter 5120 includes a high-side transistor 5121H, a low-side transistor 5121L, a high-side driver 5122H, a low-side driver 5122L, a control circuit 5123, a level shifter 5124, a feedback circuit 5125, a bootstrap diode D2$x$, a bootstrap capacitor C2$x$, an inductor L2$x$, and an output capacitor Cout2. The transistors 5121H and 5121L are configured as N-channel MOSFETs (metal-oxide-semiconductor field effect transistors).

The drain of the transistor 5121H is connected to a terminal 5151 (input voltage application terminal) to which the input voltage Vinx is applied. The source of the transistor 5121H and the drain of the transistor 5121L are connected together at a switching node SW2. The source of the transistor 5121L is connected to a ground. Thus, the input voltage Vinx is applied to the series circuit composed of the transistors 5121H and 5121L.

One end of the capacitor C2$x$ is connected to the switching node SW2, and the other end of the capacitor C2$x$ is connected to a boot node BT2. The anode of the diode D2$x$ is connected to a terminal 5152 to which a predetermined positive direct-current voltage Vrg is applied, and the cathode of the diode D2$x$ is connected to the boot node BT2. One end of the inductor L2$x$ is connected to the switching node SW2, and the other end of the inductor L2$x$ is connected to an output node OUT2. The capacitor Cout2 is provided between the output node OUT2 and the ground. An output voltage Vout2 appears at the output node OUT2. The output node OUT2 is connected to a terminal 5154 (output voltage application terminal) at which the output voltage Vout2 is supposed to appear. The output node OUT2 is connected also to the feedback circuit 5125. The feedback circuit 5125 feeds the control circuit 5123 with a feedback signal Vfb2 commensurate with the output voltage Vout2. For example, the feedback circuit 5125 has a plurality of voltage division resistors, and yields as the feedback signal Vfb2 a signal that results from the output voltage Vout2 being divided by the plurality of voltage division resistors.

Based on the feedback signal Vfb2, the control circuit 5123 produces and outputs a high-side control signal S2H for the high-side driver 5122H and a low-side control signal S2L for the low-side driver 5122L. The control signals S2H and S2L are each a digital signal that takes either high or low level. With both control signals S2H and S2L, their high level corresponds to the potential level of the direct-current voltage Vrg, and their low level corresponds to the potential level of the ground. To the level shifter 5124 are connected the terminal to which the direct-current voltage Vrg is applied and the ground as well as the nodes BT2 and SW2. Based on the direct-current voltage Vrg fed to it and the voltage between the nodes BT2 and SW2, the level shifter 5124 shifts the level of the control signal S2H to produce a shifted high-side control signal S2H'. The high-side control signal S2H' too is, like the high-side control signal S2H, a digital signal that takes either high or low level. However, the high level of the high-side control signal S21H' corresponds to the potential level at the boot node BT2, and the low level of the high-side control signal S2H' corresponds to the potential level at the switching node SW2. When the control signal S2H is at high or low level, the control signal S2H' too is at high or low level respectively. In the following description, the voltage appearing at the boot node BT2 is occasionally referred to as the boot voltage Vbt2, and the voltage appearing at the switching node SW2 is occasionally referred to as the switching voltage Vsw2.

The gate driver 5122H is connected to the gate of the transistor 512H, and drives the gate of the transistor 5121H. Specifically, the gate driver 5122H operates on, as a high potential-side supply voltage, the boot voltage Vbt2 and, as a low potential-side supply voltage, the switching voltage Vsw2. The gate driver 5122H feeds the gate of the transistor 5121H with a gate voltage HG2 commensurate with the high-side control signal S2H' and thereby controls the state of the transistor 5121H. When the high-side control signal S2H' is at high or low level, the gate driver 5122H keeps the gate voltage 1102 at high or low level respectively. The high level of the gate voltage HG2 corresponds to the level of the boot voltage Vbt2, and the low level of the gate voltage HG2 corresponds to the level of the switching voltage Vsw2. The transistor 5121H is on when the gate voltage HG2 is at high level, and is off when the gate voltage HG2 is at low level. However, if the potential difference between the nodes SW2 and BT2 is less than the gate threshold voltage of the transistor 5121H, even when the gate voltage HG2 is at high level, the transistor 5121H does not turn on. Even when the just-mentioned potential difference is equal to or greater than the gate threshold voltage of the transistor 5121H, if the potential difference is comparatively small, the transistor 5121H has an accordingly high on-resistance.

The gate driver 5122L is connected to the gate of the transistor 5121L, and drives the gate of the transistor 5121L. Specifically, the gate driver 5122L operates on, as a high potential-side supply voltage, the direct-current voltage Vrg and, as a low potential-side supply voltage, the ground. The gate driver 5122L feeds the gate of the transistor 5121L with a gate voltage LG2 commensurate with the low-side control signal S2L and thereby controls the state of the transistor 5121L. When the low-side control signal S2L is at high or low level, the gate driver 5122L keeps the gate voltage LG2 at high or low level respectively. The high level of the gate voltage LG2 corresponds to the level of the direct-current voltage Vrg, and the low level of the gate voltage LG2 corresponds to the level of the ground. The transistor 5121L is on when the gate voltage LG2 is at high level, and is off when the gate voltage LG2 is at low level.

In the step-down converter 5120, a target voltage Vtg2 is set for the output voltage Vout2. The target voltage Vtg2 has a predetermined positive direct-current voltage value (e.g., 3 V). The control circuit 5123, by producing and outputting the control signals S2H and S21 based on the feedback signal Vfb2, turns on and off the transistors 5121H and 5121L so as to keep the output voltage Vout2 equal to the target voltage Vtg2 (i.e. so as to reduce the difference between the output voltage Vout2 and the target voltage Vtg2).

When the input voltage Vinx is higher than the target voltage Vtg2, the control circuit 5123 performs step-down switching control SC2 in which it turns on and off the transistors 5121H and 5121L alternately. In the step-down switching control SC2 by the control circuit 5123, a high-output state, that is, a state where the transistor 5121H is on and the transistor 5121L is off, and a low-output state, that is, a state where the transistor 5121H is off and the transistor 5121L is on, occur alternately. Meanwhile, based on the feedback signal Vfb2, the ratio of the length of the period of the high-output state to the length of the period of the low-output state is adjusted. This adjustment is performed so as to keep the output voltage Vout2 equal to the target voltage Vtg2 (i.e., so as to reduce the difference between the output voltage Vout2 and the target voltage Vtg2. The control circuit 5123 can perform this adjustment by pulse width modulation or pulse frequency modulation based on the feedback signal Vfb2. It is here assumed that the output duty of the step-down converter 5120 is adjusted by pulse width modulation.

The step-down switching control SC2 proceeds, as is well known, as follows. In the high-output state, a current passes from the input voltage application terminal 5151 (the terminal 5151 to which the input voltage Vinx is applied) through the transistor 5121H to the inductor L2$x$, so that energy is stored in the inductor L2$x$. In the subsequent low-output state, a current based on the energy stored in the inductor L2$x$ passes through the transistor 5121L to the inductor L2$x$. In the step-down converter 5120, through repetition of the high-output and low-output states, a switching voltage with a rectangular waveform of which the potential level changes between the potential level of the input voltage Vinx and the potential level of the ground appears at the switching node SW2. This switching voltage is smoothed by the inductor L2$x$ and the capacitor Cout2 to yield a direct-current output voltage Vout2.

Figure 26B:
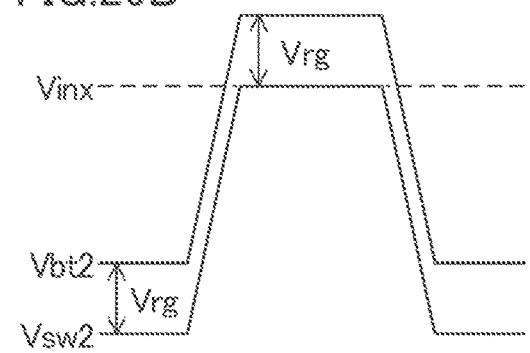

In the step-down converter 5120, the capacitor C2$x$ and the diode D2$x$ constitute a bootstrap circuit BC2, and the bootstrap circuit BC2 makes it possible to drive the gate of the transistor 5121H. Specifically, when the step-down converter 5120 performs the step-down switching control SC2, in the low-output state, in which the transistor 5121L is on (i.e., when the voltage at the switching node SW2 is substantially 0 V), the boot node BT2 is kept on the high-potential side so that the capacitor C2$x$ is charged by the direct-current voltage Vrg through the diode D2$x$; subsequently, in the high-output state, while the voltage across the capacitor C2$x$ is kept equal to the direct-current voltage Vrg, the voltage at the switching node SW2 rises substantially up to the input voltage Vinx, and this makes the boot voltage Vbt2 substantially equal to the voltage (Vrg+Vinx) (here, for the sake of convenience of description, the forward voltage across the diode D2$x$ is ignored). That is, as shown in FIG. 26B, the voltage (Vbt2−Vsw2) between the nodes BT2 and SW2 is always substantially equal to the direct-current voltage Vrg, and this enables the gate driver 5122H to turn on and off the transistor 5121H.

Figure 27B:
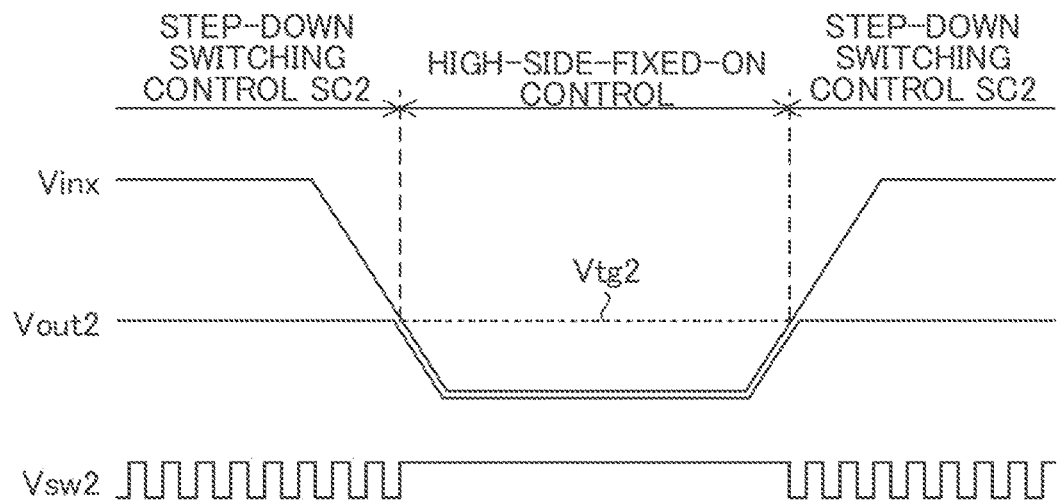

In the step-down converter 5120, basically the input voltage Vinx is higher than the target voltage Vtg2, if the input voltage Vinx is equal to or lower than the target voltage Vtg2, the control circuit 5123 performs high-side-fixed-on control. In the high-side-fixed-on control by the control circuit 5123, the control signals S2H and S2L are fixed at high and low levels respectively so that the transistors 5121H and 5121L are kept on and off respectively. For example, as shown in FIG. 27B, starting in a state where the input voltage Vinx is higher than the target voltage Vtg2 and the control circuit 5123 is performing the step-down switching control SC2, as the input voltage Vinx falls toward the target voltage Vtg2, the output duty of the step-down converter 5120 rises toward 100% (how it rises is omitted from illustration in FIG. 27B), and when the input voltage Vinx becomes equal to or lower than the target voltage Vtg2, a state is entered where the output duty is fixed at 100%. The control here that keeps the output duty fixed at 100% corresponds to the high-side-fixed-on control. When thereafter the input voltage Vinx rises until it becomes higher than the target voltage Vtg2, the step-down switching control SC2 is restarted.

Figure 28:
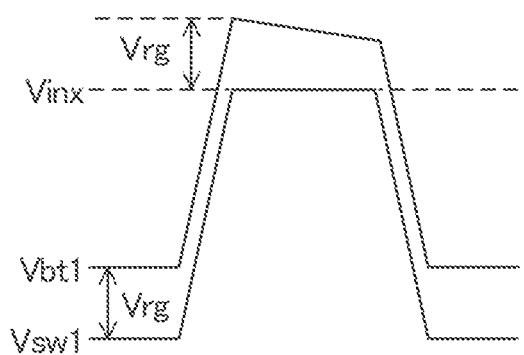
FIG. 28 is a diagram showing an actual relationship among an input voltage, a boot voltage, and a switching voltage in the eighth embodiment according to the present invention.

Switch Circuit 5130:

With attention paid to the step-down converter 5110, ideally, as mentioned previously (see FIG. 26A), the boot voltage Vbt1 is higher than the switching voltage Vsw1 by the internal supply voltage Vreg, in reality, as shown in FIG. 28, while the transistor 5111H is on, due to a current that passes through the high-side driver 5112H (which is the current consumed by the driver 5112H and passes from the boot node BT1 through the driver 5112H to the switching node SW1), the boot voltage Vbt1 falls as time passes.

If, for the sake of discussion, the step-down converter 5110 performs the step-down switching control SC1 continuously at a sufficiently high switching frequency, before the boot voltage Vbt1 falls so far that the high-side transistor 5111H can no longer be kept on, the low-side transistor 5111L turns on, and the capacitor C1x can be charged again. Thus, no problem arises.

However, in a virtual power supply circuit (not shown) that would result from omitting the switch circuit 5130 from the power supply circuit 5100 in FIG. 25, when, due to the input voltage Vinx being equal to or lower than the target voltage Vtg1, the control signal S1H is kept at high level, even when the control signal S1H is at high level, the boot voltage Vbt1 falls so far that the high-side transistor 5111H can no longer be kept on, with the result that the output voltage Vout1 becomes greatly deviated from the target voltage Vtg1. While the behavior of the virtual power supply circuit has been described with attention paid to the step-down converter 5110, a similar description applies to the step-down converter 5120.

In the power supply circuit 5100 according to this embodiment, owing to the function of the switch circuit 5130, the driving voltages for turning on and off the high-side transistors 5111H and 5121H are secured in the following manner.

Figure 29:
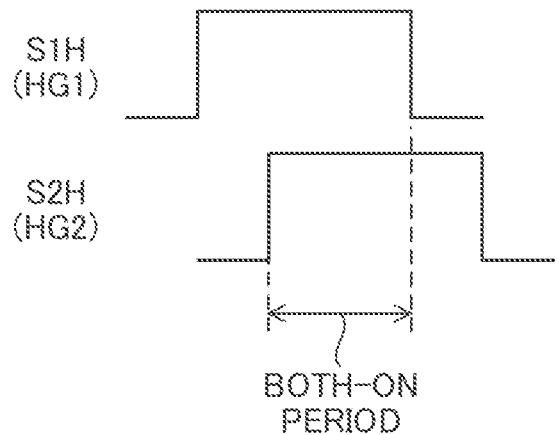
FIG. 29 is a diagram illustrating a both-on period in the eighth embodiment of the present invention.

The switch circuit 5130 is provided between the boot nodes BT1 and BT2. During the both-on period in which the high-side transistors 5111H and 5121H are both on, the switch circuit 5130 keeps the path between the boot nodes BT1 and BT2 conducting, and for the rest of the time, the switch circuit 5130 keeps the path between the boot nodes BT1 and BT2 non-conducting. The timing with which the path between the boot nodes BT1 and BT2 is made to conduct is controlled by the control circuits 5113 and 5123. For the purpose of this control, the high-side control signals S1H and S2H or signals based on them (for example, the gate voltages HG1 and HG2) can be fed to the switch circuit 5130. As shown in FIG. 29, the period in which the high-side control signals S1H and S2H are both at high level and the period in which the gate voltages HG1 and HG2 are both at high level correspond to the both-on period in which the high-side transistors 5111H and 5121H are both on. It is also possible to adopt a configuration where the path between the boot nodes BT1 and BT2 is kept conducting during the entire both-on period or a configuration where the path between the boot nodes BT1 and BT2 is kept conducting only during part of the both-on period.

FIG. 25 shows an example where the switch circuit 5130 is composed of switches Q1 and Q2 that are connected in series with each other. The switch Q1 can be a switch that is on or off when the high-side control signal S1H or the gate voltage HG1 is at high or low level respectively (i.e., when the transistor 5111H is on or off respectively), and the switch Q2 can be a switch that is on or off when the high-side control signal S2H or the gate voltage HG2 is at high or low level respectively (i.e., when the transistor 5112H is on or off respectively). Then only in the period in which the high-side control signals S1H and S2H are both at high level or in the period in which the gate voltages HG1 and HG2 are both at high level (i.e., only in the period in which the high-side transistors 5111H and 5121H are both on) does the path between the boot nodes BT1 and BT2 conduct through the switches Q1 and Q2.

FIG. 30 shows the relationship between the voltage waveforms at relevant points in the power supply circuit 5100 and the states of the switches Q1 and Q2 as observed in one case CS1. In the case CS1, because Vinx>Vtg1 and Vinx>Vtg2, the step-down converters 5110 and 5120 both perform switching control (the step-down switching control SC1 and SC2). The operation of the step-down converter 5110 to produce the output voltage Vout1 from the input voltage Vinx and the operation of the step-down converter 5120 to produce the output voltage Vout2 from the input voltage Vinx are independent of each other, and thus when a both-on period occurs is indefinite. If, as shown in FIG. 30, there occurs no period in which the high-side transistors 5111H and 5121H are simultaneously on, no current passes through the switch circuit 5130, and the power supply circuit 5100 is equivalent to the virtual power supply circuit mentioned above. Even so, so long as the step-down converters are both performing switching control, the bootstrap capacitors (C1x and C2x) are charged every switching event, and thus no problem arises. Even if there occurs a period in which the high-side transistors 5111H and 5121H are simultaneously on, the potentials at the boot nodes BT1 and BT2 are expected to be substantially equal, and thus no particular problem occurs.

Figure 31:
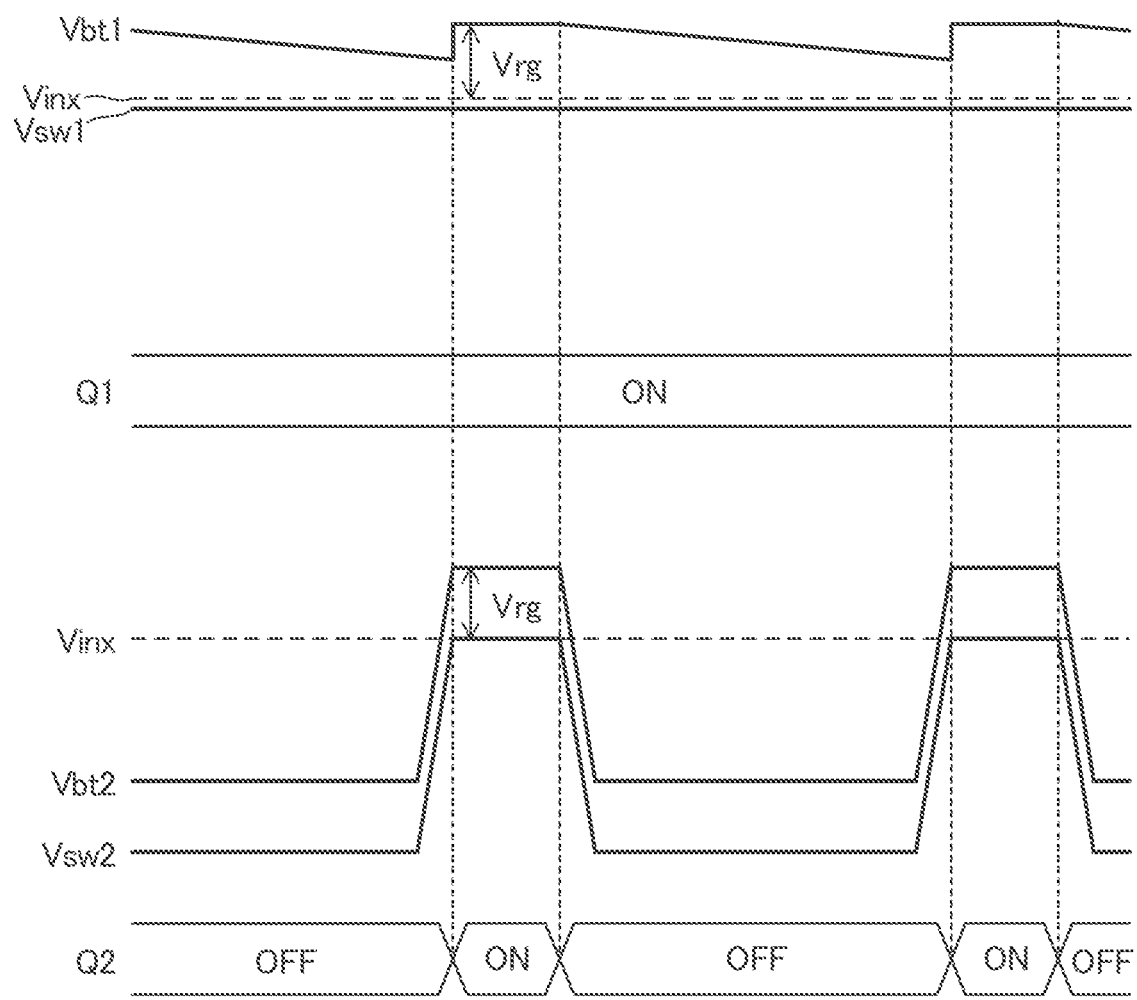
FIG. 31 is a diagram showing a relationship among a plurality of voltages and the states of switches in a switch circuit with respect to two step-down converters in the eighth embodiment of the present invention (case CS2)

FIG. 31 shows the relationship between the voltage waveforms at relevant points in the power supply circuit 5100 and the states of the switches Q1 and Q2 as observed in another case CS2. In the case CS2, because Vinx<Vtg1, the step-down converter 5110 performs the high-side-fixed-on control (see FIG. 27A). On the other hand, because Vinx>Vtg2, the step-down converter 5120 performs the step-down switching control SC2 (see FIG. 27B). Here, the bootstrap circuit BC1 in the step-down converter 5110 does not function, and thus if the switch Q2 is off, due to the circuit current in the gate driver 5112H, the boot voltage Vbt1 falls gradually. Even so, the switch Q1 is kept on all the time, and thus when the switch Q2 is turned on, the path between the nodes BT1 and BT2 conducts to allow transfer of electric charge. The switch Q2 is on during the period in which the high-side transistor 5121H is on, that is, during the period in which Vbt2=Vinx+Vrg; thus, every time the switch Q2 turns on, the boot voltage Vbt1 is raised up to the level of Vinx+Vrg and is kept generally at the level of Vinx+Vrg (here, the forward voltage across the diode D2x is ignored). In this way, in the case CS2, the step-down converter 5110 can keep the high-side transistor 5111H on.

Though not specifically illustrated, similar operation takes place in yet another case CS3 where, because Vinx>Vtg1, the step-down converter 5110 performs the step-down switching control SC1 (see FIG. 27A) while, because Vinx<Vtg2, the step-down converter 5120 per forms the high-side-fixed-on control (see FIG. 27B).

Figure 32:
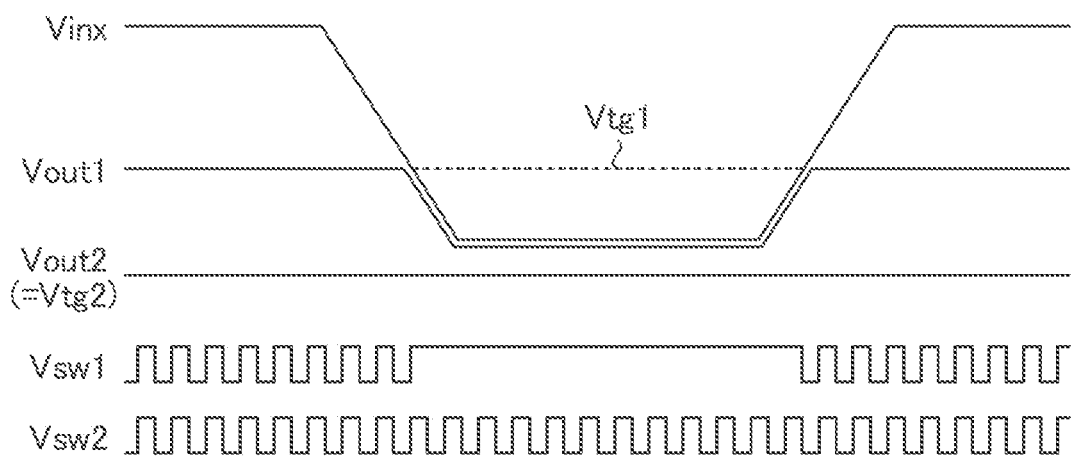
FIG. 32 is a diagram showing the waveforms of a plurality of voltages with respect to two step-down converters in the eighth embodiment of the present invention.

The above-described operation using the switch circuit 5130 is in effect in a case where one of the step-down converters 5110 and 5120 performs step-down switching control all the time. Accordingly, in a case where, as shown in FIG. 32, due to variation of the input voltage Vinx, the input voltage Vinx can become higher or lower than the target voltage Vtg1 of the step-down converter 5110, it is preferable that the target voltage Vtg2 of the step-down converter 5120 be set at a voltage lower than the lower limit of the variation range of the input voltage Vinx so that the step-down converter 5120 performs the step-down switching control SC2 all the time. The same applies to a case where the relationship between the target voltages Vtg1 and Vtg2 with respect to the input voltage Vinx is reversed.

It is also possible to adopt, instead, a method MT1 where an upper limit of less than 100% is set on the duty at which the high-side transistor 5111H is on (i.e., the output duty of the step-down converter 5110) so that the step-down converter 5110 performs the step-down switching control SC1 all the time, or a method MT2 where an upper limit of less than 100% is set on the duty at which the high-side transistor 5121H is on (i.e., the output duty of the step-down converter 5120) so that the step-down converter 5120 performs the step-down switching control SC2 all the time. The method MT1 or MT2 can be adopted not only in a case where, due to variation of the input voltage Vinx, the input voltage Vinx can become higher or lower than the target voltage Vtg1 of the step-down converter 5110 but also in any other case.

For the sake of concrete description, an additional description will be given with focus on, out of the method MT1 and MT2, the method MT2. In FIG. 27B, it is assumed that the step-down converter 5120 can perform the high-side-fixed-on control; however, when the method MT2 is adopted, even when the input voltage Vinx becomes equal to or lower than the target voltage Vtg2, the step-down converter 5120 does not perform the high-side-fixed-on control but performs the step-down switching control SC2. Thus, while the control circuit 5123 adjusts the output duty of the step-down converter 5120 based on the feedback signal Vfb2, when the method MT2 described above is adopted, an upper limit duty less than 100% (e.g., 90%) is set on the output duty of the step-down converter 5120, and thus even when the input voltage Vinx becomes equal to or lower than the target voltage Vtg2, a rise in the output duty of the step-down converter 5120 is limited not to go beyond the upper limit duty (e.g., 90%. Consequently, even though the output voltage Vout2 of the step-down converter 5120 becomes lower than the input voltage Vinx, it is ensured that the step-down switching control SC2 is performed all the time. For example, in a case where the input voltage Vinx can vary between 10V and 4V, if the target voltages Vtg1 and Vtg2 are assumed to be 7V and 5V respectively, when Vinx=4V, while the step-down converter 5110 performs the high-side-fixed-on control, the output duty of the step-down converter 5120 is raised up to the upper-limit duty (e.g., 90%) and is fixed there, so that, while the output voltage Vout1 is generally equal to the input voltage Vinx, the output voltage Vout2 is around the input voltage Vinx multiplied by the upper-limit duty.

Modified Bootstrap Circuit:

The bootstrap circuits BC1 and BC2 can each be modified such that the bootstrap diode (D1x or D2x) is replaced with a bootstrap switch. In that case, the bootstrap switch in the modified bootstrap circuit BC1 is kept off in the high-output state of the step-down converter 5110, and is kept on in the low-output state of the step-down converter 5110. Likewise, the bootstrap switch in the modified bootstrap circuit BC2 is kept off in the high-output state of the step-down converter 5120, and is kept on in the low-output state of the step-down converter 5120.

Figure 33A:
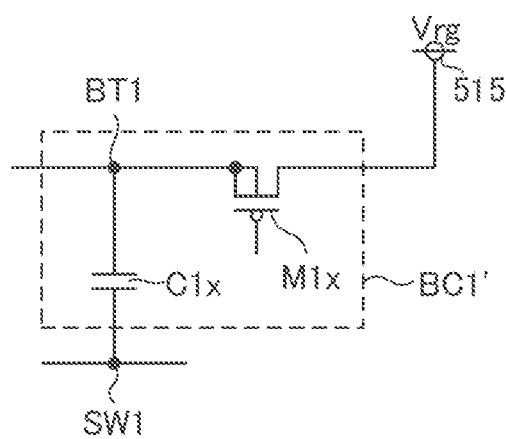
FIGS. 33A and 33B are diagrams showing modified configurations of a bootstrap circuit in the eighth embodiment of the present invention.

Specifically, the bootstrap circuit BC1 can be modified to a bootstrap circuit BC1' as shown in FIG. 33A. The bootstrap circuit BC1' includes a bootstrap capacitor C1x connected between the nodes BT1 and SW1 and a bootstrap transistor M1x as a bootstrap switch. The transistor M1x is configured as a P-channel MOSFET. The drain of the transistor M1x is connected to the direct-current voltage application terminal 5152 (the terminal 5152 to which the direct-current voltage Vrg is applied), and the source of the transistor M1x is connected to the node BT1. Here, a circuit (not shown; it can be the control circuit 5113) that keeps the transistor M1x off in the high-output state of the step-down converter 5110 and that keeps the transistor M1x on in the low-output state of the step-down converter 5110 can be included in the step-down converter 5110.

Figure 33B:
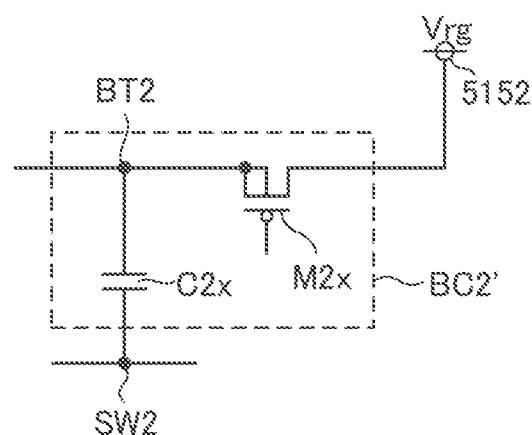

Likewise, the bootstrap circuit BC2 can be modified to a bootstrap circuit BC2' as shown in FIG. 33B. The bootstrap circuit BC2' includes a bootstrap capacitor C2x connected between the nodes BT2 and SW2 and a bootstrap transistor M2x as a bootstrap switch. The transistor M2x is configured as a P-channel MOSFET. The drain of the transistor M2x is connected to the direct-current voltage application terminal 5152 (the terminal 5152 to which the direct-current voltage Vrg is applied), and the source of the transistor M2x is connected to the node BT2. Here, a circuit (not shown, it can be the control circuit 5123) that keeps the transistor M2x off in the high-output state of the step-down converter 5120 and that keeps the transistor M2x on in the low-output state of the step-down converter 5120 can be included in the step-down converter 5120.

The bootstrap diode (D1x, D2x) and the bootstrap switch (M1x, M2x) functions as a charging element for charging the bootstrap capacitor (C1x, C2x). Using a bootstrap switch as a charging element, compared with using a bootstrap diode, helps raise the potential at the boot node (BT1, BT2) by the forward voltage across the bootstrap diode, and helps reduce the power loss that occurs when a current is passed in the charging element.

Ninth Embodiment

Figure 34:
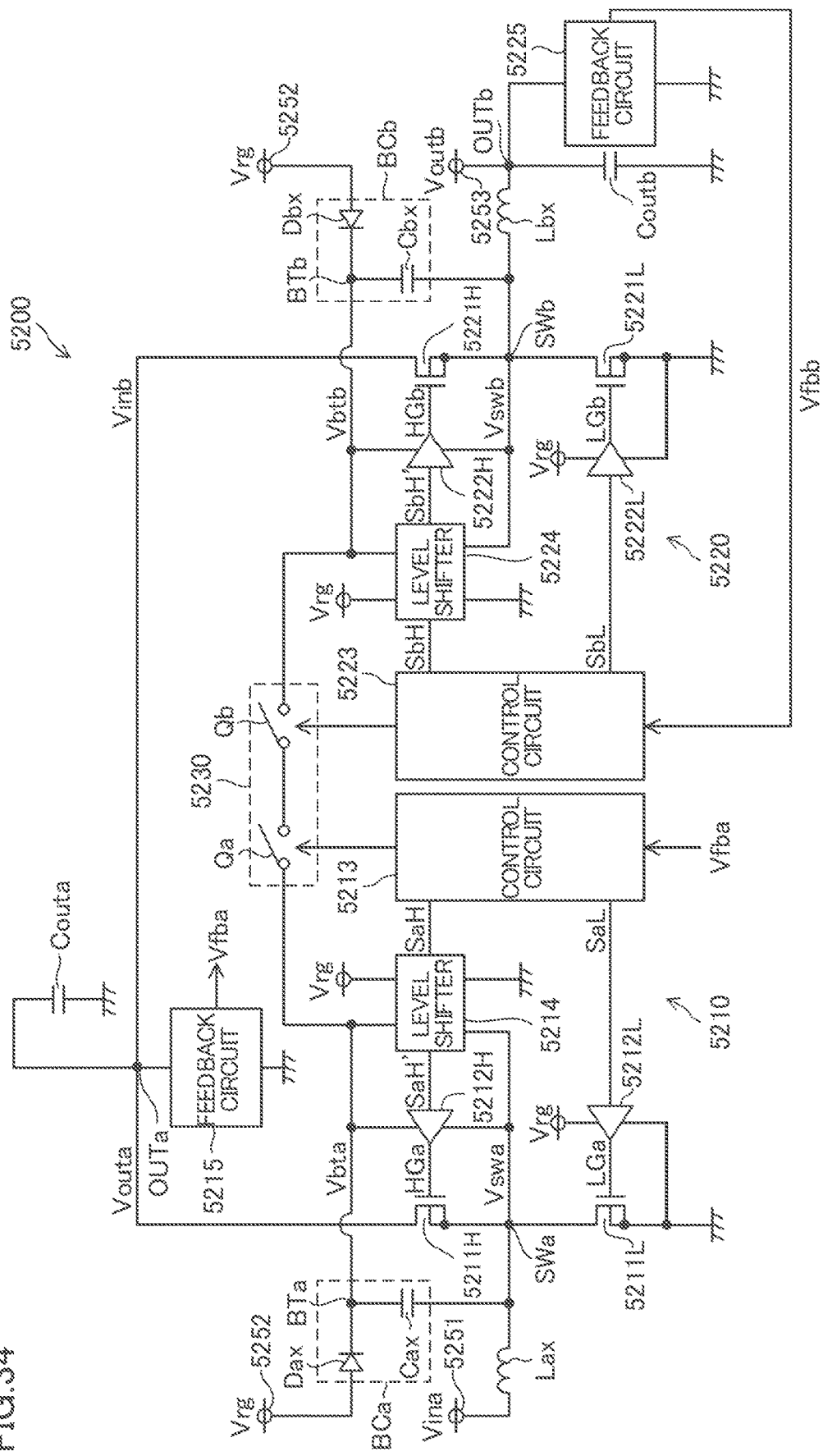
FIG. 34 is a configuration diagram of a power supply circuit according to a ninth embodiment of the present invention.

A ninth embodiment of the present invention will be described. FIG. 34 is an overall configuration diagram of a power supply circuit 5200 according to the ninth embodiment of the present invention. The power supply circuit 5200 includes a step-up converter 5210, a step-down converter 5220 and a switch circuit 5230. The step-up converter 5210 is a step-up DC-DC converter that produces from a predetermined input voltage Vina an output voltage Vouta, and the step-down converter 5220 is a step-down DC-DC converter that receives the output voltage Vouta as an input voltage Vinb and that produces from the input voltage Vinb an output voltage Voutb. The input voltages Vina and Vinb and the output voltages Vouta and Voutb are each a positive direct-current voltage.

Step-Up Converter 5210:

First, the step-up converter 5210 will be described. The step-up converter 5210 includes a high-side transistor 5211H, a low-side transistor 5211L, a high-side driver 5212H, a low-side driver 5212L, a control circuit 5213, a level shifter 5214, a feedback circuit 5215, a bootstrap diode Dax, a bootstrap capacitor Cax, an inductor Lax, and an output capacitor Couta. The transistors 5211H and 5211L are configured as N-channel MOSFETs (metal-oxide-semiconductor field effect transistors).

The drain of the transistor 5211H is connected to an output node OUTa to which the output voltage Vouta is applied. The source of the transistor 5211H and the drain of the transistor 5211L are connected together at a switching node SWa. The source of the transistor 5211L is connected to a ground. Thus, the output voltage Vouta is applied to the series circuit composed of the transistors 5211H and 5211L.

One end of the capacitor Cax is connected to a switching node SWa, and the other end of the capacitor Cax is connected to a boot node BTa. The anode of the diode Dax is connected to a terminal 5252 to which a predetermined positive direct-current voltage Vrg is applied, and the cathode of the diode Dax is connected to the boot node BTa. One end of the inductor Lax is connected to a terminal 5251 (input voltage application terminal) to which the input voltage Vina is applied, and the other end of the inductor Lax is connected to the switching node SWa. The capacitor Couta is provided between the output node OUTa and the ground. The output voltage Vouta appears at the output node OUTa. The output node OUTa is connected also to the feedback circuit 5215. The feedback circuit 5215 feeds the control circuit 5213 with a feedback signal Vfba commensurate with the output voltage Vouta. For example, the feedback circuit 5215 has a plurality of voltage division resistors, and yields as the feedback signal Vfba a signal that results from the output voltage Vouta being divided by the plurality of voltage division resistors.

Based on the feedback signal Vfba, the control circuit 5213 produces and outputs a high-side control signal SaH for the high-side driver 5212H and a low-side control signal SaL for the low-side driver 5212L. The control signals SaH and SaL are each a digital signal that takes either high or low level. With both control signals SaH and SaL, their high level corresponds to the potential level of the direct-current voltage Vrg, and their low level corresponds to the potential level of the ground. To the level shifter 5214 are connected the terminal to which the direct-current voltage Vrg is applied and the ground as well as the nodes BTa and SWa. Based on the direct-current voltage Vrg fed to it and the voltage between the nodes BTa and SWa, the level shifter 5214 shifts the level of the control signal SaH to produce a shifted high-side control signal SaH'. The high-side control signal SaH' too is, like the high-side control signal SaH, a digital signal that takes either high or low level. However, the high level of the high-side control signal SaH' corresponds to the potential level at the boot node BTa, and the low level of the high-side control signal SaH' corresponds to the potential level at the switching node SWa. When the control signal SaH is at high or low level, the control signal SaH' too is at high or low level respectively. In the following description, the voltage appearing at the boot node BTa is occasionally referred to as the boot voltage Vbta, and the voltage appearing at the switching node SWa is occasionally referred to as the switching voltage Vswa.

The gate driver 5212H is connected to the gate of the transistor 5211H, and drives the gate of the transistor 5211H. Specifically, the gate driver 5212H operates on, as a high potential-side supply voltage, the boot voltage Vbta and, as a low potential-side supply voltage, the switching voltage Vswa. The gate driver 5212H feeds the gate of the transistor 5211H with a gate voltage HGa commensurate with the high-side control signal SaH' and thereby controls the state of the transistor 5211H. When the high-side control signal SaH' is at high or low level, the gate driver 5212H keeps the gate voltage HGa at high or low level respectively. The high level of the gate voltage HGa corresponds to the level of the boot voltage Vbta, and the low level of the gate voltage HGa corresponds to the level of the switching voltage Vswa. The transistor 5211H is on when the gate voltage HGa is at high level, and is off when the gate voltage HGa is at low level. However, if the potential difference between the nodes SWa and BTa is less than the gate threshold voltage of the transistor 5211H, even when the gate voltage HGa is at high level, the transistor 5211H does not turn on. Even when the just-mentioned potential difference is equal to or greater than the gate threshold voltage of the transistor 5211H, if the potential difference is comparatively small, the transistor 5211H has an accordingly high on-resistance.

The gate driver 5212L is connected to the gate of the transistor 5211L, and drives the gate of the transistor 5211L. Specifically, the gate driver 5212L operates on, as a high potential-side supply voltage, the direct-current voltage Vrg and, as a low potential-side supply voltage, the ground. The gate driver 5212L feeds the gate of the transistor 5211L with a gate voltage LGa commensurate with the low-side control signal SaL and thereby controls the state of the transistor 5211L. When the low-side control signal SaL is at high or low level, the gate driver 5212L keeps the gate voltage LGa at high or low level respectively. The high level of the gate voltage LGa corresponds to the level of the direct-current voltage Vrg, and the low level of the gate voltage LGa corresponds to the level of the ground. The transistor 5211L is on when the gate voltage LGa is at high level, and is off when the gate voltage LGa is at low level.

In the step-up converter 5210, a target voltage Vtga is set for the output voltage Vouta. The target voltage Vtga has a predetermined positive direct-current voltage value (e.g., 8.5 V). The control circuit 5213, by producing and outputting the control signals SaH and SaL based on the feedback signal Vfba, turns on and off the transistors 5211H and 5211L so as to keep the output voltage Vouta equal to the target voltage Vtga (i.e. so as to reduce the difference between the output voltage Vouta and the target voltage Vtga).

When the input voltage Vina is lower than the target voltage Vtga, the control circuit 5213 performs step-up switching control SC3 in which it turns on and off the transistors 5211H and 5211L alternately. In the step-up switching control SC3 by the control circuit 5213, a high-output state, that is, a state where the transistor 5211H is on and the transistor 5211L is off, and a low-output state, that is, a state where the transistor 5211H is off and the transistor 5211L is on, occur alternately. Meanwhile, based on the feedback signal Vfba, the ratio of the length of the period of the high-output state to the length of the period of the low-output state is adjusted. This adjustment is performed so as to keep the output voltage Vouta equal to the target voltage Vtga (i.e., so as to reduce the difference between the output voltage Vouta and the target voltage Vtga). The control circuit 5213 can perform this adjustment by pulse width modulation or pulse frequency modulation based on the feedback signal Vfba. It is here assumed that the output duty of the step-up converter 5210 is adjusted by pulse width modulation.

The step-up switching control SC3 proceeds, as is well known, as follows. In the low-output state, a current passes from the input voltage application terminal 5251 (the terminal 5251 to which the input voltage Vina is applied) through the inductor Lax and the transistor 5211L so that energy is stored in the inductor Lax. In the subsequent high-output state, a current based on the energy stored in the inductor Lax passes through the transistor 5211H toward the output node OUTa. Electric charge attributable to this current is stored in the output capacitor Couta. and this produces the output voltage Vouta.

Figure 35A:
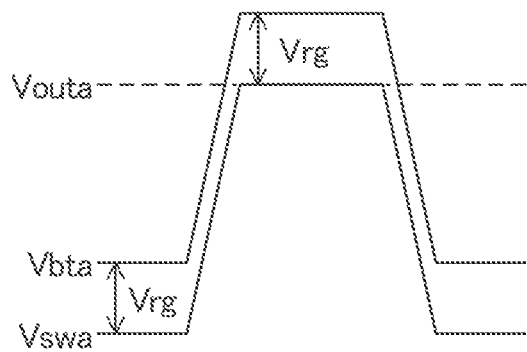
FIGS. 35A and 35B are diagrams showing an ideal relationship among an output voltage or input voltage, a boot voltage, and a switching voltage in the ninth embodiment of the present invention.

In the step-up converter 5210, the capacitor Cax and the diode Dax constitute a bootstrap circuit BCa, and the bootstrap circuit BCa makes it possible to drive the gate of the transistor 5211H. Specifically, when the step-up converter 5210 performs the step-up switching control SC3, in the low-output state, in which the transistor 5211L is on (i.e., when the voltage at the switching node SWa is substantially 0 V), the boot node BTa is kept on the high-potential side so that the capacitor Cax is charged by the direct-current voltage Vrg through the diode Dax; subsequently, in the high-output state, while the voltage across the capacitor Cax is kept equal to the direct-current voltage Vrg, the voltage at the switching node SWa rises substantially up to the output voltage Vouta, and this makes the boot voltage Vbta substantially equal to the voltage (Vrg+Vouta) (here, for the sake of convenience of description, the forward voltage across the diode Dax is ignored). That is, as shown in FIG. 35A, the voltage (Vbta−Vswa) between the nodes BTa and SWa is always substantially equal to the direct-current voltage Vrg, and this enables the gate driver 5212H to turn on and off the transistor 5211H.

Figure 36:
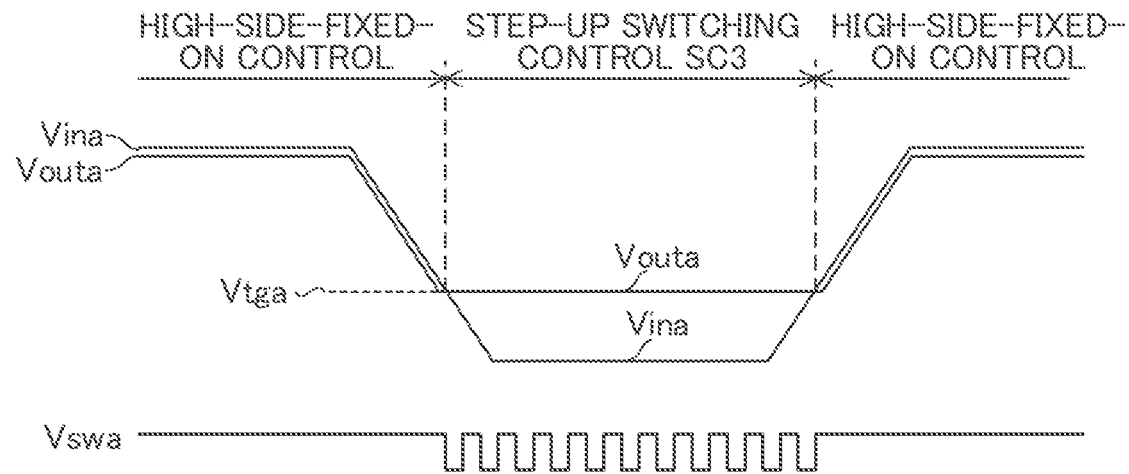
FIG. 36 is a diagram illustrating step-up switching control and high-side-fixed-on control in the ninth embodiment of the present invention.

The step-up converter 5210 performs its designed function, that is, the voltage stepping-up function, when the input voltage Vina is lower than the target voltage Vtga. However, the input voltage Vina can become equal to or higher than the target voltage Vtga, in which case the control circuit 5213 performs high-side-fixed-on control. In the high-side-fixed-on control by the control circuit 5213, the control signals SaH and SaL are fixed at high and low levels respectively so that the transistors 5211H and 5211L are kept on and off respectively. FIG. 36 shows the relationship between the relevant voltages in the step-up converter 5210 and the control performed. For the sake of simple illustration, in FIG. 36, how the output duty is modulated and how the amplitude of the switching voltage Vswa varies are omitted from illustration.

Step-Down Converter 5220:

Next, the step-down converter 5220 will be described. The only differences between the step-down converter 5220 and the step-down converter 5120 in FIG. 25 are the reference signs assigned, and the step-down converter 5220 is equivalent to the step-down converter 5120 in FIG. 25. Even so, the step-down converter 5220 will be described in detail below with the aim to make clear its relationship with the step-up converter 5210. The step-down converter 5220 includes a high-side transistor 5221H, a low-side transistor 5221L, a high-side driver 5222H, a low-side driver 5222L, a control circuit 5223, a level shifter 5224, a feedback circuit 5225, a bootstrap diode Dbx, a bootstrap capacitor Cbx, an inductor Lbx, and an output capacitor Coutb. The transistors 5221H and 5221L are configured as N-channel MOSFETs (metal-oxide-semiconductor field effect transistors).

The drain of the transistor 5221H is connected to the output node OUTa of the step-up converter 5210. That is, the drain of the transistor 5221H is fed with, as the input voltage Vinb, the output voltage Vouta of the step-up converter 5210. The source of the transistor 5221H and the drain of the transistor 5221L are connected together at a switching node SWb. The source of the transistor 5221L is connected to a ground. Thus, the input voltage Vinb is applied to the series circuit composed of the transistors 5221H and 5221L.

One end of the capacitor Cbx is connected to the switching node SWb, and the other end of the capacitor Cbx is connected to a boot node BTb. The anode of the diode Dbx is connected to a terminal 5252 to which a predetermined positive direct-current voltage Vrg is applied, and the cathode of the diode Dbx is connected to the boot node BTb. One end of the inductor Lbx is connected to the switching node SWb, and the other end of the inductor Lbx is connected to an output node OUTb. The capacitor Coutb is provided between the output node OUTb and the ground. An output voltage Voutb appears at the output node OUTb. The output node OUTb is connected to a terminal 5253 (output voltage application terminal) at which the output voltage Voutb is supposed to appear (the two terminals can be understood to be the same). The output node OUTb is connected also to the feedback circuit 5225. The feedback circuit 5225 feeds the control circuit 5223 with a feedback signal Vfbb commensurate with the output voltage Voutb. For example, the feedback circuit 5225 has a plurality of voltage division resistors, and yields as the feedback signal Vfbb a signal that results from the output voltage Voutb being divided by the plurality of voltage division resistors.

Based on the feedback signal Vfbb, the control circuit 5223 produces and outputs a high-side control signal SbH for the high-side driver 5222H and a low-side control signal SbL for the low-side driver 5222L. The control signals SbH and SbL are each a digital signal that takes either high or low level. With both control signals SbH and SbL, their high level corresponds to the potential level of the direct-current voltage Vrg, and their low level corresponds to the potential level of the ground. To the level shifter 5224 are connected the terminal to which the direct-current voltage Vrg is applied and the ground as well as the nodes BTb and SWb. Based on the direct-current voltage Vrg fed to it and the voltage between the nodes BTb and SWb, the level shifter 5224 shifts the level of the control signal SbH to produce a shifted high-side control signal SbH'. The high-side control signal SbH' too is, like the high-side control signal SbH, a digital signal that takes either high or low level. However, the high level of the high-side control signal SbH' corresponds to the potential level at the boot node BTb, and the low level of the high-side control signal SbH' corresponds to the potential level at the switching node SWb. When the control signal SbH is at high or low level, the control signal SbH' too is at high or low level respectively. In the following description, the voltage appearing at the boot node BTb is occasionally referred to as the boot voltage Vbtb, and the voltage appearing at the switching node SWb is occasionally referred to as the switching voltage Vswb.

The gate driver 5222H is connected to the gate of the transistor 5221H, and drives the gate of the transistor 5221H. Specifically, the gate driver 5222H operates on, as a high potential-side supply voltage, the boot voltage Vbtb and, as a low potential-side supply voltage, the switching voltage Vswb. The gate driver 5222H feeds the gate of the transistor 5221H with a gate voltage HGb commensurate with the high-side control signal SbH' and thereby controls the state of the transistor 5221H. When the high-side control signal SbH' is at high or low level, the gate driver 5222H keeps the gate voltage HGb at high or low level respectively. The high level of the gate voltage HGb corresponds to the level of the boot voltage Vbtb, and the low level of the gate voltage HGb corresponds to the level of the switching voltage Vswb. The transistor 5221H is on when the gate voltage HGb is at high level, and is off when the gate voltage HGb is at low level. However, if the potential difference between the nodes SWb and BTb is less than the gate threshold voltage of the transistor 5221H, even when the gate voltage HGb is at high level, the transistor 5221H does not turn on. Even when the just-mentioned potential difference is equal to or greater than the gate threshold voltage of the transistor 5221H, if the potential difference is comparatively small, the transistor 5221H has an accordingly high on-resistance.

The gate driver 5222L is connected to the gate of the transistor 5221L, and drives the gate of the transistor 5221L. Specifically, the gate driver 5222L operates on, as a high potential-side supply voltage, the direct-current voltage Vrg and, as a low potential-side supply voltage, the ground. The gate driver 5222L feeds the gate of the transistor 5221L, with a gate voltage LGb commensurate with the low-side control signal SbL and thereby controls the state of the transistor 5221L. When the low-side control signal SbL is at high or low level, the gate driver 5222L keeps the gate voltage LGb at high or low level respectively. The high level of the gate voltage LGb corresponds to the level of the direct-current voltage Vrg, and the low level of the gate voltage LGb corresponds to the level of the ground. The transistor 5221L is on when the gate voltage LGb is at high level, and is off when the gate voltage LGb is at low level.

In the step-down converter 5220, a target voltage Vtgb is set for the output voltage Voutb. The target voltage Vtgb has a predetermined positive direct-current voltage value (e.g., 5 V). The control circuit 5223, by producing and outputting the control signals SbH and SbL based on the feedback signal Vfbb, turns on and off the transistors 5221H and 5221L so as to keep the output voltage Voutb equal to the target voltage Vtgb (i.e. so as to reduce the difference between the output voltage Voutb and the target voltage Vtgb).

When the input voltage Vinb is higher than the target voltage Vtgb, the control circuit 5223 performs step-down switching control SC4 in which it turns on and off the transistors 5221H and 5221L alternately. In the step-down switching control SC4 by the control circuit 5223, a high-output state, that is, a state where the transistor 5221H is on and the transistor 5221L is off, and a low-output state, that is, a state where the transistor 52211H is off and the transistor 5221L is on, occur alternately. Meanwhile, based on the feedback signal Vfbb, the ratio of the length of the period of the high-output state to the length of the period of the low-output state is adjusted. This adjustment is performed so as to keep the output voltage Voutb equal to the target voltage Vtgb (i.e., so as to reduce the difference between the output voltage Voutb and the target voltage Vtgb). The control circuit 5223 can perform this adjustment by pulse width modulation or pulse frequency modulation based on the feedback signal Vfbb. It is here assumed that the output duty of the step-down converter 5220 is adjusted by pulse width modulation.

The step-down switching control SC4 proceeds, as is well known, as follows. In the high-output state, a current passes from the input voltage application node (the node to which the input voltage Vinb is applied; the output node OUTa) through the transistor 5221H to the inductor Lbx, so that energy is stored in the inductor Lbx. In the subsequent low-output state, a current based on the energy stored in the inductor Lbx passes through the transistor 5221L, to the inductor Lbx. In the step-down converter 5220, through repetition of the high-output and low-output states, a switching voltage with a rectangular waveform of which the potential level changes between the potential level of the input voltage Vinb and the potential level of the ground appears at the switching node SWb. This switching voltage is smoothed by the inductor Lbx and the capacitor Coutb to yield a direct-current output voltage Voutb.

Figure 35B:
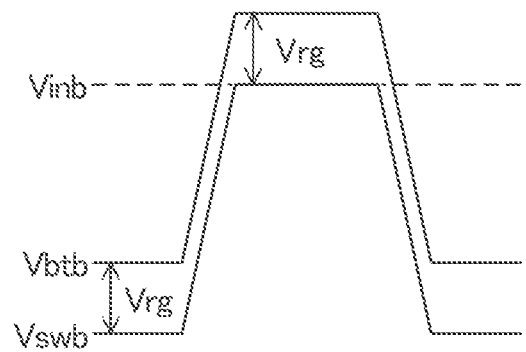

In the step-down converter 5220, the capacitor Cbx and the diode Dbx constitute a bootstrap circuit BCb, and the bootstrap circuit BCb makes it possible to drive the gate of the transistor 5221H. Specifically, when the step-down converter 5220 performs the step-down switching control SC4, in the low-output state, in which the transistor 5221L, is on (i.e., when the voltage at the switching node SWb is substantially 0 V), the boot node BTb is kept on the high-potential side so that the capacitor Cbx is charged by the direct-current voltage Vrg through the diode Dbx; subsequently, in the high-output state, while the voltage across the capacitor Cbx is kept equal to the direct-current voltage Vrg, the voltage at the switching node SWb rises substantially up to the input voltage Vinb, and this makes the boot voltage Vbtb substantially equal to the voltage (Vrg+Vinb) (here, for the sake of convenience of description, the forward voltage across the diode Dbx is ignored). That is, as shown in FIG. 35B, the voltage (Vbtb−Vswb) between the nodes BTb and SWb is always substantially equal to the direct-current voltage Vrg, and this enables the driver 5222H to turn on and off the transistor 5221H.

In the step-down converter 5220, basically the input voltage Vinb is not supposed to become lower than the target voltage Vtgb. However, if the input voltage Vinb is equal to or lower than the target voltage Vtgb, the control circuit 5223 can perform high-side-fixed-on control. In the high-side-fixed-on control by the control circuit 5223, the control signals SbH and SbL are fixed at high and low levels respectively so that the transistors 5221H and 5221L are kept on and off respectively.

Figure 37:
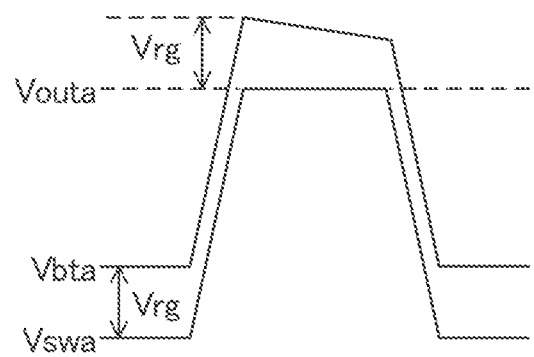
FIG. 37 is a diagram showing an actual relationship among an output voltage, a boot voltage, and a switching voltage in the ninth embodiment of the present invention.

Switch Circuit 5230:

With respect to the step-up converter 5210, ideally, as mentioned previously (see FIG. 35A), the hoot voltage Vbta is higher than the switching voltage Vswa by the internal supply voltage Vreg; in reality, as shown in FIG. 37, while the high-side transistor 5211H is on, due to a current that passes through the high-side driver 5212H (which is the current consumed by the high-side driver 5212H and passes from the boot node BTb through the high-side driver 5212H to the switching node SWa), the voltage at the boot node BTa falls as time passes.

If, for the sake of discussion, the step-up converter 5210 performs the step-up switching control SC3 continuously at a sufficiently high switching frequency, before the boot voltage Vbta falls so far that the transistor 5211H can no longer be kept on, the transistor 5211L turns on, and the capacitor Cax can be charged again. Thus, no problem arises.

However, in a virtual power supply circuit (not shown) that would result from omitting the switch circuit 5230 from the power supply circuit 5200 in FIG. 34, when, due to the input voltage Vinb being equal to or higher than the target voltage Vtga, the control signal SaH is kept at high level, even when the control signal SaH is at high level, the boot voltage Vbta falls so far that the high-side transistor 5211H can no longer be kept on. Consequently, the current passing through the high-side transistor 5211H passes through its body diode, with the result that the output voltage Vouta becomes a voltage lower than the input voltage Vina by the forward voltage across the body diode. Moreover, the voltage drop across the high-side transistor 5211H causes power loss.

In the power supply circuit 5200 according to this embodiment, owing to the function of the switch circuit 5230, the driving voltage for controlling the high-side transistor 5211H is secured in the following manner.

Figure 38:
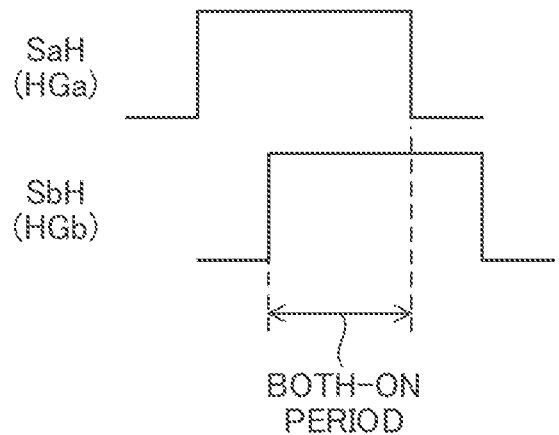
FIG. 38 is a diagram illustrating a both-on period in the ninth embodiment of the present invention.

The switch circuit 5230 is provided between the boot nodes BTa and BTb. During the both-on period in which the high-side transistors 5211H and 5221H are both on, the switch circuit 5230 keeps the path between the boot nodes BTa and BTb conducting, and for the rest of the time, the switch circuit 5230 keeps the path between the boot nodes BTa and BTb non-conducting. The timing with which the path between the boot nodes BTa and BTb is made to conduct is controlled by the control circuits 5213 and 5223. For the purpose of this control, the high-side control signals SaH and SbH or signals based on them (for example, the gate voltages HGa and HGb) can be fed to the switch circuit 5230. As shown in FIG. 38, the period in which the high-side control signals SaH and SbH are both at high level and the period in which the gate voltages HGa and HGb are both at high level correspond to the both-on period in which the high-side transistors 5211H and 5221H are both on. It is also possible to adopt a configuration where the path between the boot nodes BTa and BTb is kept conducting during the entire both-on period or a configuration where the path between the boot nodes BTa and BTb is kept conducting only during part of the both-on period.

FIG. 34 shows an example where the switch circuit 5230 is composed of switches Qa and Qb that are connected in series with each other. The switch Qa can be a switch that is on or off when the high-side control signal SaH or the gate voltage HGa is at high or low level respectively (i.e., when the high-side transistor 5211H is on or off respectively), and the switch Qb can be a switch that is on or off when the high-side control signal SbH or the gate voltage HGb is at high or low level respectively (i.e., when the high-side transistor 5212H is on or off respectively). Then only in the period in which the high-side control signals SaH and SbH are both at high level or in the period in which the gate voltages HGa and HGb are both at high level (i.e., only in the period in which the high-side transistors 5211H and 5221H are both on) does the path between the boot nodes BTa and BTb conduct through the switches Qa and Qb.

The operation of the step-up converter 5210 to produce the output voltage Vouta from the input voltage Vina and the operation of the step-down converter 5220 to produce the output voltage Voutb from the input voltage Vinb are independent of each other, and thus when a both-on period occurs is indefinite. If there occurs no period in which the high-side transistors 5211H and 5221H are simultaneously on, no current passes through the switch circuit 5230, and the power supply circuit 5200) is equivalent to the virtual power supply circuit mentioned above. As in the case CS1 in FIG. 30, so long as the step-up and step-down converters 5210 and 5220 are both performing switching control, the bootstrap capacitors (Cax and Cbx) are charged every switching event, even if there occurs a period in which the high-side transistors 5211H and 5221H are simultaneously on, the potentials at the boot nodes BTa and BTb are expected to be substantially equal, and thus no particular problem occurs.

Figure 39:
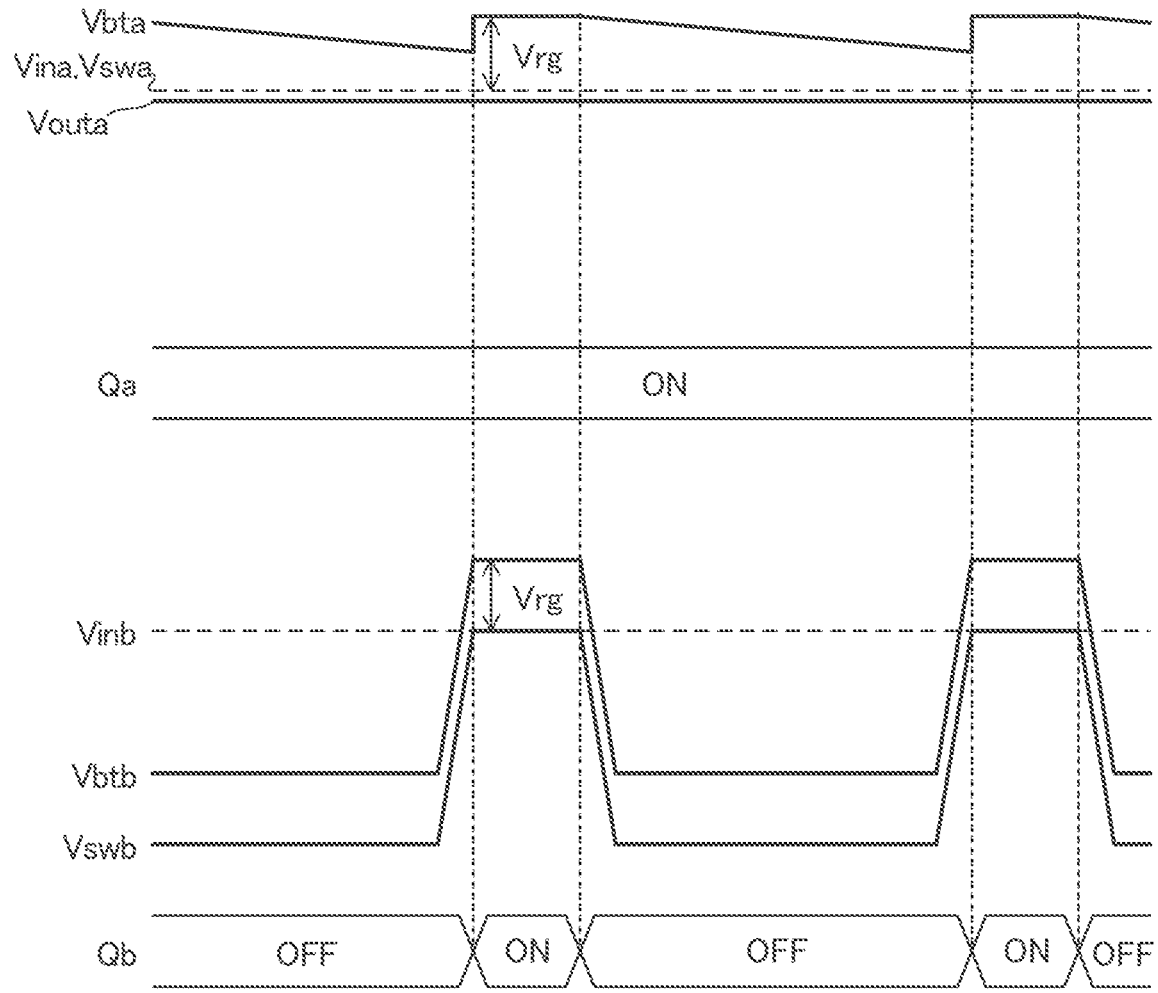
FIG. 39 is a diagram showing a relationship among a plurality of voltages and the states of switches in a switch circuit with respect to two step-down converters in the ninth embodiment of the present invention.

FIG. 39 shows the relationship between the voltage waveforms at relevant points in the power supply circuit 5200 and the states of the switches Qa and Qb as observed in a case CSb. In the case CSb, because Vina≥Vtga, the step-up converter 5210 performs the high-side-fixed-on control. On the other hand, because Vinb>Vtgb, the step-down converter 5220 performs the step-down switching control SC4. Here, the bootstrap circuit BCa in the step-up converter 5210 does not function, and thus if the switch Qb is off, due to the circuit current in the gate driver 5212H, the boot voltage Vbta falls gradually. Even so, the switch Qa is kept on all the time, and thus when the switch Qb is turned on, the path between the boot nodes BTa and BTb conducts so that electric power is fed from the node BTb to the node BTa. The switch Qb is on during the period in which the high-side transistor 5221H is on, that is, during the period in which Vbtb=Vinb+Vrg; thus, every time the switch Qb turns on, the boot voltage Vbta is raised up to the level of Vinb+Vrg and is kept generally at the level of Vinb−Vrg (here, the forward voltage across the diode Dbx is ignored). When the step-up converter 5210 is performing the high-side-fixed-on control, substantially Vswa=Vinb=Vouta. Consequently, also in the case CSb, the boot voltage Vbta can be kept around the level of Vswa+Vrg. and thus the transistor 5211H can be kept on.

The above-described operation using the switch circuit 5230 is in effect in a case where the step-down converter 5220 performs the step-down switching control SC4 all the time. Accordingly, in a case where, due to variation of the input voltage Vina, the input voltage Vina can become higher or lower than the target voltage Vtga of the step-up converter 5210, it is preferable that the target voltage Vtgb of the step-down converter 5220 be set at a voltage lower than the target voltage Vtga of the step-up converter 5210 so that the step-down converter 5220 performs the step-down switching control SC4 all the time.

It is also possible to adopt, instead, a method MT4 where an upper limit of less than 100% is set on the duty at which the high-side transistor 5221H is on (i.e., the output duty of the step-down converter 5220) so that the step-down converter 5220 performs the step-down switching control SC4 all the time. The method MT4 can be adopted not only in a case where, due to variation of the input voltage Vina, the input voltage Vina can become higher or lower than the target voltage Vtga of the step-up converter 5210 but also in any other case.

As mentioned above, the step-down converter 5220 can perform high-side-fixed-on control. In this connection, when the method MT4 is adopted, even when the input voltage Vinb becomes equal to or lower than the target voltage Vtgb, the step-down converter 5220 does not perform the high-side-fixed-on control but performs the step-down switching control SC4. Thus, while the control circuit 5223 adjusts the output duty of the step-down converter 5220 based on the feedback signal Vfbb, when the method MT4 is adopted, an upper limit duty less than 100% (e.g., 90%) is set on the output duty of the step-down converter 5220, and thus even when the input voltage Vinb becomes equal to or lower than the target voltage Vtgb, a rise in the output duty of the step-down converter 5220 is limited not to go beyond the upper limit duty (e.g., 90%). Consequently, even though the output voltage Voutb of the step-down converter 5220 becomes lower than the input voltage Vinb, it is ensured that the step-down switching control SC4 is performed all the time.

Modified Bootstrap Circuit:

The bootstrap circuits BCa and BCb can each be modified such that the bootstrap diode (Dax or Dbx) is replaced with a bootstrap switch. In that case, the bootstrap switch in the modified bootstrap circuit BCa is kept off in the high-output state of the step-up converter 5210, and is kept on in the low-output state of the step-up converter 5210. Likewise, the bootstrap switch in the modified bootstrap circuit BCb is kept off in the high-output state of the step-down converter 5220, and is kept on in the low-output state of the step-down converter 5220.

Figure 40A:
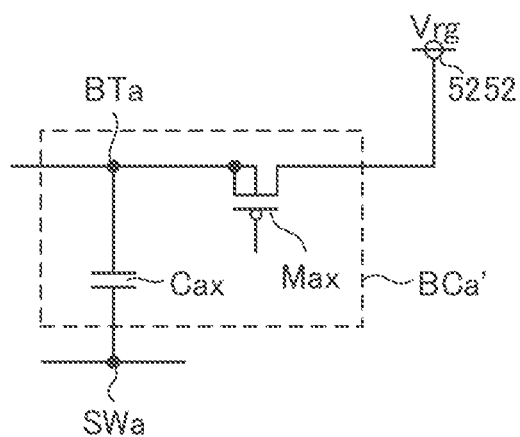
FIGS. 40A and 40B are diagrams showing modified configurations of a bootstrap circuit in the ninth embodiment of the present invention.

Specifically, the bootstrap circuit BCa can be modified to a bootstrap circuit BCa' as shown in FIG. 40A. The bootstrap circuit BCa' includes a bootstrap capacitor Cax connected between the nodes BTa and SWa and a bootstrap transistor Max as a bootstrap switch. The transistor Max is configured as a P-channel MOSFET. The drain of the transistor Max is connected to the direct-current voltage application terminal 5252 (the terminal 5252 to which the direct-current voltage Vrg is applied), and the source of the transistor Max is connected to the node BTa. Here, a circuit (not shown; it can be the control circuit 5213) that keeps the transistor Max off in the high-output state of the step-up converter 5210 and that keeps the transistor Max on in the low-output state of the step-up converter 5210 can be included in the step-up converter 5210.

Figure 40B:
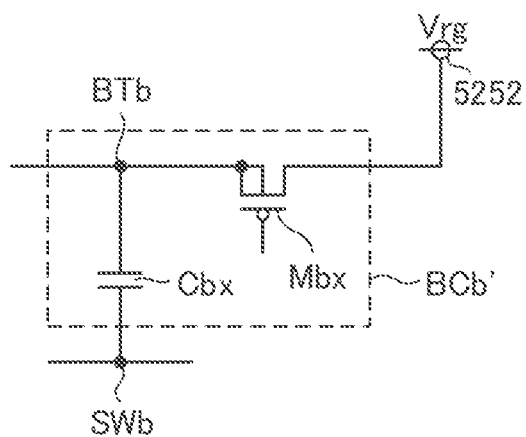

Likewise, the bootstrap circuit BCb can be modified to a bootstrap circuit BCb' as shown in FIG. 40B. The bootstrap circuit BCb' includes a bootstrap capacitor Cbx connected between the nodes BTb and SWb and a bootstrap transistor Mbx as a bootstrap switch. The transistor Mbx is configured as a P-channel MOSFET. The drain of the transistor Mbx is connected to the direct-current voltage application terminal 5252 (the terminal 5252 to which the direct-current voltage Vrg is applied), and the source of the transistor Mbx is connected to the boot node BTb. Here, a circuit (not shown, it can be the control circuit 5223) that keeps the transistor Mbx off in the high-output state of the step-down converter 5220 and that keeps the transistor Mbx on in the low-output state of the step-down converter 5220 can be included in the step-down converter 5220.

The bootstrap diode (Dax, Dbx) and the bootstrap switch (Max, Mbx) functions as a charging element for charging the bootstrap capacitor (Cax, Cbx). Using a bootstrap switch as a charging element, compared with using a bootstrap diode, helps raise the potential at the boot node (BTa, BTb) by the forward voltage across the bootstrap diode, and helps reduce the power loss that occurs when a current is passed in the charging element.

Tenth Embodiment

A tenth embodiment of the present invention will be described. The tenth embodiment, and also the eleventh to fourteenth embodiments described later, is an embodiment based on the eighth or ninth embodiment, and for any feature of which no specific description is given in connection with the tenth to fourteenth embodiments, unless inconsistent, the relevant description of the eighth or ninth embodiment applies to the tenth to fourteenth embodiments. In interpreting the description of the tenth embodiment, for any feature of it that contradicts any of the eighth or ninth embodiment, the description of that feature of the tenth embodiment can prevail (the same is true with the eleventh to fourteenth embodiments described later). Unless inconsistent, any two or more of the eighth to fourteenth embodiments can be combined together.

The tenth embodiment deals with configuration examples of the switch circuits 5130 and 5230. For the following description, terms and symbols are defined as shown in FIG. 41. In a case where the tenth embodiment is applied to the power supply circuit 5100 of the eighth embodiment (see FIG. 25), the boot nodes BT_X and BT_Y and the gate voltages HG_X and HG_Y here correspond to the boot nodes BT1 and BT2 and the gate voltages HG1 and HG2, respectively, in the power supply circuit 5100. In a case where the tenth embodiment is applied to the power supply circuit 5200 of the ninth embodiment (see FIG. 34), the boot nodes BT_X and BT_Y and the gate voltages HG_X and HG_Y here correspond to the boot nodes BTa and BTb and the gate voltages HGa and HGb, respectively, in the power supply circuit 5200. The first and second high-side transistors here correspond to the transistors 5111H and 5121H, respectively, in the power supply circuit 5100 of the eighth embodiment (see FIG. 25), and correspond to the transistors 5211H and 5221H, respectively, in the power supply circuit 5200 of the ninth embodiment (see FIG. 34).

As configuration examples of the switch circuits 5130 and 5230 in FIGS. 25 and 34, Configuration Examples EX10_1 to EX10_6 will be presented below. In the following description, a given DC-DC converter is occasionally mentioned in association with a "channel". For example, the power supply circuit 5100 in FIG. 25 can be understood to have two channels, one channel implemented as the step-up converter 5110 and the other channel implemented as the step-down converter 5120.

Configuration Examples EX10_1

FIG. 42 shows a switch circuit 5310 according to Configuration Examples EX10_1. The switch circuit 5310 can be used as the switch circuit 5130 or 5230. The switch circuit 5310 is a circuit similar to the switch circuit 5130 or 5230 shown in FIG. 25 or 34. Specifically, the switch circuit 5310 includes switches (switching elements) 5311 and 5312 provided between the boot nodes BT_X and BT_Y and connected in series with each other and a switch controller 5313 that keeps the switch 5311 on during all or part of the on period of the first high-side transistor and that keeps the switch 5312 on during all or part of the on period of the second high-side transistor.

The switch controller 5313 keeps the switch 5311 off at least during the off period of the first high-side transistor, and keeps the switch 5312 off at least during the off period of the second high-side transistor. With respect to any transistor including the first and second high-side transistors, the on period of the transistor denotes the period in which the transistor is on, and the off period of the transistor denotes the period in which the transistor is off.

Configuration Examples EX10_2

FIG. 43 shows a switch circuit 5320 according to Configuration Examples EX10_2. The switch circuit 5320 can be used as the switch circuit 5130 or 5230. The switch circuit 5320 corresponds to an example of the switch circuit 5310 in FIG. 42. The switch circuit 5320 includes transistors 5321 and 5322 as an example of the switches 5311 and 5312 in FIG. 42 and inverter circuits 5323 and 5324. The transistors 5321 and 5322 are configured as P-channel MOSFETs.

The drains of the transistors 5321 and 5322 are connected to the boot nodes BT_X and BT_Y respectively. The sources of the transistors 5321 and 5322 are connected together. The inverter circuit 5323 feeds the gate of the transistor 5321 with a voltage signal resulting from inverting the gate voltage HG_X so that, when the gate voltage HG_X is at high or low level, the transistor 5321 is on or off respectively. The inverter circuit 5324 feeds the gate of the transistor 5322 with a voltage signal resulting from inverting the gate voltage HG_Y so that, when the gate voltage HG_Y is at high or low level, the transistor 5322 is on or off respectively.

With the configuration in FIG. 42 or 43 adopted, the two switches can be arranged in the blocks of the corresponding channels respectively, and thus only the conductor between the switches 5311 and 5312 (the conductor between the transistors 5321 and 5322) has to be laid over a comparatively large distance. This helps reduce the wiring space, and helps almost eliminate interference between the channels.

Configuration Examples EX10_3

Figure 44:
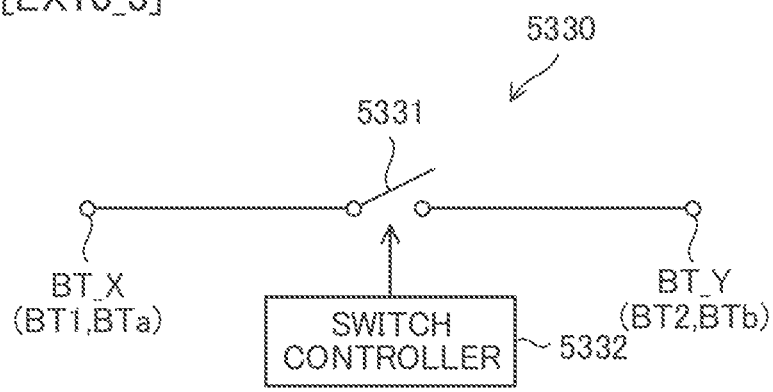
FIG. 44 is a diagram showing a third configuration example of a switch circuit in the tenth embodiment of the present invention.

FIG. 44 shows a switch circuit 5330 according to Configuration Examples EX10__3. The switch circuit 5330 can be used as the switch circuit 5130 or 5230. The switch circuit 5330 includes a single switch 5331 (switching element) provided between the boot nodes BT_X and BT_Y and a switch controller 5332 that keeps the switch 5331 on during all or part of the both-on period of the first and second high-side transistors.

The both-on period of the first and second high-side transistors denotes the period in which the first and second high-side transistors are both on. The switch controller 5332 keeps the switch 5331 off during the period in which at least one of the first and second high-side transistors is off.

Configuration Examples EX10_4

Figure 45:
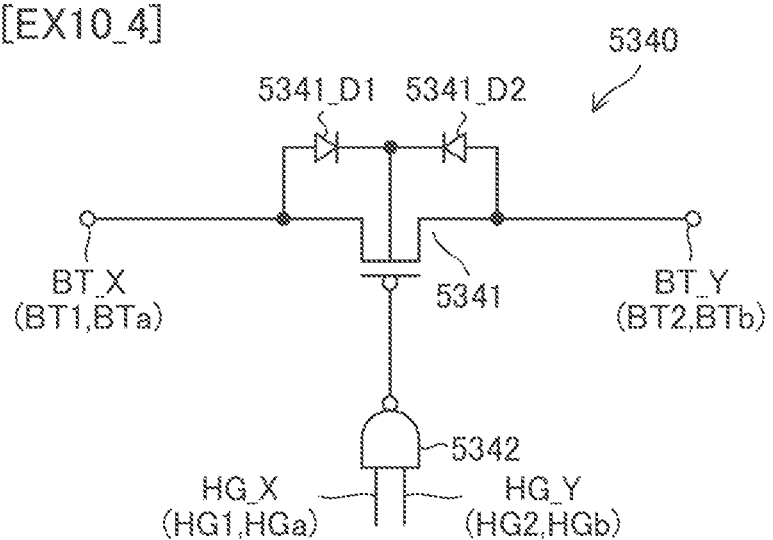
FIG. 45 is a diagram showing a fourth configuration example of a switch circuit in the tenth embodiment of the present invention.

FIG. 45 shows a switch circuit 5340 according to Configuration Examples EX10_4. The switch circuit 5340 can be used as the switch circuit 5130 or 5230. The switch circuit 5340 corresponds to an example of the switch circuit 5330 in FIG. 44. The switch circuit 5340 includes a transistor 5341 as an example of the switch 5331 in FIG. 44 and a NAND circuit (negated logical product circuit) 5342 as an example of the switch controller 5332 in FIG. 44.

The transistor 5341 is configured as a P-channel MOSFET with its backgate left open. The transistor 5341 has parasitic diodes 5341_D1 and 5341_D2. Of the drain and the source of the transistor 5341, one is connected to the boot node BT_X and the other is connected to the boot node BT_Y. The anodes of the diodes 5341_D1 and 5341_D2 are connected to the boot nodes BT_X and BT_Y respectively. The cathodes of the diodes 5341_D1 and 5341_D2 are both connected to the backgate of the transistor 5341.

The NAND circuit 5342 receives the gate voltages HG_X and HG_Y. Only when the gate voltages HG_X and HG_Y are both at high level does the NAND circuit 5342 feed a low-level gate signal to the gate of the transistor 5341 to keep the transistor 5341 on. When at least one of the gate voltages HG_X and HG_Y is at low level, the NAND circuit 5342 feeds a high-level gate signal to the gate of the transistor 5341 to keep the transistor 5341 off.

With the configuration in FIG. 44 or 45 adopted, only one switch is needed. This helps reduce the space for the arrangement of circuit elements. On the other hand, the conductor between the boot node BT_X and the switch (5331, 5341) and the conductor between the boot node BT_Y and the switch (5331, 5341) are expected to be comparatively long, requiring a comparatively large wiring space. Thus, this configuration, as compared with the configurations in FIGS. 42 and 43, tends to suffer more interference between the channels.

With the configuration in FIG. 45, the backgate of the transistor 5341 needs to be open to prevent conduction between the boot nodes BT_X and BT_Y via the parasitic diodes 5341_D1 and 5341_D2 of the transistor 5341. Instead, the configuration in FIG. 45 can be modified such that the backgate of the transistor 5341 is all the time kept connected to whichever of the boot nodes BT_X and BT_Y has the higher voltage (in that case, the switch circuit 5340 needs to be further provided with a comparator for comparing those voltages and a selection switch).

Configuration Examples EX10_5

Figure 46:
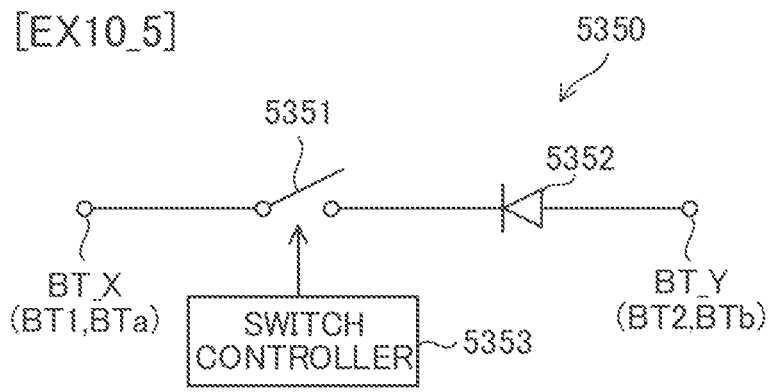
FIG. 46 is a diagram showing a fifth configuration example of a switch circuit in the tenth embodiment of the present invention.

In the switch circuit 5310 (FIG. 42) according to Configuration Examples EX10_1, in a case where the direction of the current between the boot nodes BT_X and BT_Y is constant, one of the transistors 5311 and 5312 can be replaced with a diode. A switch circuit 5350 according to Configuration Examples EX10_5, where such replacement has been done, is shown in FIG. 46. The switch circuit 5350) can be used as the switch circuit 5130 or 5230. The switch circuit 5350 is used when the DC-DC converter that includes the boot node BT_Y performs switching control all the time (i.e., when the step-down converter 5120 in FIG. 25 performs the step-down switching control SC2 all the time or when the step-down converter 5220 in FIG. 34 performs the step-down switching control SC4 all the time).

The switch circuit 5350 includes a switch (switching element) 5351 and a diode 5352 that are provided between the boot nodes BT_X and BT_Y and that are connected in series with each other and a switch controller 5353 that keeps the switch 5351 on during all or part of the on period of the first high-side transistor. The switch controller 5353 keeps the switch 5351 off at least during the off period of the first high-side transistor.

The diode 5352 is inserted between the boot nodes BT_X and BT_Y so that, when the switch 5351 is on, a current can pass from the boot node BT_Y to the boot node BT_X. In FIG. 46, the anode of the diode 5352 is connected to the boot node BT_Y, and the switch 5351 is inserted between the cathode of the diode 5352 and the node BT_X. Instead, the arrangement of the switch 5351 and the diode 5352 relative to each other can be reversed. In either case, when the switch 5351 is on, electric power is supplied from the node BT_Y to the node BT_X via the switch 5351.

Figure 47:
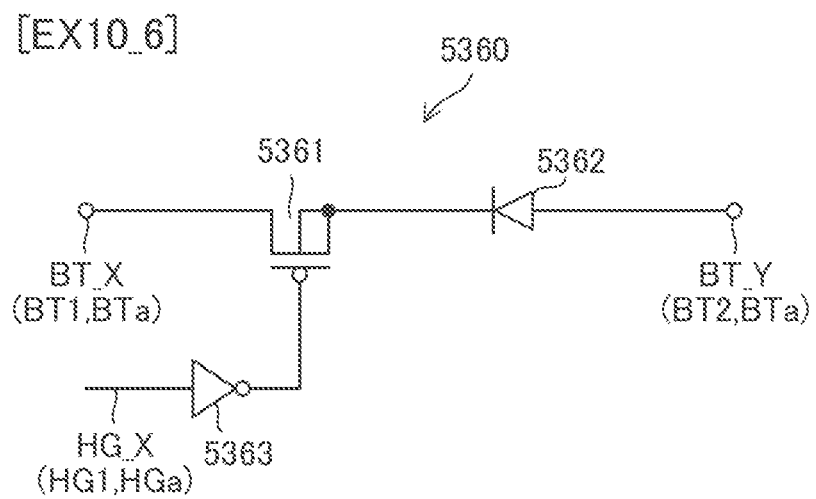
FIG. 47 is a diagram showing a sixth configuration example of a switch circuit in the tenth embodiment of the present invention.

Configuration Examples EX10_6:

FIG. 47 shows a switch circuit 5360 according to Configuration Examples EX10_6. The switch circuit 5360 can be used as the switch circuit 5130 or 5230. The switch circuit 5360 corresponds to an example of the switch circuit 5350 in FIG. 46. The switch circuit 5360 includes a transistor 5361, a diode 5362, and an inverter circuit 5363 as an example of the switch 5351, the diode 5352, and the switch controller 5353, respectively, in FIG. 46. The transistor 5361 is configured as a P-channel MOSFET.

The drain of the transistor 5361 is connected to the boot node BT_X, the source of the transistor 5361 is connected to the cathode of the diode 5362, and the anode of the diode 5362 is connected to the boot node BT_Y. The inverter circuit 5363 feeds the gate of the transistor 5361 with a voltage signal resulting from inverting the gate voltage HG_X so that, when the gate voltage HG_X is at high or low level, the transistor 5361 is on or off respectively.

Eleventh Embodiment

An eleventh embodiment according to the present invention will be described. While examples where two DC-DC converters are provided in a power supply circuit have been described, three or more DC-DC converters can be provided in a power supply circuit according to the present invention. Also in such cases, conduction/non-conduction between boot nodes can be controlled by use of a switch circuit as described above.

Adoptable configurations can be generalized, using any integer n of two or more, as follows. Consider a power supply circuit having a first to an nth channel each implemented as a DC-DC converter with a configuration equivalent to that of the step-down converter 5110 or 5120 in FIG. 25 or the step-up or step-down converter 5210 or 5220 in FIG. 34. Here, the n boot nodes in the DC-DC converters of the first to nth channels are connected together via a switch circuit so that, during all or part of the period in which all the high-side transistors in the DC-DC converters of the first to nth channels are on, the path among the n boot nodes can be made to conduct via the switch circuit. This is possible only in cases where the voltages on the boot nodes can be shared among the first to nth DC-DC converters. That is, in the DC-DC converter of each channel, immediately after it switches from the low-output state to the high-output state, the voltage at the boot node is at the maximum; this maximum voltage value has to be substantially common to the DC-DC converters of the first to nth channels. This is the first condition to be satisfied. Moreover, of the DC-DC converters of the first to nth channels, one or more have to be performing switching control (step-up or step-down switching control) all the time. This is the second condition to be satisfied.

Figure 48:
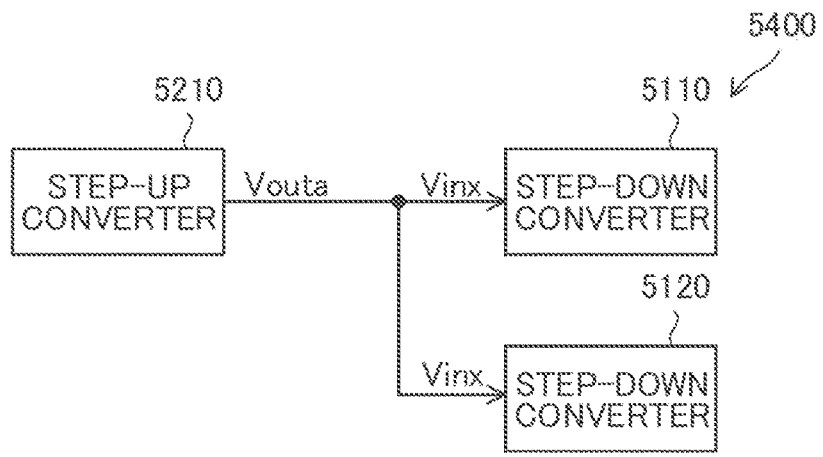
FIG. 48 is a configuration diagram of a power supply circuit according to an eleventh embodiment of the present invention.

For example, it is possible to configure a power supply circuit 5400 as shown in FIG. 48 which includes, as DC-DC converters of a first to a third channel, the step-up converter 5210 in FIG. 34, the step-down converter 5110 in FIG. 25, and the step-down converter 5120 in FIG. 25. In the power supply circuit 5400, the output voltage Vouta of the step-up converter 5210 is fed, as a common input voltage Vinx, to both of the step-down converters 5110 and 5120. Applying the configuration in FIG. 43 to the power supply circuit 5400 results in the switch circuit 5430 in FIG. 49, and the switch circuit 5430 can be provided in the power supply circuit 5400.

Figure 49:
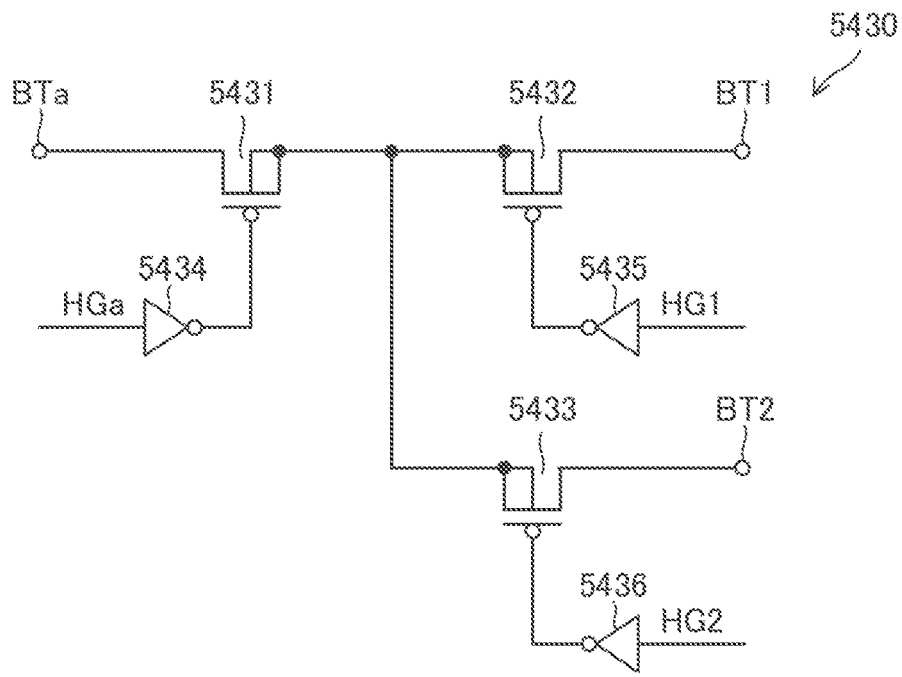
FIG. 49 is a configuration diagram of a switch circuit that can be provided in the power supply circuit in FIG. 48.

The switch circuit 5430 in FIG. 49 includes transistors 5431 to 5433 configured as P-channel MOSFETs and inverter circuits 5434 to 5436. The boot node BTa of the step-up converter 5210, the boot node BT1 of the step-down converter 5110, and the boot node BT2 of the step-down converter 5120 are connected to the drains of the transistors 5431, 5432, and 5433 respectively (see FIGS. 25 and 34 wherever applicable). The sources of the transistors 5431 to 5433 are connected together.

The inverter circuit 5434 feeds the gate of the transistor 5341 with a voltage signal resulting from inverting the gate voltage HGa (see FIG. 34). When the gate voltage HGa is at high or low level, the transistor 5431 is on or off respectively. The inverter circuit 5435 feeds the gate of the transistor 5342 with a voltage signal resulting from inverting the gate voltage HG1 (see FIG. 25). When the gate voltage HG1 is at high or low level, the transistor 5432 is on or off respectively. The inverter circuit 5436 feeds the gate of the transistor 5433 with a voltage signal resulting from inverting the gate voltage HG2 (see FIG. 25). When the gate voltage HG2 is at high or low level, the transistor 5433 is on or off respectively. Thus, in the power supply circuit 5400 including the switch circuit 5430, only when the step-up converter 5210 and the step-down converters 5110 and 5120 are all in the high-output state (that is, when the high-side transistors 5211H, 5111H, and 5121H are all on; see FIGS. 34 and 25) does the path among the boot nodes BTa, BT1, and BT2 conduct.

So long as the first and second conditions mentioned above are satisfied, a power supply circuit can include three or more step-down converters and can include two or more step-up converters. The value of "n" mentioned above can be four or more.

Twelfth Embodiment

Figure 50:
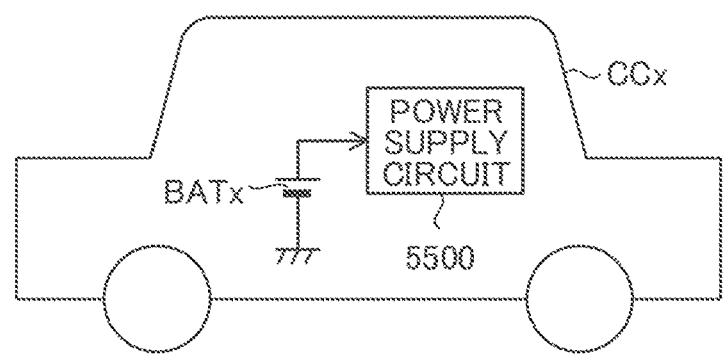
FIG. 50 is a configuration diagram of a vehicle that incorporates a power supply circuit in a twelfth embodiment of the present invention.

A twelfth embodiment of the present invention will be described. Any of the power supply circuits described above in connection with the different embodiments can be incorporated in any device, and can be used as a power supply circuit for any load. FIG. 50 shows a configuration example where a power supply circuit 5500 is incorporated in a vehicle CCx such as an automobile. The vehicle CCx also includes a battery BATx that can output a predetermined direct-current voltage. The electric power output from the battery BATx is used to start the engine (not shown) of the vehicle CCx and to drive various electric components (such as head lights) incorporated in the vehicle CCx.

As the power supply circuit 5500, the power supply circuit of any of the different embodiments described above (e.g., any of the seventh to eleventh embodiments can be used. The output voltage of the battery BATx is used as the input voltage to the power supply circuit 5500. For example, consider a case where the power supply circuit 52, in FIG. 34 is used as the power supply circuit 5500. In this case, the output voltage of the battery BATx is fed, as the input voltage Vina, to the step-up converter 5210 in the power supply circuit 5500, and the output voltage Voutb of the step-down converter 5220 in the power supply circuit 5500 can be supplied to the various loads incorporated in the vehicle CCx (e.g., an air conditioner, a navigation system, a display device, another power supply circuit, etc.).

For example, assume that, in the power supply circuit 5500, the target voltage Vtga for the output voltage Vouta of the step-up converter 5210 is 8.5 V and the target voltage Vtgb for the output voltage Voutb of the step-down converter 5220 is 5.0 V. The output voltage of the battery BATx is basically about 12 V. and when the output voltage of the battery BATx is 12 V, the step-up converter 5210 performs the high-side-fixed-on control while the step-down converter 5220 performs the step-down switching control SC4. The maintenance of the boot voltage Vbta for the continuation of the high-side-fixed-on control in the step-up converter 5210 is achieved via the switch circuit 5230. On the other hand, on occasions such as at starting of the engine or at recovery from stopped idling, the output voltage of the battery BATx may fall sharply down to, for example, 3 V, and even in the event of such a fall, the step-down converter 5220 is expected to supply a voltage stably to its load. With the power supply circuit 5200 in FIG. 34 used as the power supply circuit 5500, when the output voltage of the battery BATx falls down to 3 V, the step-up converter 5210) performs the step-up switching control SC3 to keep the input voltage Vinb to the step-down converter 5220 around 8.5 V, and this meets the above expectation.

Thirteenth Embodiment

Figure 51:
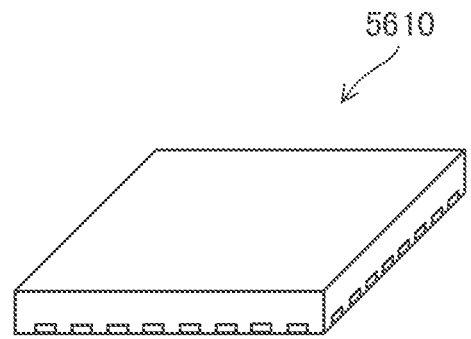
FIG. 51 is an exterior perspective view of a power IC according to a thirteenth embodiment of the present invention.

A thirteenth embodiment of the present invention will be described. The power supply circuit of any of the embodiments described above (including the power supply circuits 5100, 5200, 5400, and 5500) can be configured as a semiconductor integrated circuit. An example of the exterior perspective view of a power IC 5610 (power supply integrated circuit) as an electronic component incorporating such an semiconductor integrated circuit is shown in FIG. 51. The power IC 5610 is an electronic component (semiconductor device) formed by sealing the above-mentioned semiconductor integrated circuit in a casing (package) formed of resin, and part or all of the elements constituting the power supply circuit are integrated together using semiconductors inside the power IC 5610. The casing of the power IC 5610 is provided with a plurality of external terminals that are exposed outside the power IC 5610. The number of external terminals shown in FIG. 51 is merely illustrative (the same is true with FIG. 25, which will be referred to later).

Figure 52:
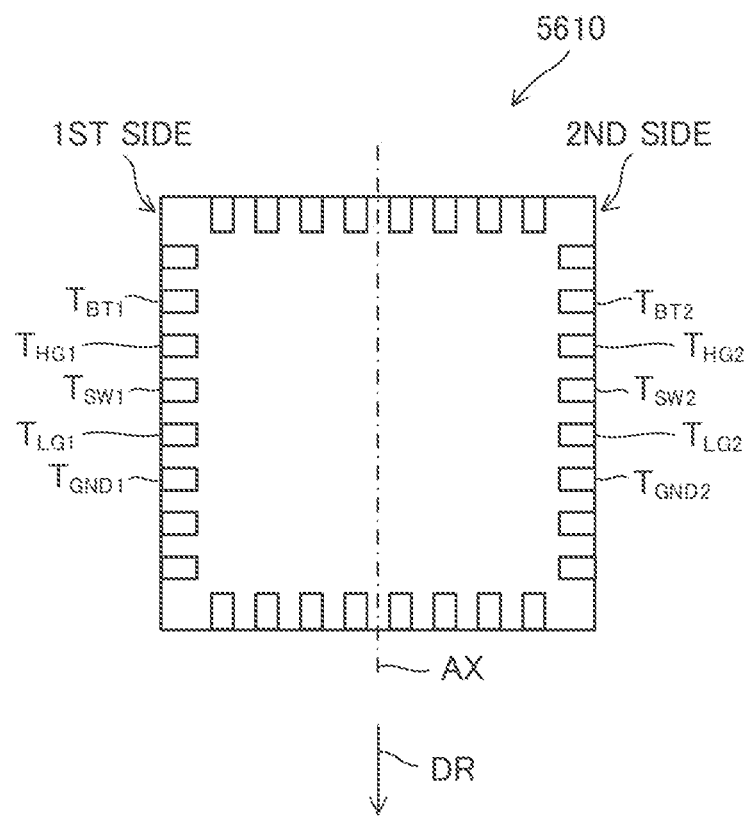
FIG. 52 is a diagram showing an army of external terminals of a power IC in the thirteenth embodiment of the present invention.

FIG. 52 is a schematic plan view of the power IC 5610. In the example taken here, the power IC 5610 is assumed to have a casing (packaged) generally called QFN (quad-flatpack no-leads). In this case, the power IC 5610 has a casing substantially in the shape of a rectangular parallelepiped, and has a plurality of external terminals arrayed along each of the four sides of its face corresponding to the bottom face of the casing (FIG. 52 is a plan view as seen from below). The four sides include a first side and a second side that are opposite from each other, with external terminals $T_{BT1}$, $T_{HG1}$, $T_{SW1}$, $T_{LG1}$, and $T_{GND1}$ provided along the first side and external terminals $T_{BT2}$, $T_{HG2}$, $T_{SW2}$, $T_{LG2}$, and $T_{GND2}$ provided along the second side. The power IC 5610 can have, other than these 10 external terminals in total, any additional external terminals, though the following description deals only with, unless necessary, the ten terminals in total mentioned above. The power IC 5610 can have a casing of any type other than QFN, such as DFN (dual-flatpack no-leads) or SOP (small outline package).

The external terminals $T_{BT1}$, $T_{HG1}$, $T_{SW1}$, $T_{LG1}$, and $T_{GND1}$ are arrayed in this order long a predetermined direction DR parallel to the first and second sides; likewise, the external terminals $T_{BT2}$, $T_{HG2}$, $T_{SW2}$, $T_{LG2}$, and $T_{GND2}$ are arrayed in this order along the predetermined direction DR. With respect to the middle axis AX (in other words, the central axis AX) of the power IC 5610 parallel to the first and second sides, the arrangement positions of the $T_{BT1}$, $T_{HG1}$, $T_{SW1}$, $T_{LG1}$, and $T_{GND1}$ are in line symmetry with the arrangement positions of the $T_{BT2}$, $T_{HG2}$, $T_{SW2}$, $T_{LG2}$, and $T_{GND2}$. In FIG. 52, at the first side, no external terminals other than the external terminals $T_{HG1}$, $T_{SW1}$, $T_{LG1}$ are provided between the external terminal $T_{BT1}$ and the external terminal $T_{GND1}$; instead, any one or more other external terminals can be provided there. The same applies to the second side. At the first side, the external terminal $T_{BT1}$ can be arranged at the end of the first side, or can be arranged elsewhere. The same applies to the external terminal $T_{GND1}$, as well as to the external terminals $T_{BT2}$ and $T_{GND2}$ at the second side.

When the power supply circuit 5100 in FIG. 25 is implemented with the power IC 5610, the elements identified by the reference symbols 5112H, 5112L, 5113, 5114, and D1x, the elements identified by the reference symbols 5122H, 5122L, 5123, 5124, and D2x, and the switch circuit 5130 are formed inside the power IC 5610, whereas the elements identified by the reference symbols 5111H, 5111L, 5115, C1x, L1x, and Cout1 and the elements identified by the reference symbols 5121H, 5121L, 5125, C2x, L2x, and Cout2 are provided outside the power IC 5610 and are connected externally to the power IC 5610. In this case, the nodes BT1, SW1, BT2, and SW2 are connected to the external terminal $T_{BT1}$, $T_{SW1}$, $T_{BT2}$, and $T_{SW2}$ respectively, and the nodes at which the output voltages (HG1, LG1, HG2, and LG2) of the drivers 5112H, 5112L, 5122H, and 5122L appear are connected to the external terminal $T_{HG1}$, $T_{LG1}$, $T_{HG2}$, and $T_{LG2}$ respectively, with the ground potential of the power supply circuit 5100 fed to the external terminal $T_{GND1}$ and $T_{GND2}$. Here, in the IC 5610, the bootstrap diodes D1x and D2x can be replaced with bootstrap transistors M1x and M2x (see FIGS. 33A and 33B).

When the power supply circuit 5200 in FIG. 34 is implemented with the power IC 5610, the elements identified by the reference symbols 5212H, 5212L, 5213, 5214, and Dbx, the elements identified by the reference symbols 5222H, 5222L, 5223, 5224, and Dbx, and the switch circuit 5230 are formed inside the IC 5610, whereas the elements identified by the reference symbols 5211H, 5211L, 5215, Cax, Lax, and Couta and elements identified by the reference symbols 5221H, 5221L, 5225, Cbx, Lbx, and Coutb are provided outside the IC 5610 and are connected externally to the power IC 5610. In this case, the nodes BTa, SWa, BTb, and SWb are connected to the external terminal $T_{BT1}$, $T_{SW1}$, $T_{BT2}$, and $T_{SW2}$ respectively, and the nodes at which the output voltages (HGa, LGa, HGCb, and LGb) of the drivers 5212H, 5212L, 5222H, and 5222L appear are connected to the external terminal $T_{HG1}$, $T_{LG1}$, $T_{HG2}$, and $T_{LG2}$ respectively, with the ground potential of the power supply circuit 5200 fed to the external terminal $T_{GND1}$ and $T_{GND2}$. Here, in the IC 5610, the bootstrap diodes Dax and Dbx can be replaced with the bootstrap transistors Max and Mbx (see FIGS. 40A and 40B).

Figure 53:
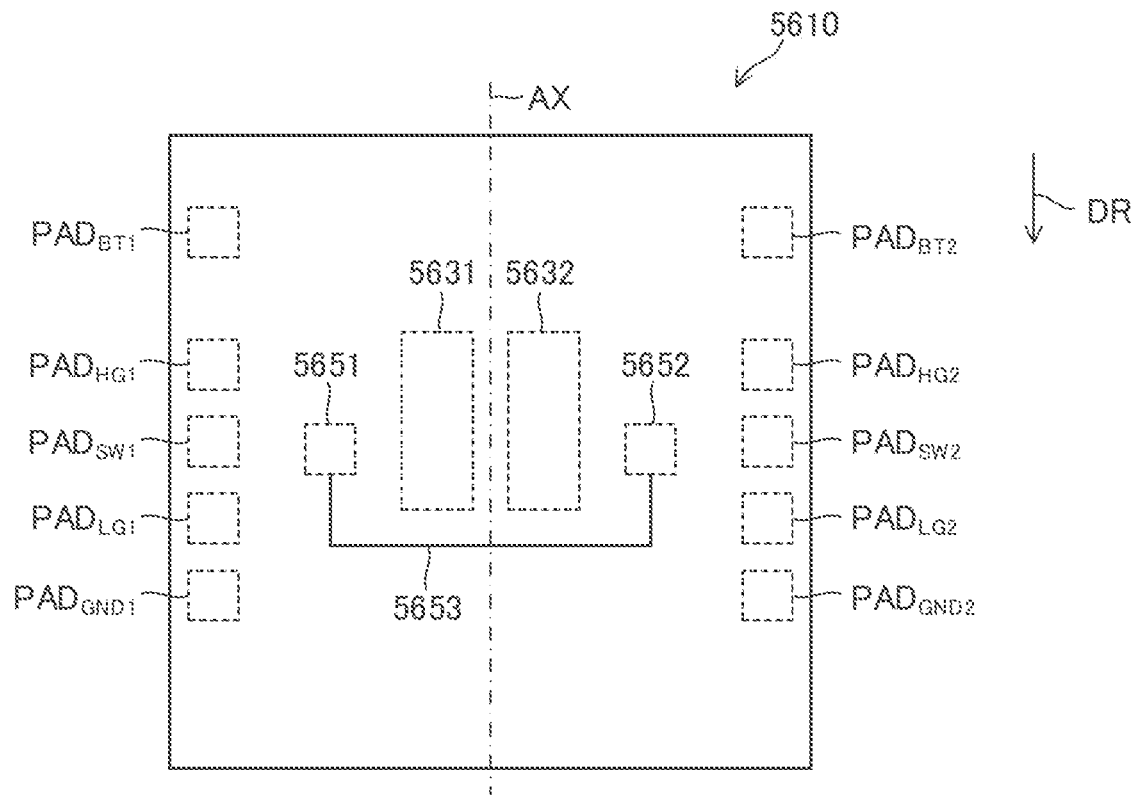
FIG. 53 is a diagram illustrating a layout of a semiconductor integrated circuit constituting a power IC in the thirteenth embodiment of the present invention.

FIG. 53 shows an example of the layout in the IC 5610. Considered in two-dimensional terms for the sake of simple description, the semiconductor integrated circuit in the IC 5610 is arranged in a fashion distributed within a substantially rectangular (which can be square) outline, and near two sides of the rectangular that are opposite from each other, pads for connection to the external terminals are formed. Of these two sides, one corresponds to the first side mentioned above, and the other corresponds to the second side mentioned above. Near the first side, along the predetermined direction DR, pads $PAD_{BT1}$, $PAD_{HG1}$, $PAD_{SW1}$, $PAD_{LG1}$, and $PAD_{GND1}$ are arranged in this order, near the second side, along the predetermined direction DR, pads $PAD_{BT2}$, $PAD_{HG2}$, $PAD_{SW2}$, $PAD_{LG2}$, and $PAD_{GND2}$ are arranged in this order. Among the pads $PAD_{BT1}$, $PAD_{HG1}$, $PAD_{SW1}$, $PAD_{LG1}$, and $PAD_{GND1}$ the interval between the pads $PAD_{HT1}$ and $PAD_{HG1}$ can be longer than the interval between any other two adjacent pads. Likewise, among the pads $PAD_{BT2}$, $PAD_{HG2}$, $PAD_{SW2}$, $PAD_{LG2}$, and $PAD_{GND2}$, the interval between the pads $PAD_{BT2}$ and $PAD_{HG2}$ can be longer than the interval between any other two adjacent pads. With respect to the middle axis AX of the power IC 5610 along the predetermined direction DR, the arrangement positions of the pads $PAD_{BT1}$, $PAD_{HG1}$, $PAD_{SW1}$, $PAD_{LG1}$, and $PAD_{GND1}$ are in line symmetry with the arrangement positions of the pads $PAD_{BT2}$, $PAD_{HG2}$, $PAD_{SW2}$, $PAD_{LG2}$, and $PAD_{GND2}$ respectively.

The pads $PAD_{BT1}$, $PAD_{HG1}$, $PAD_{SW1}$, $PAD_{LG1}$, and $PAD_{GND1}$, $PAD_{BT2}$, $PAD_{HG2}$, $PAD_{SW2}$, $PAD_{LG2}$, and PAD$_{GND2}$ are connected, by wire bonding, to the external terminal T$_{BT1}$, T$_{HG1}$, T$_{SW1}$, T$_{LG1}$, T$_{GND1}$, T$_{BT2}$, T$_{HG2}$, T$_{SW2}$, T$_{LG2}$, and T$_{GND2}$, respectively.

For the sake of convenience, the pads PAD$_{BT1}$, PAD$_{HG1}$, PAD$_{SW1}$, PAD$_{LG1}$, and PAD$_{GND1}$ are collectively referred to as a first pad group, and the pads PAD$_{BT2}$, PAD$_{HG2}$, PAD$_{SW2}$, PAD$_{LG2}$, and PAD$_{GND2}$ collectively referred to as a second pad group. In FIG. 53, regions 5631 and 5651 are regions located between the first pad group and the middle axis AX, and regions 5632 and 5652 are regions located between the second pad group and the middle axis AX. The region 5651 is located between the first pad group and the region 5631, and the region 5652 is located between the second pad group and the region 5632. A conductor 5653 connects between the regions 5651 and 5652.

When the power supply circuit 5100 in FIG. 25 is implemented with the power IC 5610, the drivers 5112H and 5112L, the level shifter 5114, and the control circuit 5113 are formed between the first pad group and the middle axis AX, and the drivers 5122H and 5122L, the level shifter 5124, and the control circuit 5123 are formed between the second pad group and the middle axis AX. In this case, in the regions 5631 and 5632, the control circuits 5113 and 5123 are respectively formed, and in the regions 5651 and 5652, the switches Q1 and Q2 are respectively formed (more specifically, for example, in the regions 5651 and 5652, the transistors 5321 and 5322 in FIG. 43 are respectively formed), and the switches Q1 and Q2 are connected together by the conductor 5653.

In a case where the power supply circuit 5200 in FIG. 34 is implemented with the power IC 5610, the drivers 521211 and 5212L, the level shifter 5214, and the control circuit 5213 are formed between the first pad group and the middle axis AX, and the drivers 5222H and 5222L, the level shifter 5224, and the control circuit 5223 are formed between the second pad group and the middle axis AX. In this case, in the regions 5631 and 5632, the control circuits 5213 and 5223 are respectively formed, and in the regions 5651 and 5652, the switches Qa and Qb are respectively formed (more specifically, for example, in the regions 5651 and 5652, the transistors 5321 and 5322 in FIG. 43 are respectively formed), and the switches Qa and Qb are connected together by the conductor 5653.

Fourteenth Embodiment

A fourteenth embodiment of the present invention will be described. The fourteenth embodiment deals with some modifications and the like applicable to the eighth to thirteenth embodiments.

Any of the features described in connection with the first to seventh embodiments can be combined with any of the features described in connection with the eighth to fourteenth embodiments. For example, the configuration of the control circuits 5113 and 5123 in FIG. 25 can be any of the configurations described in connection with the first to seventh embodiments; likewise, the configuration of the control circuits 5213 and 5223 in FIG. 34 can be any of the configurations described in connection with the first to seventh embodiments.

The above description deals with examples where the power IC 5610 is used to build a power supply circuit. Instead, a plurality of discrete components can be used to build a circuit equivalent to the circuit within the power IC 5610. Some (e.g., the charging element) of the elements described above as being included in the power IC 5610 can be provided outside the power IC 5610 to be externally connected to the power IC 5610. Conversely, some (e.g., the high-side and low-side transistors) of the elements described above as being provided outside the power IC 5610) can be provided inside the power IC 5610.

With respect to any signal or voltage, the relationship of its high and low levels can be reversed within the spirit of what is disclosed herein.

Within the spirit of what is disclosed herein, any modification is possible where the types of some of the FETs are interchanged between the N-channel and P-type types.

Any of the transistors mentioned above can be of any type. For example, any transistor mentioned above as a MOSFET can be replaced with a junction FET, an IGBT (insulated-gate bipolar transistor), or a bipolar transistor. Any transistor has a first electrode, a second electrode, and a control electrode. In an FET, one of the first and second electrodes corresponds to the drain, the other of them corresponds to the source, and the control electrode corresponds to the gate. In an IGBT, one of the first and second electrodes corresponds to the collector, the other of them corresponds to the emitter, and the control electrode corresponds to the gate. In a bipolar transistor that does not belong to the IGBT, one of the first and second electrodes corresponds to the collector, the other of them corresponds to the emitter, and the control electrode corresponds to the base.

Overview of the Invention, Part 2

To follow is an overview of the present invention as Implemented in the different embodiments described above.

A power IC (see FIGS. 25 and 34) according to one aspect of the present invention is a power IC (5610) for forming a power supply circuit including: a first converter (5110, 5210) configured to perform direct-current to direct-current conversion by using a first high-side transistor 5111H, 5211H) and a first low-side transistor (5111L, 5211L) that are connected in series with each other; a second converter (5120, 5220) configured to perform direct-current to direct-current conversion using a second high-side transistor (5121H, 5221H) and a second low-side transistor (5121L, 5221L) that are connected in series with each other. The first converter includes, as its constituent elements: a first high-side driver (5112H, 5212H) configured to drive the gate of the first high-side transistor; a first low-side driver (5112L, 5212L) configured to drive the gate of the first low-side transistor; a first control circuit (5113, 5213) configured to turn on and off the first high-side and low-side transistors by using the first high-side and low-side drivers; and a first boot node (BT1, BTa) that is connected via a first capacitor to a first switching node, which is the connection node between the first high-side and low-side transistors, and to which a first boot voltage, which functions as a high potential-side supply voltage in the first high-side driver, is applied. The second converter includes, as its constituent elements: a second high-side driver (5122H, 5222H) configured to drive the gate of the second high-side transistor a second low-side driver (5122L, 5222L) configured to drive the gate of the second low-side transistor; a second control circuit (5123, 5223) configured to turn on and off the second high-side and low-side transistors by using the second high-side and low-side drivers; and a second boot node (BT2. BTb) that is connected via a second capacitor to a second switching node, which is the connection node between the second high-side and low-side transistors, and to which a second boot voltage, which functions as a high potential-side supply voltage in the second high-side driver, is applied. The power IC further includes a switch circuit (5130, 5230) configured to keep the first and second boot nodes conducting to each other during all or part of the both-on period in which the first and second high-side transistors are both on.

With this configuration, even when the potential at one of the first and second boot nodes drops, electric power is supplied via the switch circuit from the other node to the one node. It is thus possible to secure the gate driving voltage for the high-side transistor.

Specifically, for example (see FIG. 25), in the power IC described above, the first converter can be a first step-down converter (5110) configured to produce a first output voltage (Vout1) from an input voltage (Vinx), and the second converter can be a second step-down converter (5120) configured to produce a second output voltage (Vout2) from the input voltage. The first switching node (SW1) can be connected via a first inductor (L1x) to a first output voltage application terminal (5153) to which the first output voltage is applied, and the second switching node (SW2) can be connected via a second inductor (L2x) to a second output voltage application terminal (5154) to which the second output voltage is applied. Thus, the series circuit composed of the first high-side transistor (5111H) and the first low-side transistor (5111L) and the series circuit composed of the second high-side transistor (5121H) and the second low-side transistor (5121L) can each be fed with the input voltage.

For another example (see FIG. 34), in the power IC described above, the first converter can be a step-up converter (5210) configured to produce a first output voltage (Vouta) from a first input voltage (Vina), and the second converter can be a step-down converter (5220) configured to produce a second output voltage (Voutb) by using the first output voltage as a second input voltage (Vinb). The first switching node (SWa) can be connected via a first inductor (Lax) to a first input voltage application terminal (5251) to which the first input voltage is applied, and the second switching node (SWb) can be connected via a second inductor (Lbx) to a second output voltage application terminal (5253) to which the second output voltage is applied. The first high-side transistor (5211H) can be provided between an output node (OUTa) at which the first output voltage appears and the first switching node (SWa), and the second high-side transistor (5221H) can be provided between the output node and the second switching node (SWb).

Supplementary Notes

Figure 54:
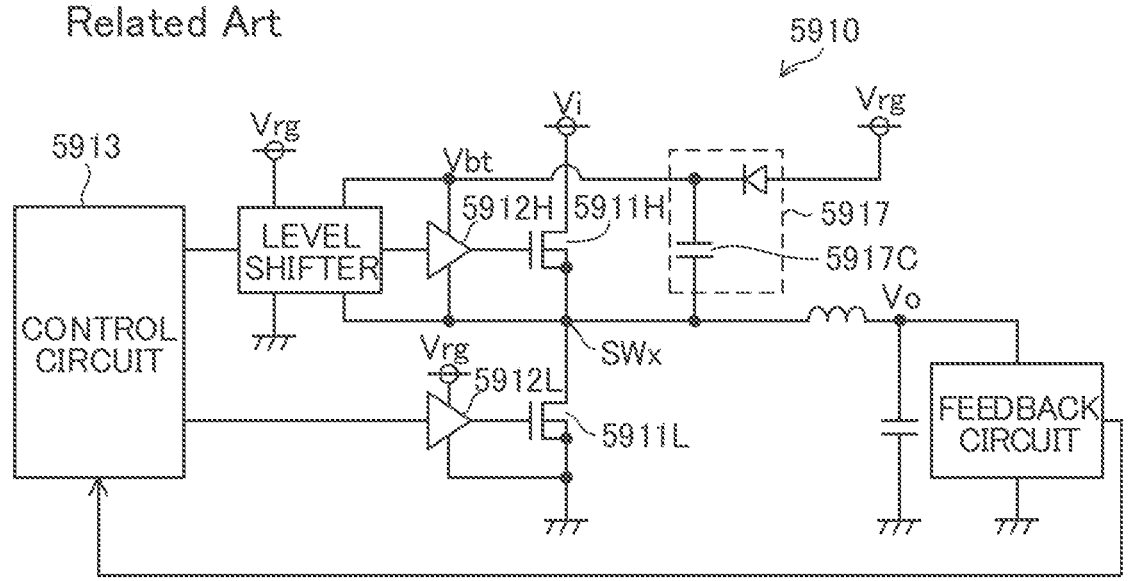
FIG. 54 is a configuration diagram of a step-down converter according to related art.

FIG. 54 shows the configuration of part of a step-down converter 5910 according to related art. The step-down converter 5910 is a DC-DC converter that produces from an input voltage Vi an output voltage Vo. The step-down converter 5910 includes a high-side transistor 5911H and a low-side transistor 5911L that are configured as N-channel MOSFETs and that are connected in series with each other, a high-side driver 5912H and a low-side driver 5912L that drive the gates of the transistors 5911H and 5911L, and a control circuit 5913 that controls the drivers 5912H and 5912L. The control circuit 5913 can, based on a feedback voltage commensurate with the output voltage Vo, make the output voltage Vo follow a predetermined target voltage (e.g., 5 V).

The transistor 5911H can be a P-channel type, but configuring it as an N-channel type helps reduce the size of the transistor, and is advantageous in terms of cost. In a case where the transistor 5911H is configured as an N-channel type, the potential at the connection node SWx between the transistors 5911H and 5911L rises up to the level of the input voltage Vi; thus, turning on the transistor 5911H requires a voltage higher than the input voltage Vi. To produce a voltage higher than the input voltage Vi, a bootstrap circuit 5917 is used. The bootstrap circuit 5917 includes a capacitor 5917C. The bootstrap circuit 5917 charges the capacitor 5917C by using the variation of the voltage at the connection node SWx that occurs as the transistors 5911H and 5911L are driven to switch, and thereby produces a high potential-side supply voltage (boot voltage Vbt) for the high-side driver 5912H.

Patent Document 2: Japanese Patent Application published as No. 2012-157142.

In the step-down converter 5910 in FIG. 54, so long as Vi>Vo holds all the time, no problem arises. Depending on how the step-down converter 5910 is used, however, the input voltage Vi may vary to drop below the above-mentioned target voltage for a while. In such a case, it is preferable that the transistor 5911H be kept on so that the output voltage Vo remains as close as possible to the target voltage. However, an attempt to keep the transistor 5911H on causes the charging current to the capacitor 5917C resulting from switching to cease to be supplied; thus, due to the circuit current in the driver 5912, the boot voltage Vbt falls gradually until eventually the transistor 5911H can no longer be kept on.

A similar situation occurs in a case where, in a step-up converter, the input voltage can be both higher than and lower than the target voltage set for the output voltage.

A second object of the present invention is to provided a power IC and a power supply circuit that contribute to stably securing a voltage for driving a high-side transistor.

Specific configurations corresponding to the second object are seen chiefly in the eighth to fourteenth embodiments.

A power IC according to one aspect of the present invention is a power IC for forming a power supply circuit including: a first converter configured to perform direct-current to direct-current conversion by using a first high-side transistor and a first low-side transistor that are connected in series with each other; a second converter configured to perform direct-current to direct-current conversion using a second high-side transistor and a second low-side transistor that are connected in series with each other, wherein the first converter includes, as its constituent elements:
a first high-side driver configured to drive the gate of the first high-side transistor;
a first low-side driver configured to drive the gate of the first low-side transistor;
a first control circuit configured to turn on and off the first high-side and low-side transistors by using the first high-side and low-side drivers; and a first boot node that is connected via a first capacitor to a first switching node, which is the connection node between the first high-side and low-side transistors, and to which a first boot voltage, which functions as a high potential-side supply voltage in the first high-side driver, is applied,
the second converter includes, as its constituent elements:
a second high-side driver configured to drive the gate of the second high-side transistor;
a second low-side driver configured to drive the gate of the second low-side transistor;
a second control circuit configured to turn on and off the second high-side and low-side transistors by using the second high-side and low-side drivers; and
a second boot node that is connected via a second capacitor to a second switching node, which is the connection node between the second high-side and low-side transistors, and to which a second boot voltage, which functions as a high potential-side supply voltage in the second high-side driver, is applied, and the power IC further includes a switch circuit configured to keep the first and second boot nodes conducting to each other during all or part of a both-on period in which the first and second high-side transistors are both on (a fifty-first configuration).

In power IC of the fifty-first configuration described above, the first control circuit is configured to be capable of performing first switching control in which it turns on and off the first high-side and low-side transistors alternately, and the second control circuit is configured to be capable of performing second switching control in which it turns on and off the second high-side and low-side transistors alternately, and in the power supply circuit, a first bootstrap circuit is formed that is configured to charge the first capacitor by keeping the first boot node on the high-potential side when the first low-side transistor is on in the first switching control, and a second bootstrap circuit is formed that is configured to charge the second capacitor by keeping the second boot node on the high-potential side when the second low-side transistor is on in the second switching control (a fifty-second configuration).

In power IC of the fifty-second configuration described above, the first boot node is connected to a terminal to which a predetermined voltage is applied via a first charging element and, when the first low-side transistor is on in the first switching control, the first boot node is kept on the high-potential side so that the first capacitor is charged by the predetermined voltage via the first charging element, and the second boot node is connected to the terminal to which the predetermined voltage is applied via a second charging element and, when the second low-side transistor is on in the second switching control, the second boot node is kept on the high-potential side so that the second capacitor is charged by the predetermined voltage via the second charging element, and the first and second charging elements are each configured as a bootstrap diode or a bootstrap switch (a fifty-third configuration).

In power IC of any of the fifty-first to fifty-third configurations described above, the first converter is a first step-down converter configured to produce a first output voltage from an input voltage, the second converter is a second step-down converter configured to produce a second output voltage from the input voltage, the first switching node is connected via a first inductor to a first output voltage application terminal to which the first output voltage is applied and the second switching node is connected via a second inductor to a second output voltage application terminal to which the second output voltage is applied, the input voltage is applied to each of the series circuit composed of the first high-side and low-side transistors and the series circuit composed of the second high-side and low-side transistors (a fifty-fourth configuration).

In power IC of the fifty-fourth configuration described above, the first control circuit is configured, when the input voltage is higher than a predetermined first target voltage set for the first output voltage, to perform first step-down switching control in which the first control circuit turns on and off the first high-side and low-side transistors alternately so as to decrease a difference between the first output voltage and the first target voltage and, when the input voltage is equal to or lower than the first target voltage, to keep the first high-side and low-side transistors on and off respectively, and the second control circuit is configured, when the input voltage is higher than a predetermined second target voltage set for the second output voltage, to perform second step-down switching control in which the second control circuit turns on and off the second high-side and low-side transistors alternately so as to decrease a difference between the second output voltage and the second target voltage (a fifth-fifth configuration).

In power IC of the fifty-fifth configuration described above, in a case where the input voltage can vary to rise above and fall below the first target voltage, execution of the second step-down switching control is secured either by the second target voltage being set lower than the lower limit of the range of variation of the input voltage or an upper limit less than 100% being set on the duty at which the second high-side transistor is on (a fifty-sixth configuration).

In power IC of any of the fifty-first to fifty-third configurations described above, the first converter is a step-up converter configured to produce a first output voltage from a first input voltage, the second converter is a step-down converter configured to produce a second output voltage by using the first output voltage as a second input voltage, the first switching node is connected via a first inductor to a first input voltage application terminal to which the first input voltage is applied and the second switching node is connected via a second inductor to a second output voltage application terminal to which the second output voltage is applied, and the first high-side transistor is provided between an output node, at which the first output voltage appears, and the first switching node and the second high-side transistor is provided between the output node and the second switching node (a fifty-seventh configuration).

In power IC of the fifty-seventh configuration described above, the first control circuit is configured, when the first input voltage is lower than a predetermined first target voltage set for the first output voltage, to perform step-up switching control in which the first control circuit turns on and off the first high-side and low-side transistors alternately so as to decrease a difference between the first output voltage and the first target voltage and, when the first input voltage is equal to or higher than the first target voltage, to keep the first high-side and low-side transistors on and off respectively, and the second control circuit is configured, when the second input voltage as the first output voltage is higher than a predetermined second target voltage set for the second output voltage, to perform step-down switching control in which the second control circuit turns on and off the second high-side and low-side transistors alternately so as to decrease a difference between the second output voltage and the second target voltage (a fifth-eighth configuration).

In power IC of the fifty-eighth configuration described above, in a case where the first input voltage can vary to rise above and fall below the first target voltage, execution of the step-down switching control is secured either by the second target voltage being set lower than the first target voltage or an upper limit less than 100% being set on the duty at which the second high-side transistor is on (a fifty-ninth configuration).

In power IC of any of the fifty-first to fifty-ninth configurations described above, the switch circuit includes:

a first switching element and a second switching element provided between the first and second boot nodes and connected in series with each other; and a switch controller configured to keep the first switching element on during all or part of the on period of the first high-side transistor and to keep the second switching element on during all or part of the on period of the second high-side transistor (a sixtieth configuration).

In power IC of any of the fifty-first to fifty-ninth configurations described above, the switch circuit includes:

a switching element provided between the first and second boot nodes; and a switch controller configured to keep the switching element on during all or part of the both-on period (a sixty-first configuration).

In power IC of any of the fifty-first to fifty-ninth configurations described above, the switch circuit includes:

a switching element and a diode provided between the first and second boot nodes and connected in series with each other; and a switch controller configured to keep the switching element on during all or part of the on period of the first high-side transistor, wherein, when the switching element is turned on, electric power is supplied from, of the first and second boot nodes, the one connected to the anode of the diode to the other (a sixty-second configuration).

A power supply circuit according to another aspect of the present invention is a power supply circuit that includes a power IC according to any of the fifty-first to sixty-second configurations described above, and the first and second converters are implemented with the power IC (a sixty-third configuration).

According to the present invention, it is possible to provide a power IC and a power supply circuit that contribute to stably securing a voltage fir driving a high-side transistor.

The embodiments of the present invention allow for many modifications made as necessary within the scope of the technical concept set forth in the appended claims. The embodiments described above are merely examples of how the present invention can be implemented, and the senses of the terms used to define the present invention and its features are not limited to those in which they are used in the description of the embodiments given above. All specific values mentioned in the above description are merely examples, and can naturally be altered to different values.

What is claimed is:

1. A semiconductor device, comprising:

an amplifier having an output terminal and configured to output from the output terminal a signal commensurate with an input signal fed to the amplifier;

a signal line connected to the output terminal and configured to transmit a target voltage signal based on an output signal of the amplifier;

a shield line laid beside the signal line; and a shield drive circuit configured to control a voltage on the shield line based on the target voltage signal, wherein the shield drive circuit is configured to raise and drop the voltage on the shield line in response to a rise and a drop, respectively, in a voltage of the target voltage signal, and wherein the shield drive circuit includes:

a transistor having a gate that receives the target voltage signal; and a constant-current circuit connected in series with the transistor, and the shield drive circuit is configured to control the voltage on the shield line by transferring, between a connection node at which the transistor and the constant-current circuit are connected together and the shield line, electric charge commensurate with the target voltage signal.

2. The semiconductor device according to claim 1, further comprising:

a subsequent-stage circuit configured to operate according to the target voltage signal, wherein the subsequent-stage circuit is fed with, as a signal commensurate with the target voltage signal, a signal at the connection node at which the transistor and the constant-current circuit are connected together.

3. The semiconductor device according to claim 1, further comprising:

a subsequent-stage circuit configured to operate according to the target voltage signal, wherein one end of the signal line leading from the output terminal is connected to the subsequent-stage circuit.

4. The semiconductor device according to claim 1, wherein the target voltage signal is produced as a signal having a voltage relative to a predetermined reference potential, and the shield line is arranged between a reference potential part having the reference potential and the signal line.

5. The semiconductor device according to claim 1, wherein the amplifier is a transconductance amplifier configured to convert a voltage signal as the input signal into a current signal, and the target voltage signal is produced on the signal line as a result of a current attributable to the current signal either being supplied from the amplifier to the signal line via the output terminal or being retrieved from the signal line to the amplifier via the output terminal.

6. A semiconductor device, comprising:

an amplifier having an output terminal and configured to output from the output terminal a signal commensurate with an input signal fed to the amplifier;

a signal line connected to the output terminal and configured to transmit a target voltage signal based on an output signal of the amplifier;

a shield line laid beside the signal line; and a shield drive circuit configured to control a voltage on the shield line based on the target voltage signal wherein the target voltage signal is produced as a signal having a voltage relative to a predetermined reference potential, and the shield line is arranged between a reference potential part having the reference potential and the signal line, the semiconductor device further comprising:
a passive element connected to the signal line and configured to receive the target voltage signal, wherein
a shield region is formed between the reference potential part and the passive element, and
the shield region is fed with a same voltage as the voltage on the shield line.

7. A semiconductor device, comprising:
an amplifier having an output terminal and configured to output from the output terminal a signal commensurate with an input signal fed to the amplifier;
a signal line connected to the output terminal and configured to transmit a target voltage signal based on an output signal of the amplifier;
a passive element connected to the signal line and configured to receive the target voltage signal, and
a shield drive circuit,
wherein
the target voltage signal is produced as a signal having a voltage relative to a predetermined reference potential,
a shield region is formed between a reference potential part having the reference potential and the passive element, and
the shield drive circuit is configured to control a voltage on the shield region based on the target voltage signal.

8. The semiconductor device according to claim 7, wherein
the shield drive circuit is configured to raise and drop the voltage on the shield region in response to a rise and a drop, respectively, in the voltage of the target voltage signal.

9. The semiconductor device according to claim 8, wherein
the shield drive circuit includes:
a transistor having a gate that receives the target voltage signal; and
a constant-current circuit connected in series with the transistor, and
the shield drive circuit is configured to control the voltage on the shield region by transferring, between a connection node at which the transistor and the constant-current circuit are connected together and the shield region, electric charge commensurate with the target voltage signal.

10. The semiconductor device according to claim 9, further comprising:
a subsequent-stage circuit configured to operate according to the target voltage signal,
wherein
the subsequent-stage circuit is fed with, as a signal commensurate with the target voltage signal, a signal at the connection node at which the transistor and the constant-current circuit are connected together.

11. The semiconductor device according to claim 7, further comprising:
a subsequent-stage circuit configured to operate according to the target voltage signal,
wherein
one end of the signal line leading from the output terminal is connected to the subsequent-stage circuit.

12. The semiconductor device according to claim 7, wherein
the semiconductor device includes a semiconductor integrated circuit using a semiconductor substrate,
the reference potential part includes the semiconductor substrate, with the shield region and the passive element formed on the semiconductor substrate, and
the shield region is provided between the semiconductor substrate and the passive element.

13. The semiconductor device according to claim 7, wherein
the amplifier is a transconductance amplifier configured to convert a voltage signal as the input signal into a current signal, and
the target voltage signal is produced on the signal line as a result of a current attributable to the current signal either
being supplied from the amplifier to the signal line via the output terminal or
being retrieved from the signal line to the amplifier via the output terminal.

14. The semiconductor device according to claim 7, wherein
the semiconductor device includes:
an output-stage circuit configured to perform switching on an input voltage; and
a control circuit configured to control the output-stage circuit based on a feedback voltage commensurate with an output voltage produced by the switching,
the semiconductor device forming a semiconductor integrated circuit for a switching power supply,
the amplifier is included in the control circuit and is a transconductance amplifier configured to receive the feedback voltage as the input signal to convert a voltage signal indicating the feedback voltage into a current signal, and
the target voltage signal is produced on the signal line as a result of a current attributable to the current signal either
being supplied from the amplifier to the signal line via the output terminal or
being retrieved from the signal line to the amplifier via the output terminal.

15. A semiconductor device, comprising:
an amplifier having an output terminal and configured to output from the output terminal a signal commensurate with an input signal fed to the amplifier;
a signal line connected to the output terminal and configured to transmit a target voltage signal based on an output signal of the amplifier;
a shield line laid beside the signal line;
a shield drive circuit configured to control a voltage on the shield line based on the target voltage signal;
an output-stage circuit configured to perform switching on an input voltage; and
a control circuit configured to control the output-stage circuit based on a feedback voltage commensurate with an output voltage produced by the switching,
the semiconductor device forming a semiconductor integrated circuit for a switching power supply,
the amplifier is included in the control circuit and is a transconductance amplifier configured to receive the feedback voltage as the input signal to convert a voltage signal indicating the feedback voltage into a current signal, and
the target voltage signal is produced on the signal line as a result of a current attributable to the current signal either
being supplied from the amplifier to the signal line via the output terminal or being retrieved from the signal line to the amplifier via the output terminal.

* * * * *